(12) United States Patent
Park et al.

(10) Patent No.: US 11,825,684 B2
(45) Date of Patent: Nov. 21, 2023

(54) DISPLAY PANEL AND DISPLAY APPARATUS

(71) Applicant: SAMSUNG DISPLAY CO., LTD., Yongin-si (KR)

(72) Inventors: Junhyeong Park, Yongin-si (KR); Byeonghee Won, Yongin-si (KR); Jaemin Shin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 185 days.

(21) Appl. No.: 17/147,786

(22) Filed: Jan. 13, 2021

(65) Prior Publication Data

US 2021/0384465 A1 Dec. 9, 2021

(30) Foreign Application Priority Data

Jun. 4, 2020 (KR) .................. 10-2020-0067863
Aug. 28, 2020 (KR) .................. 10-2020-0109469

(51) Int. Cl.
*H10K 50/844* (2023.01)
*H10K 59/121* (2023.01)
*H10K 59/131* (2023.01)

(52) U.S. Cl.
CPC ......... *H10K 50/844* (2023.02); *H10K 59/121* (2023.02); *H10K 59/131* (2023.02)

(58) Field of Classification Search
CPC .............. H01L 27/326; H01L 27/3276; H01L 27/3246; H01L 27/3258; H01L 51/5253; H10K 50/844; H10K 59/121; H10K 59/131; H10K 59/122; H10K 59/124
See application file for complete search history.

(56) References Cited

U.S. PATENT DOCUMENTS

| 7,501,759 B2 | 3/2009 | Han et al. |
| 8,441,178 B2 | 5/2013 | Choi |
| 10,209,413 B2 | 2/2019 | Wang et al. |
| 10,431,768 B2 | 10/2019 | Lee et al. |
| 10,535,118 B2 | 1/2020 | Park et al. |

(Continued)

FOREIGN PATENT DOCUMENTS

| CN | 110364548 A | 10/2019 |
| KR | 100667933 B1 | 1/2007 |

(Continued)

*Primary Examiner* — Vongsavanh Sengdara
(74) *Attorney, Agent, or Firm* — CANTOR COLBURN LLP

(57) ABSTRACT

A display panel includes: a substrate including a front display area, where a first display element is in the front display area, a first side display area connected in a first direction to the front display area, a second side display area connected in a second direction to the front display area, a corner display area between the first side display area and the second side display area, where a second display element is in the corner display area, an intermediate display area located between the front display area and the corner display area, where a third display element is in the intermediate display area, and a groove is defined on the substrate; and an inorganic pattern layer on opposing sides of the groove and including a pair of protruding tips protruding toward a center of the groove, where the groove is between the second and third display elements.

30 Claims, 39 Drawing Sheets

(56) References Cited

U.S. PATENT DOCUMENTS

| | | | |
|---|---|---|---|
| 10,541,380 B1* | 1/2020 | Sung | H10K 59/124 |
| 10,638,619 B2 | 4/2020 | Seo et al. | |
| 2018/0351126 A1 | 12/2018 | Choi | |
| 2018/0357979 A1* | 12/2018 | Nakamura | G09G 3/2003 |
| 2018/0368270 A1* | 12/2018 | Seo | H05K 5/03 |
| 2019/0081273 A1 | 3/2019 | Sung et al. | |
| 2020/0127233 A1 | 4/2020 | Sung et al. | |
| 2020/0170126 A1* | 5/2020 | Ahn | H10K 59/353 |
| 2020/0176696 A1* | 6/2020 | Dai | H10K 59/131 |
| 2020/0185488 A1 | 6/2020 | Hong et al. | |
| 2020/0342816 A1 | 10/2020 | Bok | |

FOREIGN PATENT DOCUMENTS

| | | |
|---|---|---|
| KR | 1020080086201 A | 9/2008 |
| KR | 1020180003965 A | 1/2018 |
| KR | 1020180052837 A | 5/2018 |
| KR | 1020180133017 A | 12/2018 |
| KR | 1020180137644 A | 12/2018 |
| KR | 1020190112880 A | 10/2019 |
| KR | 102083315 B1 | 3/2020 |
| KR | 1020200126467 A | 11/2020 |
| WO | 2019223776 A1 | 11/2019 |

* cited by examiner

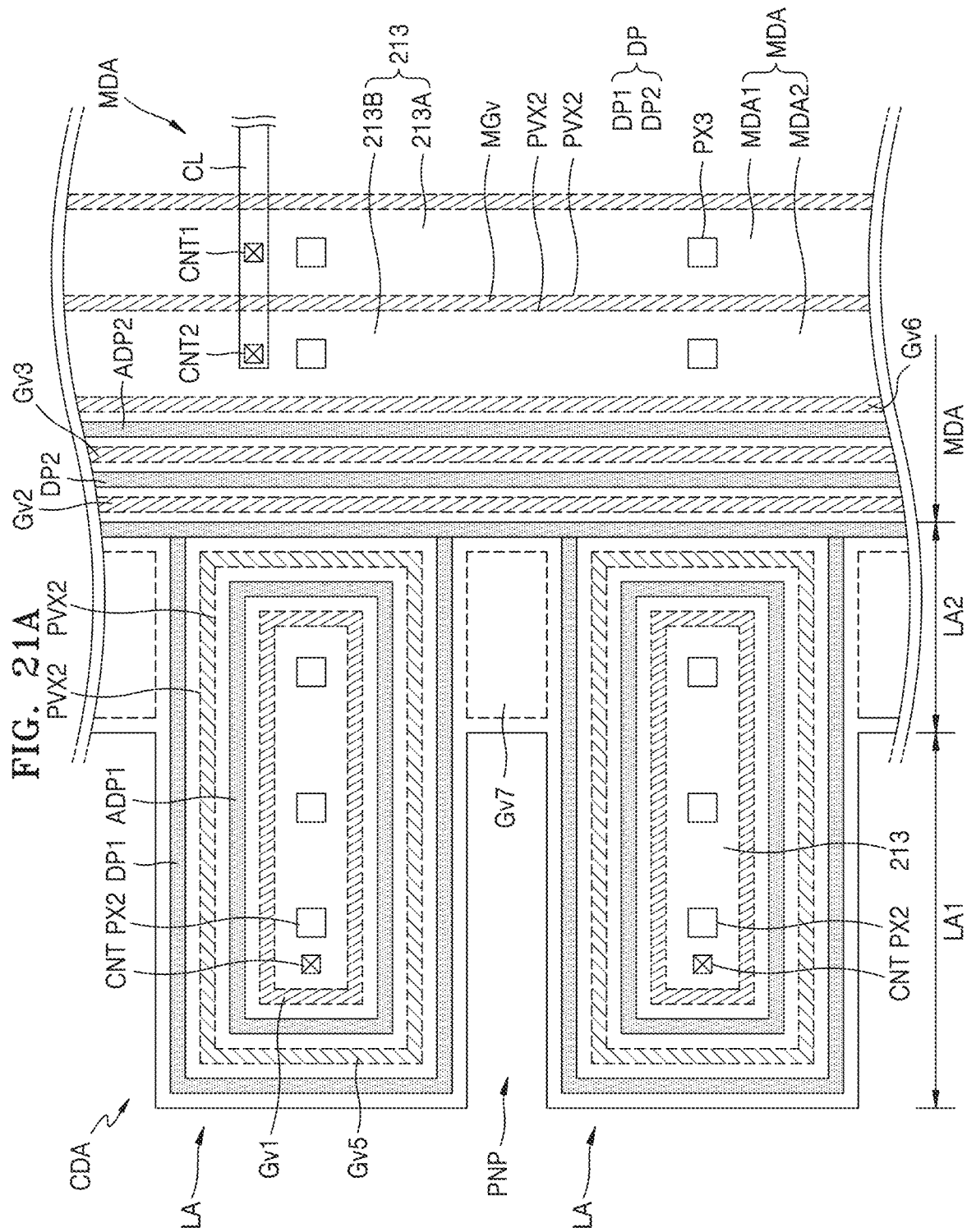

DISPLAY PANEL AND DISPLAY APPARATUS

This application claims priority to Korean Patent Application No. 10-2020-0067863, filed on Jun. 4, 2020, and Korean Patent Application No. 10-2020-0109469, filed on Aug. 28, 2020, and all the benefits accruing therefrom under 35 U.S.C. § 119, the contents of which in their entirety are herein incorporated by reference.

BACKGROUND

1. Field

One or more embodiments relate to a display panel and a display apparatus in which a display area for displaying an image is extended.

2. Description of Related Art

Mobility-based electronic devices are widely used. Recently, tablet personal computers ("PC"s), in addition to small electronic devices such as mobile phones, have been widely used as mobile (or portable) electronic devices.

A mobile electronic device typically includes a display apparatus to provide various functions, for example, visual information such as an image, to a user. As sizes of other components for driving a display apparatus have recently decreased, the proportion of the display apparatus in an electronic device has gradually increased, and a display apparatus having a shape including a bent or curved portion bent from a flat portion with a certain angle has been developed.

For example, a display panel for displaying an image of a display apparatus may have various curvatures and thus may include a front display area, a first side display area that is connected in a first direction from the front display area and is bent, and a second side display area that is connected in a second direction from the front display area and is bent.

SUMMARY

One or more embodiments provide a display panel and a display apparatus including a corner display area that is located to correspond to a corner of a front display area and is bendable.

According to an embodiment, a display panel includes: a substrate including a front display area, where a first display element is in the front display area, a first side display area connected in a first direction to the front display area, a second side display area connected in a second direction intersecting the first direction to the front display area, a corner display area located between the first side display area and the second side display area, where the corner display area at least partially surrounds the front display area, and a second display element is in the corner display area, and an intermediate display area located between the front display area and the corner display area, where a third display element is in the intermediate display area, where a groove is defined on the substrate and recessed in a thickness direction of the substrate; and an inorganic pattern layer on opposing sides of the groove on the substrate, where the inorganic pattern layer includes a pair of protruding tips protruding toward a center of the groove, and where the groove is between the second display element and the third display element.

In an embodiment, the corner display area may include a plurality of extension areas extending from the intermediate display area, a through-portion may be defined between adjacent extension areas, and the second display element may be in the plurality of extension areas.

In an embodiment, the groove may surround the second display element.

In an embodiment, the display panel may further include a dam portion over the inorganic pattern layer and protruding in the thickness direction of the substrate, where the dam portion may include a first dam portion and a second dam portion, where the first dam portion may surround the second display element, and the second dam portion may extend along the corner display area.

In an embodiment, each of the plurality of extension areas may include a first extension area and a second extension area located between the first extension area and the intermediate display area, where the second extension areas of the plurality of extension areas may be connected to one another as a single body, and the groove may be between the first dam portions of adjacent extension areas.

In an embodiment, the display panel may further include a first auxiliary dam portion over the inorganic pattern layer between the second display element and the first dam portion and protruding in the thickness direction of the substrate, where a thickness of the first dam portion may be greater than a thickness of the first auxiliary dam portion.

In an embodiment, the display panel may further include a planarization layer located on the substrate, where the planarization layer may be separated by the groove into a corner planarization layer and an intermediate planarization layer, where the second display element may be on the corner planarization layer, and the third display element may be on the intermediate planarization layer.

In an embodiment, the third display element may include an inner display element and an outer display element adjacent to the groove, where the outer display element may include a pixel electrode and a counter electrode, and where the pixel electrode may cover at least a part of the inorganic pattern layer.

In an embodiment, the display panel may further include a planarization layer between the substrate and the third display element, wherein the third display element includes an inner display element and an outer display element adjacent to the groove, where the planarization layer includes a recessed portion between the inner display element and the outer display element.

In an embodiment, the display panel may further include a connection wiring located on the substrate and extending from the intermediate display area to the plurality of extension areas, where the second display element may include a pixel electrode, an intermediate layer, and a counter electrode, and where the connection wiring and the counter electrode may be connected to each other at end portions of the plurality of extension areas.

In an embodiment, the display panel may further include a planarization layer located between the connection wiring and the second display element, where a contact hole may be defined through the planarization layer to expose the connection wiring, and where the connection wiring and the counter electrode may be connected to each other through a pixel electrode pattern located in the contact hole.

In an embodiment, the display panel may further include a connection wiring on the substrate and extending from the intermediate display area to the plurality of extension areas, where a plurality of second display elements may be in one of the plurality of extension areas, where the plurality of second display elements may respectively include counter electrodes which are spaced apart from one another, and where each of the counter electrodes may be connected to the connection wiring.

In an embodiment, the third display element may include a pixel electrode and a counter electrode, where the intermediate display area may include a first intermediate display area and a second intermediate display area located between the first intermediate display area and the corner display area, where the display panel may further include a connection wiring in the intermediate display area, and an intermediate groove defined between the first intermediate display area and the second intermediate display area, where each of the counter electrode of the third display element in the first intermediate display area and the counter electrode of the third display element in the second intermediate display area may be connected to the connection wiring through a contact hole.

In an embodiment, the third display element may include a pixel electrode and a counter electrode, and the third display element may be provided in plural in the intermediate display area, where the display panel may further include a connection wiring in the intermediate display area, and an intermediate groove defined in the intermediate display area to surround each of the plurality of third display elements, where counter electrodes of a plurality of third display elements in the intermediate display area may be spaced apart from one another by the intermediate groove and are each connected to the connection wiring.

In an embodiment, the corner display area may include pixel arrangement areas, in each of which the second display element is, and connection areas which connect the pixel arrangement areas to the intermediate display area, where adjacent pixel arrangement areas and adjacent connection areas may define a through-area, where the display panel may further include a connection wiring extending from the intermediate display area to the pixel arrangement area.

In an embodiment, the connection areas may extend in a serpentine shape from the intermediate display area, where adjacent connection areas may be symmetrically arranged in a direction in which the pixel arrangement areas are spaced apart from one another.

In an embodiment, the second display element may include a pixel electrode, an intermediate layer including an emission layer, and a counter electrode, where the intermediate layer may include a first functional layer between the pixel electrode and the emission layer and a second functional layer between the counter electrode and the emission layer, where the counter electrode and at least one selected from the first functional layer and the second functional layer are separated by the pair of protruding tips and the groove.

In an embodiment, the display panel may further include a dam portion over the inorganic pattern layer and protruding in the thickness direction of the substrate, and a thin-film encapsulation layer covering the second display element and the third display element, where the thin-film encapsulation layer may include an inorganic encapsulation layer and an organic encapsulation layer, where the thin-film encapsulation layer may extend from the second display element and the third display element to the dam portion, where the organic encapsulation layer may be separated by the dam portion.

In an embodiment, the display panel may further include an inorganic insulating layer on the substrate, a connection wiring on the inorganic insulating layer and extending from the intermediate display area to the corner display area, a lower inorganic pattern layer on the connection wiring, and a lower layer covering an edge of the lower inorganic pattern layer, where a hole may be defined through the lower layer to corresponding to the lower inorganic pattern layer, and where the groove may be defined by the hole and a central portion of the lower inorganic pattern layer.

In an embodiment, the display panel may further include an inorganic insulating layer on the substrate, a connection wiring on the inorganic insulating layer and extending from the intermediate display area to the corner display area, a lower inorganic layer on the connection wiring, and a lower layer including a first planarization layer, and a second planarization layer, where a hole may be defined through the lower layer to expose a part of the lower inorganic layer is exposed, where the groove may be defined by the lower inorganic layer and the hole.

In an embodiment, the display panel may further include an inorganic insulating layer on the substrate, a connection wiring on the inorganic insulating layer and extending from the intermediate display area to the corner display area, a metal pattern layer on the connection wiring, and a lower layer including covering an edge of the metal pattern layer, where a hole may be defined through the lower layer to correspond to the metal pattern layer, where the groove may be defined by the hole and a central portion of the metal pattern layer.

According to an embodiment, a display apparatus includes a display panel including a front display area, a corner display area located at a corner of the front display area to be bent, and an intermediate display area located between the front display area and the corner display area, where a first display element is in the front display area, a second display element is in the corner display area, and a third display element is in the intermediate display area, and a cover window covering the display panel, where the corner display area includes a plurality of extension areas extending from the intermediate display area, and where the second display element is in the plurality of extension areas.

In an embodiment, the display panel may include a substrate, where a groove recessed in a thickness direction of the substrate may be defined on the substrate, and an inorganic pattern layer located on opposing sides of the groove and including a pair of protruding tips protruding toward a center of the groove, where the groove may be between the second display element and the third display element.

In an embodiment, the second display element may include a pixel electrode, an intermediate layer including an emission layer, and a counter electrode, where the intermediate layer may include a first functional layer between the pixel electrode and the emission layer and a second functional layer between the counter electrode and the emission layer, where the counter electrode and at least one selected from the first functional layer and the second functional layer may be separated by the pair of protruding tips and the groove.

In an embodiment, the groove may surround the second display element.

In an embodiment, the display panel may further include a dam portion over the inorganic pattern layer and protruding in the thickness direction of the substrate, where the dam portion may include a first dam portion and a second dam portion, where the first dam portion may surrounds the second display element, and the second dam portion may extends along the corner display area.

In an embodiment, the display panel may further include a first auxiliary dam portion over the inorganic pattern layer between the second display element and the first dam portion and protruding in the thickness direction of the substrate, where a thickness of the first dam portion may be greater than a thickness of the first auxiliary dam portion.

In an embodiment, the display panel may further include a dam portion over the inorganic pattern layer and protruding in the thickness direction of the substrate, and a thin-film encapsulation layer covering the second display element and the third display element, where the thin-film encapsulation layer may include an inorganic encapsulation layer and an organic encapsulation layer, where the thin-film encapsulation layer may extend from the second display element and the third display element to the dam portion, where the organic encapsulation layer may be separated by the dam portion.

In an embodiment, the display panel may further include a connection wiring on the substrate and extending from the intermediate display area to the plurality of extension areas, where the second display element may include a pixel electrode, an intermediate layer, and a counter electrode, where the connection wiring and the counter electrode may be connected to each other at end portions of the plurality of extension areas.

In an embodiment, the display panel may further include a connection wiring on the substrate and extending from the intermediate display area to the plurality of extension areas, where a plurality of second display elements may be in one of the plurality of extension areas, where the plurality of second display elements may respectively include counter electrodes which are spaced apart from one another, where each of the counter electrodes may be connected to the connection wiring.

In an embodiment, the display panel may include a first side display area connected in a first direction to the front display area and bent with a first radius of curvature, and a second side display area connected in a second direction intersecting the first direction to the front display area and bent with a second radius of curvature different from the first radius of curvature, where the corner display area may be between the first side display area and the second side display area.

According to an embodiment, a display apparatus includes a display panel including a front display area, a corner display area at a corner of the front display area to be bent, and an intermediate display area between the front display area and the corner display area, where a first display element is in the front display area, a second display element is in the corner display area, and the third display element is in the intermediate display area, and a cover window covering the display panel, where the corner display area may include pixel arrangement areas in each of which the second display element is, and connection areas which connect the pixel arrangement areas to the intermediate display area, where adjacent pixel arrangement areas and adjacent connection areas may define a through-area, where a connection wiring extending from the intermediate display area to the pixel arrangement areas may be in the connection areas.

In an embodiment, the connection areas may extend in a serpentine shape from the intermediate display area, and adjacent connection areas may be symmetrically arranged in a direction in which the pixel arrangement areas are spaced apart from one another.

In an embodiment, the display panel may include a substrate, where a groove recessed in a thickness direction of the substrate may be defined on the substrate, and an inorganic pattern layer on opposing sides of the groove, where the inorganic pattern layer may include a pair of protruding tips protruding toward a center of the groove, where the groove may be between the second display element and the through-area.

In an embodiment, the second display element may include a pixel electrode, an intermediate layer including an emission layer, and a counter electrode, where the intermediate layer may include a first functional layer between the pixel electrode and the emission layer and a second functional layer between the counter electrode and the emission layer, where the counter electrode and at least one selected from the first functional layer and the second functional layer may be separated by the pair of protruding tips and the groove.

In an embodiment, the display panel may include a first side display area connected in a first direction to the front display area and bent with a first radius of curvature, and a second side display area connected in a second direction intersecting the first direction to the front display area and bent with a second radius of curvature different from the first radius of curvature, where the corner display area may be between the first side display area and the second side display area.

BRIEF DESCRIPTION OF THE DRAWINGS

The above and other features of embodiments of the disclosure will be more apparent from the following description taken in conjunction with the accompanying drawings, in which:

FIGS. 21A and 21B are plan views illustrating a corner display area and an intermediate display area according to an alternative embodiment;

DETAILED DESCRIPTION

Figure 1:
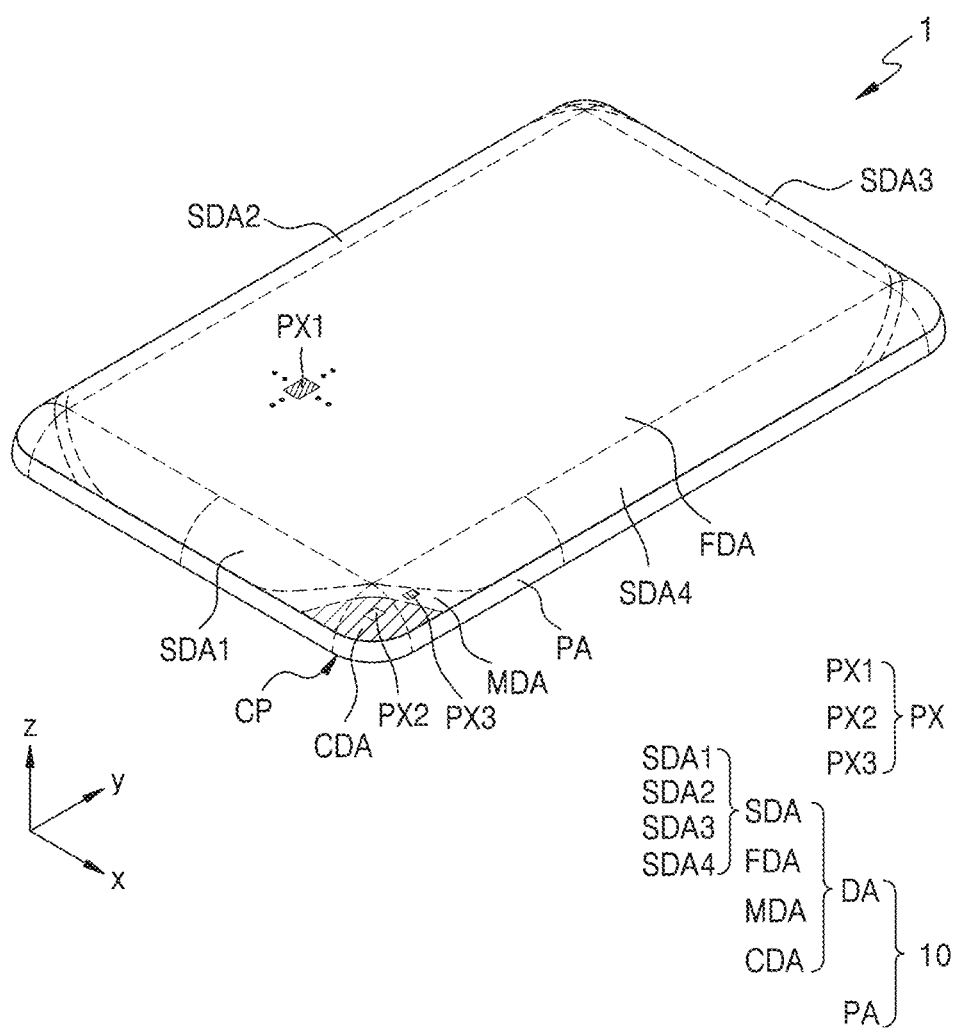
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments described herein may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. Throughout the disclosure, the expression "at least one selected from a, b and c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the disclosure may have different forms and should not be construed as being limited to the embodiments set forth herein.

Reference will now be made in detail to embodiments, examples of which are illustrated in the accompanying drawings, and in the drawings, the same elements are denoted by the same reference numerals, and thus any repetitive detailed description thereof will be omitted.

Although the terms "first," "second," etc. may be used to describe various elements, these elements should not be limited by these terms. These terms are only used to distinguish one element from another.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of elements in the drawings may be exaggerated or contracted for convenience of explanation. For example, because sizes and thicknesses of elements in the drawings are arbitrarily illustrated for convenience of explanation, the disclosure is not limited thereto.

When a certain embodiment may be implemented differently, a specific process order may be different from the described order. For example, two consecutively described processes may be performed substantially at the same time or performed in an order opposite to the described order.

It will be understood that when a layer, region, or element is referred to as being "connected," the layer, the region, or the element may be directly connected or may be indirectly connected with intervening layers, regions, or elements therebetween. For example, when layers, areas, or elements are referred to as being "electrically connected," they may be directly electrically connected, or may be indirectly electrically connected with intervening layers, areas, or elements therebetween.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2A:
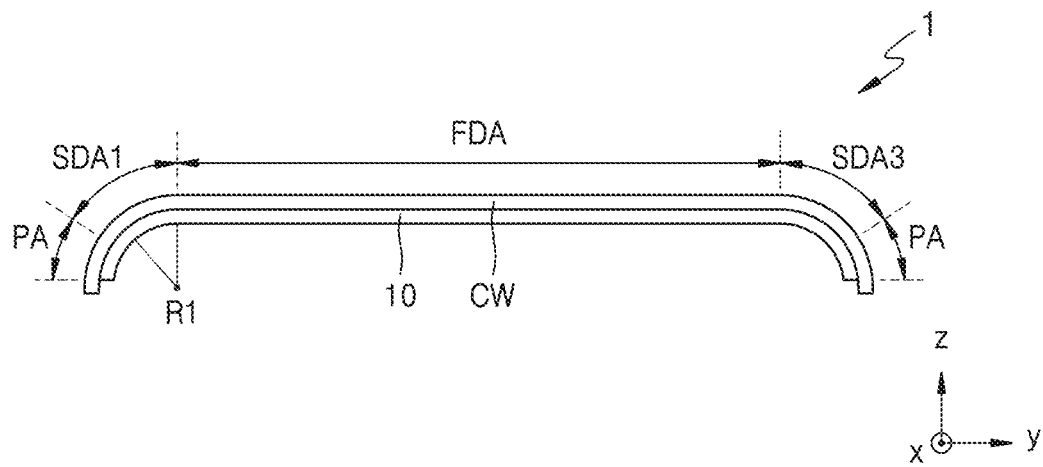
FIGS. 2A, 2B, and 2C are schematic cross-sectional views of the display apparatus according to an embodiment.
Figure 2B:
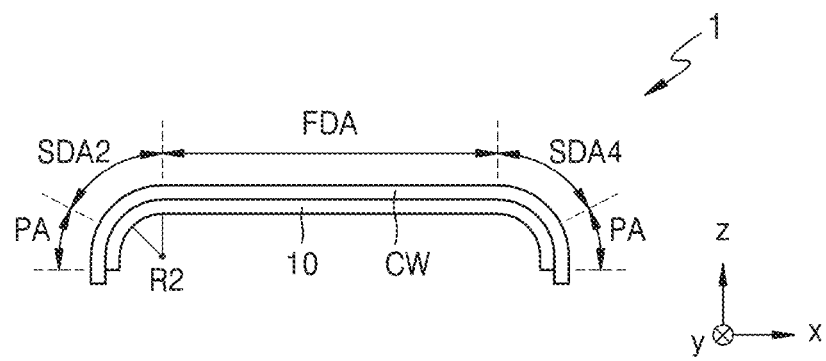
Figure 2C:
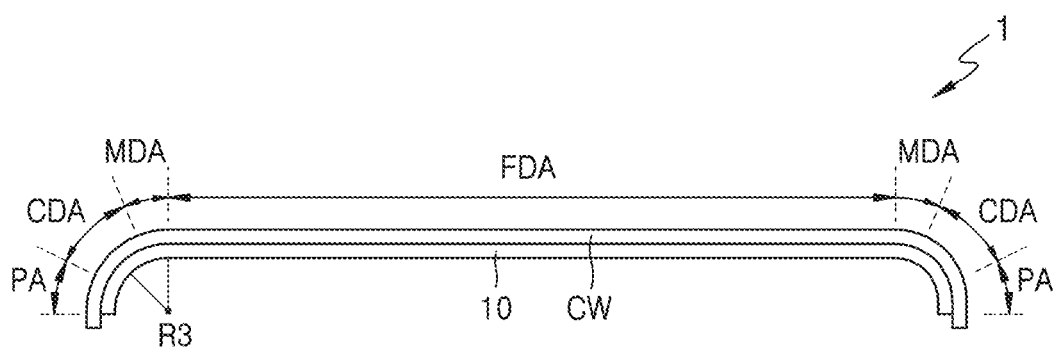

FIG. 1 is a perspective view of a display apparatus 1 according to an embodiment. FIGS. 2A, 2B, and 2C are cross-sectional views of the display apparatus 1 according to an embodiment. FIG. 2A is a cross-sectional view of the display apparatus 1 in a y direction of FIG. 1. FIG. 2B is a cross-sectional view of the display apparatus 1 in an x direction of FIG. 1. FIG. 2C is a cross-sectional view illustrating corner display areas CDA on opposing sides of a front display area FDA in the display apparatus 1.

Referring to FIG. 1 and FIGS. 2A through 2C, an embodiment of the display apparatus 1 for displaying a moving image or a still image may be used as a display screen of not only a portable electronic device such as a mobile phone, a smartphone, a tablet personal ("PC") computer, a mobile communication terminal, an electronic organizer, an electronic book, a portable multimedia player ("PMP"), a navigation device, or an ultra-mobile PC ("UMPC") but also any of various products such as a television, a laptop computer, a monitor, an advertisement board, or an Internet of things ("IoT") product. An embodiment of the display apparatus 1 may be used in a wearable device such as a smart watch, a watch phone, a glasses-type display, or a head-mounted display ("HMD"). An embodiment of the display apparatus 1 may be used as a center information display ("CID") located on an instrument panel, a center fascia, or a dashboard of a vehicle, a room mirror display replacing a side-view mirror of a vehicle, or a display located on the back of a front seat for entertainment for a back seat of a vehicle.

In an embodiment, the display apparatus 1 may have a long side of a first direction and a short side of a second direction. The first direction and the second direction may intersect each other. In one embodiment, for example, an acute angle may be formed between the first direction and the second direction. Alternatively, an obtuse angle or a right angle may be formed between the first direction and the second direction. Hereinafter, for convenience of description, embodiments where a right angle is formed between the first direction (e.g., the y direction or a −y direction) and the second direction (e.g., the x direction and a −x direction) will be described in detail.

In an embodiment, a length of a side of the display apparatus 1 in the first direction (e.g., the y direction or the −y direction) and a length of a side of the display apparatus 1 in the second direction (e.g., the x direction or the −x direction) may be the same as each other. In an alternative embodiment, the display apparatus 1 may have a short side in the first direction (e.g., the y direction or the −y direction) and a long side in the second direction (e.g., the −x direction or the −x direction).

In an embodiment, a corner where a long side in the first direction (e.g., the y direction or the −y direction) and a short side in the second direction (e.g., the x direction or the −x direction) meet each other may be rounded to have a certain curvature.

In an embodiment, the display apparatus 1 may include a display panel 10 and a cover window CW. In such an embodiment, the cover window CW may protect the display panel 10.

The cover window CW may be a flexible window. The cover window CW may protect the display panel 10 by being easily bent by an external force without generating cracks. The cover window CW may include glass, sapphire, or plastic. The cover window CW may include, for example, ultra-thin glass ("UTG") or colorless polyimide ("CPI"). In an embodiment, the cover window CW may have a structure in which a flexible polymer layer is located on a surface of a glass substrate, or may include only a polymer layer.

The display panel 10 may be located under the cover window CW. Although not shown in FIGS. 1 through 2C, the display panel 10 may be attached to the cover window CW by a transparent adhesive member such as an optically clear adhesive ("OCA").

In an embodiment, the display panel 10 may include a display area DA for displaying an image and a peripheral area PA surrounding the display area DA. The display area DA may include a plurality of pixels PX, and may display an image through the plurality of pixels PX. Each of the plurality of pixels PX may include sub-pixels. In one embodiment, for example, each of the plurality of pixels PX may include a red sub-pixel, a green sub-pixel, and a blue sub-pixel. Alternatively, each of the plurality of pixels PX may include a red sub-pixel, a green sub-pixel, a blue sub-pixel, and a white sub-pixel.

In an embodiment, as shown in FIG. 1, the display area DA may include a front display area FDA, a side display area SDA, a corner display area CDA, and an intermediate display area MDA. The plurality of pixels PX located in the display area DA may display images. In an embodiment, the pixels PX of the front display area FDA, the side display area SDA, the corner display area CDA, and the intermediate display area MDA may respectively provide independent images. In an alternative embodiment, the pixels PX of the front side display area FDA, the side display area SDA, the corner display area CDA, and the intermediate display area MDA may provide portions of one image.

The front display area FDA that is a flat display area may include a first pixel PX1 including a first display element. In an embodiment, the front display area FDA may provide main images.

The pixel PX including a display element may be located in the side display area SDA. Accordingly, the side display area SDA may display an image. In an embodiment, the side display area SDA may include a first side display area SDA1, a second side display area SDA2, a third side display area SDA3, and a fourth side display area SDA4. In an alternative embodiment, at least one selected from the first side display area SDA1, the second side display area SDA2, the third side display area SDA3, and the fourth side display area SDA4 may be omitted.

The first side display area SDA1 and the third side display area SDA3 may be connected in the first direction (e.g., the y direction or the −y direction) to the front display area FDA. In one embodiment, for example, the first side display area SDA1 may be connected in the −y direction from the front display area FDA, and the third side display area SDA3 may be connected in the y direction from the front display area FDA.

Each of the first side display area SDA1 and the third side display area SDA3 may be bent with a radius of curvature. In an embodiment, the radii of curvature of the first side display area SDA1 and the third side display area SDA3 may be different from each other. In an alternative embodiment, the radii of curvature of the first side display area SDA1 and the third side display area SDA3 may be the same as each other. For convenience of description, embodiments where the first side display area SDA1 and the third side display area SDA3 have the same radius of curvature that is a first radius of curvature R1 will be described in detail. Hereinafter, because the first side display area SDA1 and the third side display area SDA3 are the same or similar to each other, the first side display area SDA1 will be mainly described and any repetitive detailed description of the third side display area SDA3 may be omitted.

The second side display area SDA2 and the fourth side display area SDA4 may be connected in the second direction (e.g., the x direction or the −x direction) to the front display area FDA. In one embodiment, for example, the second side display area SDA2 may be connected in the −x direction from the front display area FDA, and the fourth side display area SDA4 may be connected in the x direction from the front display area FDA. Herein, the z direction perpendicular to the first and second direction (or x and y directions) may be a thickness direction of the display panel 10.

The second side display area SDA2 and the fourth side display area SDA4 may be bent with radii of curvature. In an embodiment, the radii of curvature of the second side display area SDA2 and the fourth side display area SDA4 may be different from each other. In an alternative embodiment, the radii of curvature of the second side display area SDA2 and the fourth side display area SDA4 may be the same as each other. For convenience of description, embodiments where the second side display area SDA2 and the fourth side display area SDA4 have the same radius of curvature that is a second radius of curvature R2 will be described in detail. Hereinafter, because the second side display area SDA2 and the fourth side display area SDA4 are the same or similar to each other, the second side display area SDA2 will be mainly described and any repetitive detailed description of the fourth side display area SDA4 may be omitted.

In an embodiment, the first radius of curvature R1 of the first side display area SDA1 may be different from the second radius of curvature R2 of the second side display area SDA2. In one embodiment, for example, the first radius of curvature R1 may be less than the second radius of curvature R2. Alternatively, the first radius of curvature R1 may be greater than the second radius of curvature R2. In an alternative embodiment, the first radius of curvature R1 of the first side display area SDA1 may be the same as the second radius of curvature R2 of the second side display area SDA2. For convenience of description, embodiments where the first radius of curvature R1 is greater than the second radius of curvature R2 will be described in detail.

The corner display area CDA may be located at a corner of the front display area FDA and may be bent. In such an embodiment, the corner display area CDA may be located to correspond to a corner portion CP. The corner portion CP that is a corner of the display area DA may be a portion where a long side of the display area DA in the first direction (e.g., the y direction or the −y direction) and a short side of the display area DA in the second direction (e.g., the x direction or the −x direction) meet each other. In such an embodiment, the corner display area CDA may be located between adjacent side display areas SDA. In one embodiment, for example, the corner display area CDA may be located between the first side display area SDA1 and the second side display area SDA2. Alternatively, the corner display area CDA may be located between the second side display area SDA2 and the third side display area SDA3, between the third side display area SDA3 and the fourth side display area SDA4, or between the fourth side display area SDA4 and the first side display area SDA1. Accordingly, the side display area SDA and the corner display area CDA may surround the front display area FDA and may be bent.

A second pixel PX2 including a second display element may be located in the corner display area CDA. Accordingly, the corner display area CDA may display an image.

In an embodiment, where the first radius of curvature R1 of the first side display area SDA1 and the second radius of curvature R2 of the second side display area SDA2 are different from each other, a radius of curvature in the corner display area CDA may gradually change. In an embodiment, where the first radius of curvature R1 of the first side display area SDA1 is greater than the second radius of curvature R2 of the second side display area SDA2, a radius of curvature of the corner display area CDA may gradually decrease in a direction from the first side display area SDA1 to the second side display area SDA2. In one embodiment, for example, a third radius of curvature R3 of the corner display area CDA may be less than the first radius of curvature R1 and may be greater than the second radius of curvature R2.

In an embodiment, the display panel 10 may further include the intermediate display area MDA. The intermediate display area MDA may be located between the corner display area CDA and the front display area FDA. In an embodiment, the intermediate display area MDA may extend between the side display area SDA and the corner display area CDA. In one embodiment, for example, the intermediate display area MDA may extend between the first side display area SDA1 and the corner display area CDA. In such an embodiment, the intermediate display area MDA may extend between the second side display area SDA2 and the corner display area CDA.

The intermediate display area MDA may include a third pixel PX3. In an embodiment, a driving circuit for applying an electrical signal or a power wiring for supplying a voltage may be located in the intermediate display area MDA, and the third pixel PX3 may overlap the driving circuit or the power wiring. In such an embodiment, the third display element of the third pixel PX3 may be located over the driving circuit or the power wiring. In an embodiment, the driving circuit or the power wiring may be located in the peripheral area PA, and the third pixel PX3 may not overlap the driving circuit or the power wiring.

In an embodiment, as shown in FIGS. 1 to 2C, the display apparatus 1 may display images in the side display area SDA, the corner display area CDA, and the intermediate display area MDA as well as in the front display area FDA. Accordingly, the proportion of the display area DA occupied in the display apparatus 1 may increase. In such an embodiment, because the display apparatus 1 includes the corner display area CDA that is bent at a corner and displays an image, aesthetics may be enhanced.

Figure 3:
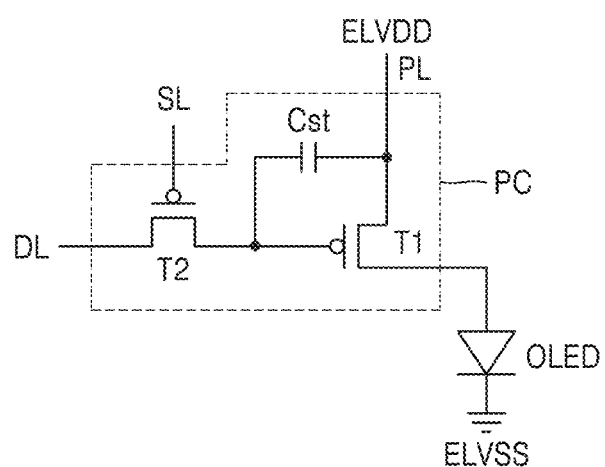
FIG. 3 is an equivalent circuit diagram illustrating a pixel circuit applicable to a display panel.
Figure 4A:
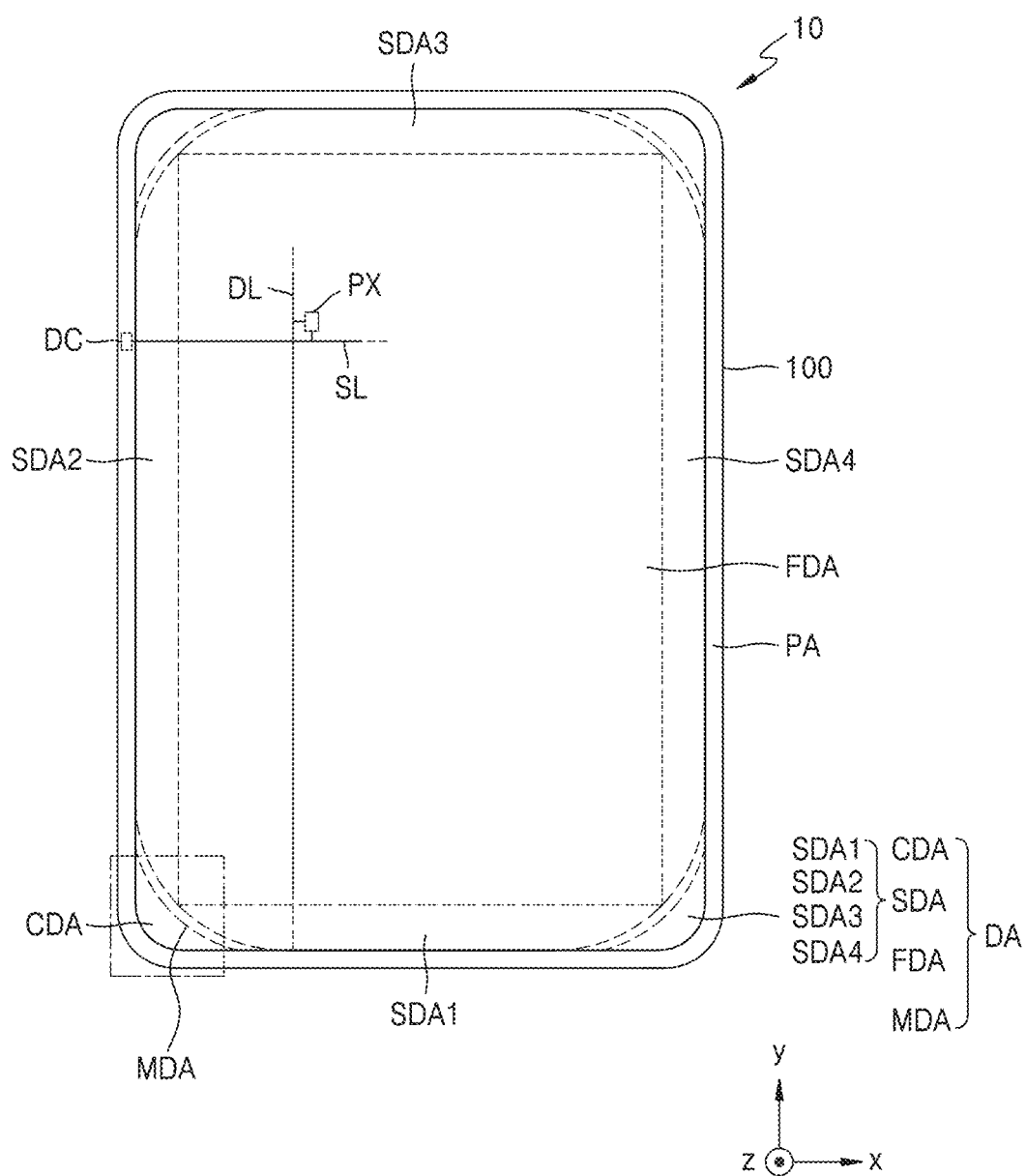
FIG. 4A is a schematic plan view of the display panel according to an embodiment.
Figure 4B:
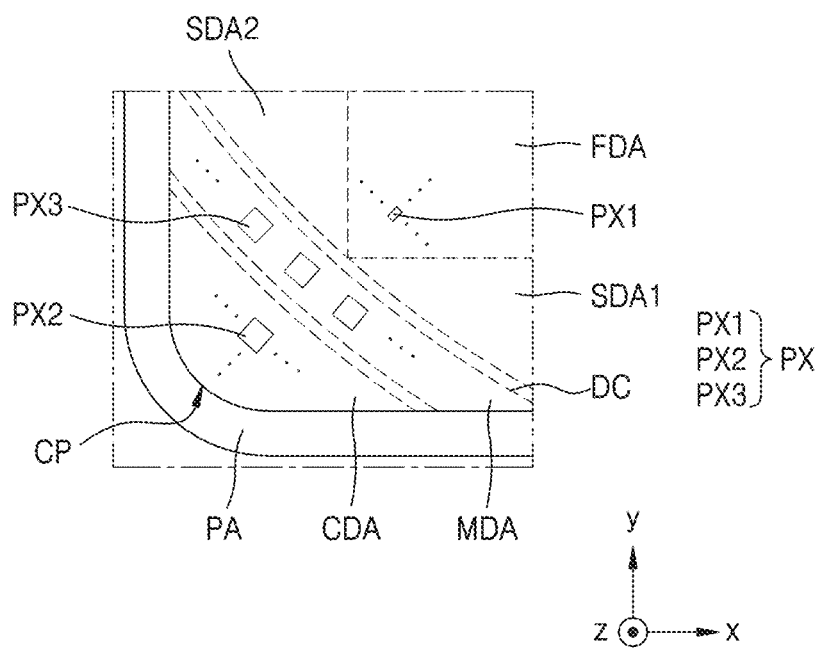
FIG. 4B is an enlarged view of the encircled portion of FIG. 4A.

FIG. 3 is an equivalent circuit diagram illustrating a pixel circuit PC applicable to a display panel. FIG. 4A is a schematic plan view of the display panel 10 according to an embodiment. FIG. 4B is an enlarged view of the encircled portion of FIG. 4A. FIG. 4A is a plan view illustrating a shape of the display panel 10 before the corner display area CDA is bent.

An embodiment of the display panel 10 may include a display element. In one embodiment, for example, the display panel 10 may be an organic light-emitting display panel using an organic light-emitting diode including an organic emission layer, a micro light-emitting diode display panel using a micro light-emitting diode ("LED"), a quantum dot light-emitting display panel using a quantum dot light-emitting diode including a quantum dot emission layer, or an inorganic light-emitting display panel using an inorganic light-emitting device including an inorganic semiconductor. Hereinafter, for convenience of description, embodiments where the display panel 10 is an organic light-emitting display panel using an organic light-emitting diode as a display element will be described in detail.

Referring to FIG. 3, in an embodiment, the pixel circuit PC may be connected to a display element, for example, an organic light-emitting diode OLED.

In an embodiment, the pixel circuit PC may include a driving thin-film transistor T1, a switching thin-film transistor T2, and a storage capacitor Cst. The organic light-emitting diode OLED may emit red, green, or blue light, or may red, green, blue, or white light.

The switching thin-film transistor T2 may be connected to a scan line SL and a data line DL, and may transmit a data signal or a data voltage input from the data line DL to the driving thin-film transistor T1 based on a scan signal or a switching voltage input from the scan line SL. The storage capacitor Cst may be connected to the switching thin-film transistor T2 and a driving voltage line PL, and may store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may control driving current flowing through the organic light-emitting diode OLED from the driving voltage line PL in response to a value of the voltage stored in the storage capacitor Cst. The organic light-emitting diode OLED may emit light having a certain luminance according to the driving current. A counter electrode (e.g., a cathode) of the organic light-emitting diode OLED may receive a second power supply voltage ELVSS.

FIG. 3 shows an embodiment where the pixel circuit PC includes two thin-film transistors and a single storage capacitor, but not being limited thereto. Alternatively, the number of thin-film transistors and the number of storage capacitors may be modified in various ways according to a design of the pixel circuit PC. In one embodiment, for example, the pixel circuit PC may include three, four, five, or more thin-film transistors.

Referring to FIGS. 4A and 4B, the display panel 10 may include the display area DA and the peripheral area PA. The display area DA may be an area where the plurality of pixels PX display an image, and the peripheral area PA may at least partially surround the display area DA. The display area DA may include the front display area FDA, the side display area SDA, the corner display area CDA, and the intermediate display area MDA.

Each of the pixels PX may include sub-pixels, and the sub-pixel may emit light of a certain color by using an organic light-emitting diode as a display element. Each organic light-emitting diode may emit, for example, red, green, or blue light. Each organic light-emitting diode may be connected to a pixel circuit including a thin-film transistor and a storage capacitor.

In an embodiment, the display panel 10 may include a substrate 100 and multiple layers located on the substrate 100. In such an embodiment, the display area DA and the peripheral area PA may be defined on the substrate 100 and/or the multiple layers. In such an embodiment, the substrate 100 and/or the multiple layers may include the front display area FDA, the side display area SDA, the corner display area CDA, the intermediate display area MDA, and the peripheral area PA.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. The substrate 100 including the polymer resin may be flexible, rollable, or bendable. The substrate 100 may have a multi-layer structure including a base layer including the polymer resin and a barrier layer (not shown).

The peripheral area PA may be a non-display area where an image is not provided. A driving circuit DC for applying an electrical signal or a power wiring for supplying power to the pixels PX may be located in the peripheral area PA. The driving circuit DC for applying an electrical signal through a signal line to each pixel PX may be located in the peripheral area PA. In one embodiment, for example, the driving circuit DC may be a scan driving circuit for applying a scan signal to each pixel PX through the scan line SL. Alternatively, the driving circuit DC may be a data driving circuit (not shown) for applying a data signal to each pixel PX through the data line DL. In an embodiment, the data driving circuit may be located adjacent to a side of the display panel 10. In one embodiment, for example, the data driving circuit in the peripheral area PA may be located to correspond to the first side display area SDA1.

The peripheral area PA may include a pad unit (not shown) to which an electronic device or a printed circuit board may be electrically connected. The pad unit may be exposed without being covered by an insulating layer, and may be electrically connected to a flexible printed circuit board ("FPCB"). The flexible printed circuit board may electrically connect a controller and the pad unit, and may apply a signal or power transmitted from the controller. In an embodiment, the data driving circuitry may be located on the flexible printed circuit board.

The first pixel PX1 including a first display element may be located in the front display area FDA. The front display area FDA may be a flat portion. In an embodiment, the front display area FDA may provide main images.

The pixel PX including a display element may be located in the side display area SDA, and the side display area SDA may be bent. In an embodiment, the side display area SDA may be a portion bent from the front display area FDA as described with reference to FIG. 1. In an embodiment, the side display area SDA may have a width that gradually decreases as being away from the front display area FDA. In an embodiment, the side display area SDA may include a first side display area SDA1, a second side display area SDA2, a third side display area SDA3, and a fourth side display area SDA4.

In an embodiment, the first side display area SDA1 and the third side display area SDA3 may be connected in the first direction (e.g., the y direction or the −y direction). In such an embodiment, the second side display area SDA2 and the fourth side display area SDA4 may be connected in the second direction (e.g., the x direction or the −x direction).

The corner display area CDA may be located between adjacent side display areas SDA. In one embodiment, for example, the corner display area CDA may be located between the first side display area SDA1 and the second side display area SDA2. Alternatively, the corner display area CDA may be located between the second side display area SDA2 and the third side display area SDA3, between the third display area SDA3 and the fourth side display area SDA4, or between the fourth side display area SDA4 and the first side display area SDA1. Hereinafter, the corner display area CDA located between the first side display area SDA1 and the second display area SDA2 will be described in detail.

The corner display area CDA may be located to correspond to the corner portion CP of the display area DA. The corner portion CP that is a corner of the display area DA may be a portion where a long side of the display area DA in the first direction (e.g., the y direction or the −y direction) and a short side of the display area DA in the second direction (e.g., the x direction or the −x direction) meet each other.

In such an embodiment, the corner display area CDA may surround at least a part of the front display area FDA. In one embodiment, for example, the corner display area CDA may be located between the first side display area SDA1 and the second side display area SDA2 and may at least partially surround the front display area FDA.

In an embodiment, the second pixel PX2 including a display element may be located in the corner display area CDA, and the corner display area CDA may be bent. In such an embodiment, the corner display area CDA may be located to correspond to the corner portion CP and may be bent from the front display area FDA as described with reference to FIG. 1.

The intermediate display area MDA may be located between the front display area FDA and the corner display area CDA. In an embodiment, the intermediate display area MDA may extend between the side display area SDA and the corner display area CDA. In one embodiment, for example, the intermediate display area MDA may extend between the first side display area SDA1 and the corner display area CDA and/or between the second side display area SDA2 and the corner display area CDA. In an embodiment, the intermediate display area MDA may be bent.

In an embodiment, the third pixel PX3 including a display element may be located in the intermediate display area MDA. In such an embodiment, the driving circuit DC for applying an electrical signal or a power wiring (not shown) for applying a voltage may also be located in the intermediate display area MDA. In an embodiment, the driving circuit DC may pass through the intermediate display area MDA and may be connected to the peripheral area PA. In such an embodiment, the third pixel PX3 located in the intermediate display area MDA may overlap the driving circuit DC or the power wiring. In an alternative embodiment, the third pixel PX3 may not overlap the driving circuit DC or the power wiring. In such an embodiment, the driving circuit DC may be located along the peripheral area PA.

In an embodiment, at least one of the side display area SDA, the corner display area CDA, and the intermediate display area MDA may be bent. In such an embodiment, the first side display area SDA1 of the side display area SDA may be bent with a first radius of curvature, and the second side display area SDA2 of the side display area SDA may be bent with a second radius of curvature. In such an embodiment, where the first radius of curvature is greater than the second radius of curvature, a radius of curvature of the corner display area CDA may gradually decrease in a direction from the first side display area SDA1 to the second side display area SDA2.

In an embodiment, where the corner display area CDA is bent, compressive strain may be greater than tensile strain in the corner display area CDA. In such an embodiment, a shrinkable substrate and a shrinkable multi-layer structure may need to be applied to the corner display area CDA. Accordingly, a stacked structure of multiple layers or a shape of the substrate 100 located in the corner display area CDA may be different from a stacked structure of multiple layers or a shape of the substrate 100 located in the front display area FDA.

In an embodiment, the corner display area CDA may include a plurality of extension areas extending from the intermediate display area MDA, and a through-portion may be provided between adjacent extension areas. In an alternative embodiment, the corner display area CDA may include pixel arrangement areas in which the second pixel PX2 is located and connection areas for connecting the pixel arrangement areas to the intermediate display area MDA, and adjacent pixel arrangement areas and adjacent connection areas may define a through-area. This will be described in detail with reference to the drawings.

Figure 5A:
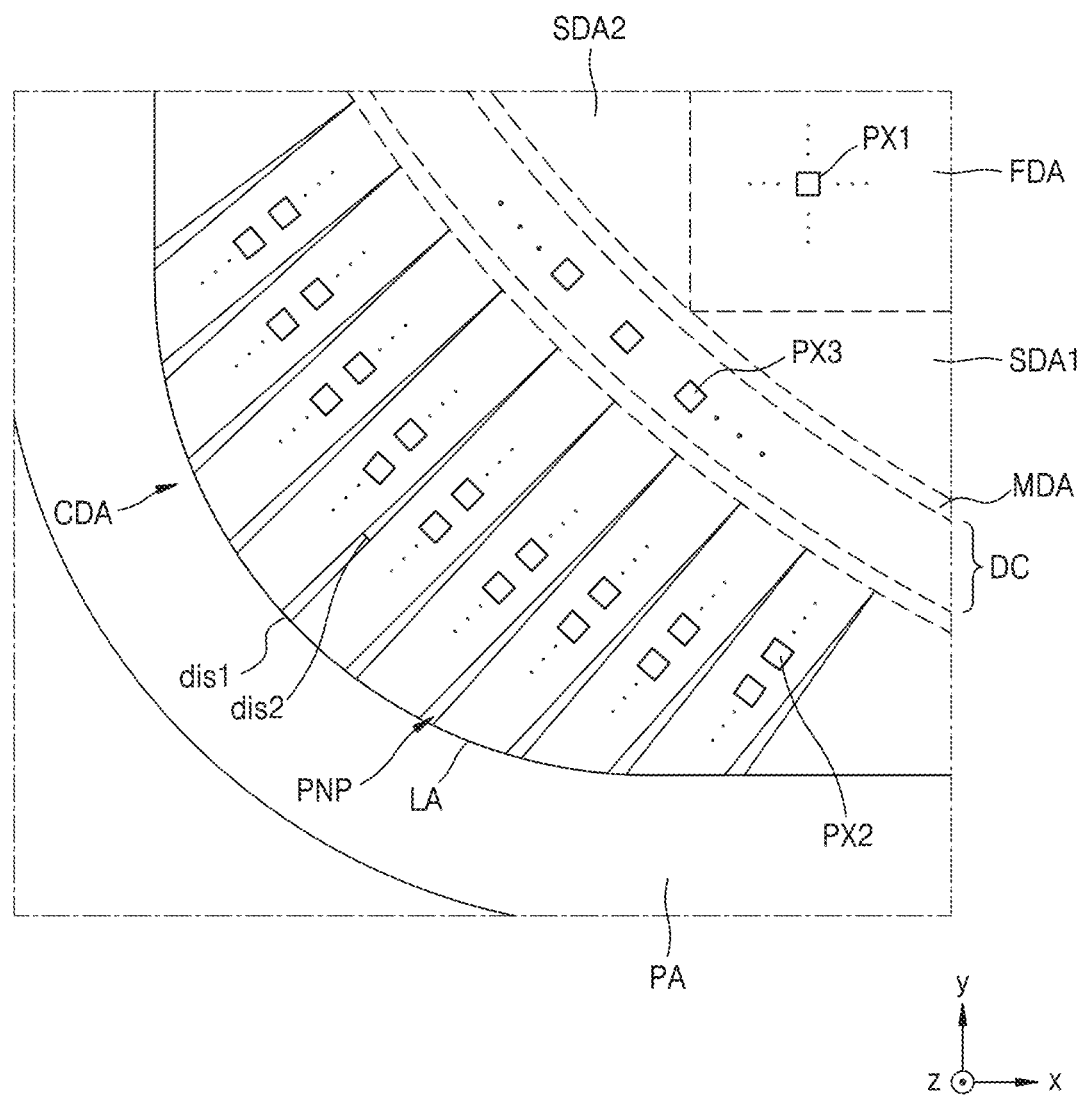
FIGS. 5A through 5C are enlarged views illustrating a part of a display panel according to an embodiment.
Figure 5B:
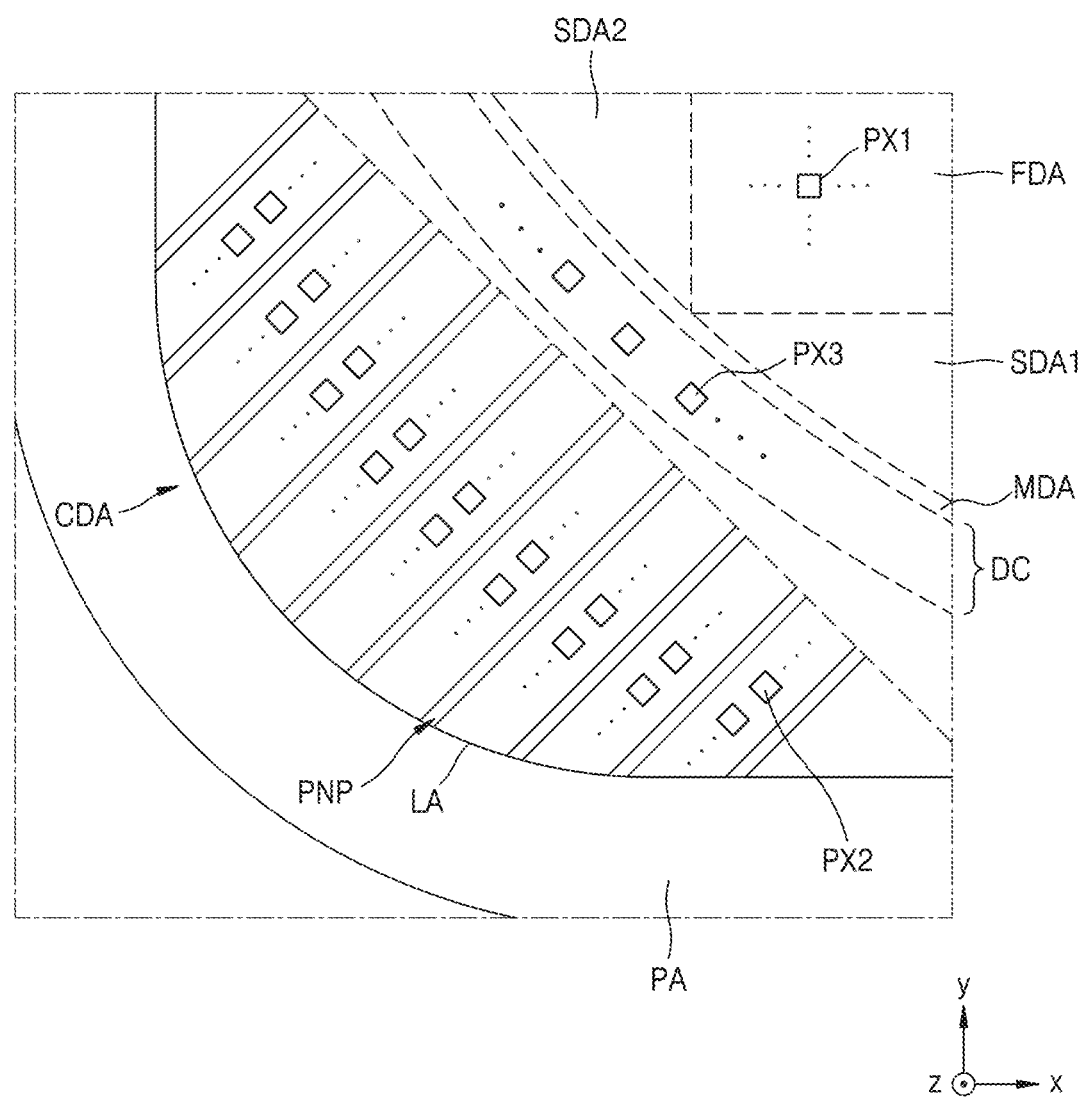
Figure 5C:
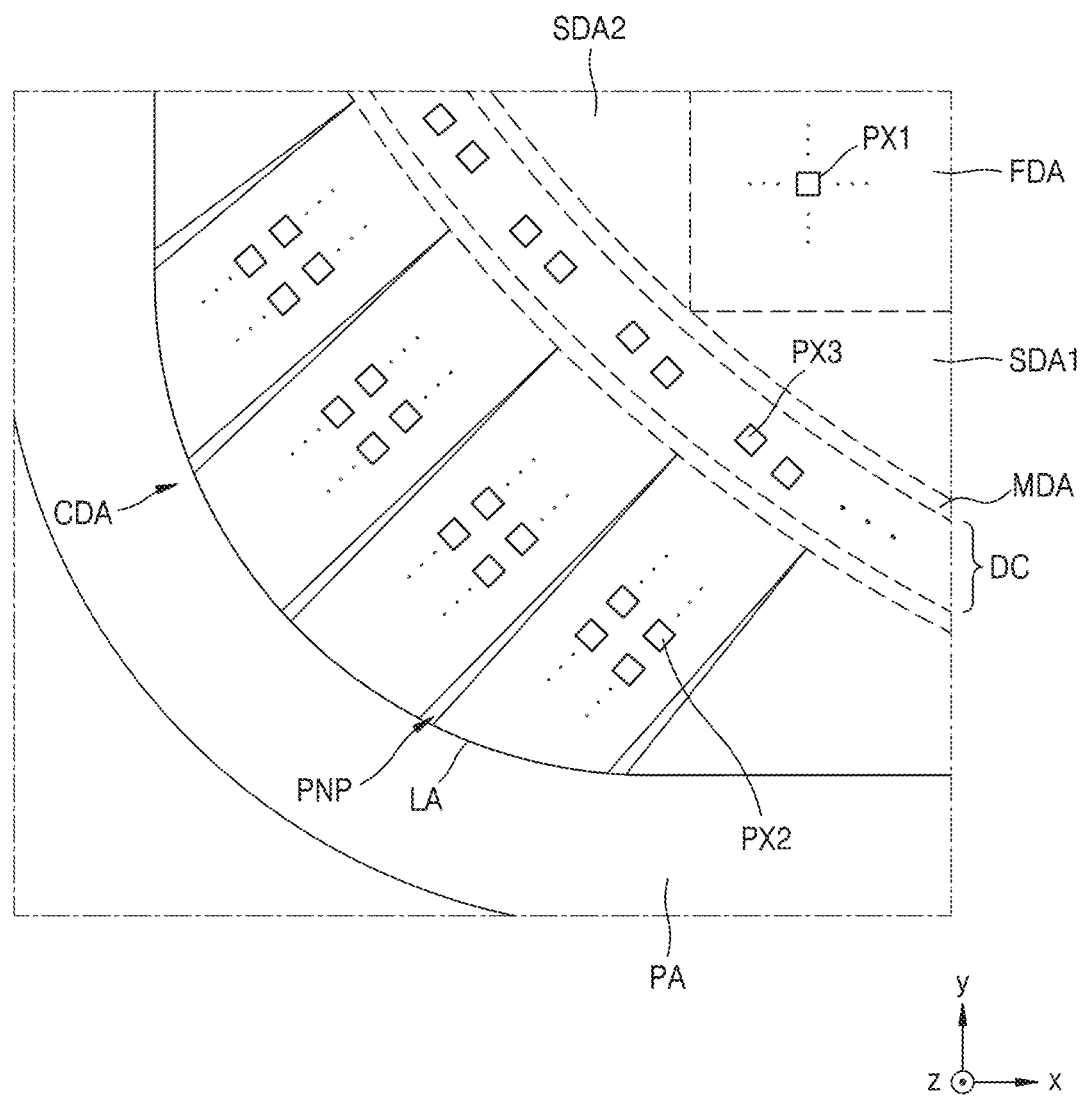

FIGS. 5A through 5C are enlarged views illustrating a part of a display panel according to an embodiment.

Referring to FIGS. 5A through 5C, an embodiment of a display panel may include a display area and the peripheral area PA, and the display area may include the front display area FDA, the first and second side display areas SDA1 and SDA2, the corner display area CDA, and the intermediate display area MDA.

The first pixel PX1 may be located in the front display area FDA, the second pixel PX2 may be located in the corner display area CDA, and the third pixel PX3 may be located in the intermediate display area MDA. In an embodiment shown in FIGS. 5A through 5C, sizes of the second pixel PX2 and the third pixel PX3 may be the same as each other, and sizes of the first pixel PX1 and the third pixel PX3 may be different from each other. In another embodiment, sizes of the first pixel through the third pixel PX3 may be the same. In an alternative embodiment, sizes of the first pixel PX1 through the third pixel PX3 may be different from one another. In another alternative embodiment, one of the first pixel PX1, the second pixel PX2, and the third pixel PX3 may be the same as another one of the first pixel PX1, the second pixel PX2, and the third pixel PX3.

In an embodiment, the corner display area CDA may include a plurality of extension areas LA extending from the intermediate display area MDA. In such an embodiment, the plurality of extension areas LA may extend away from the front display area FDA. In an embodiment, the second pixels PX2 may be respectively located in the plurality of extension areas LA. Referring to FIGS. 5A and 5B, the second pixels PX2 may be aligned in a direction in which the extension area LA extends. Referring to FIG. 5C, the second pixels PX2 may be arranged along a plurality of lines in a direction in which the extension area LA extends. Hereinafter, for convenience of description, embodiments where the second pixels PX2 are aligned in a direction in which the extension area LA extends will be described in detail.

In such an embodiment, a through-portion PNP may be defined or provided between adjacent extension areas LA. Accordingly, an empty space may be defined between the adjacent extension areas LA.

Referring to FIG. 5A, in an embodiment, a width of the through-portion PNP may increase from the intermediate display area MDA to ends of the plurality of extension areas LA. That is, a width of the through-portion PNP may increase as being away from the front display area FDA. In such an embodiment, a width of the through-portion PNP refers to a distance between adjacent extension areas LA. That is, the plurality of extension areas LA may be radially arranged.

In one embodiment, for example, a first width dis1 of the through-portion PNP at end portions of the extension areas LA may be greater than a second width dis2 of the through-portion PNP at a middle portion between the end portions and the intermediate display area MDA. In an embodiment, adjacent extension areas LA may be integrally provided at a portion where the extension areas LA and the intermediate display area MDA are connected.

Referring to FIG. 5B, in an alternative embodiment, a width of the through-portion PNP may be constant in a direction from the intermediate display area MDA to an end portion of the extension area LA. In such an embodiment, the plurality of extension areas LA may extend in a same direction (or to be parallel to each other) from the intermediate display area MDA.

The peripheral area PA may fix end portions of the plurality of extension areas LA. Accordingly, the plurality of extension areas LA may be fixed by the peripheral area PA. In an embodiment, a power wiring and/or a driving circuit may be located in the peripheral area PA. In an embodiment, the peripheral areas PA may be spaced apart from one another to respectively correspond to the plurality of extension areas LA. In such an embodiment, the through-portion PNP may extend to the peripheral area PA between adjacent extension areas LA.

Figure 6A:
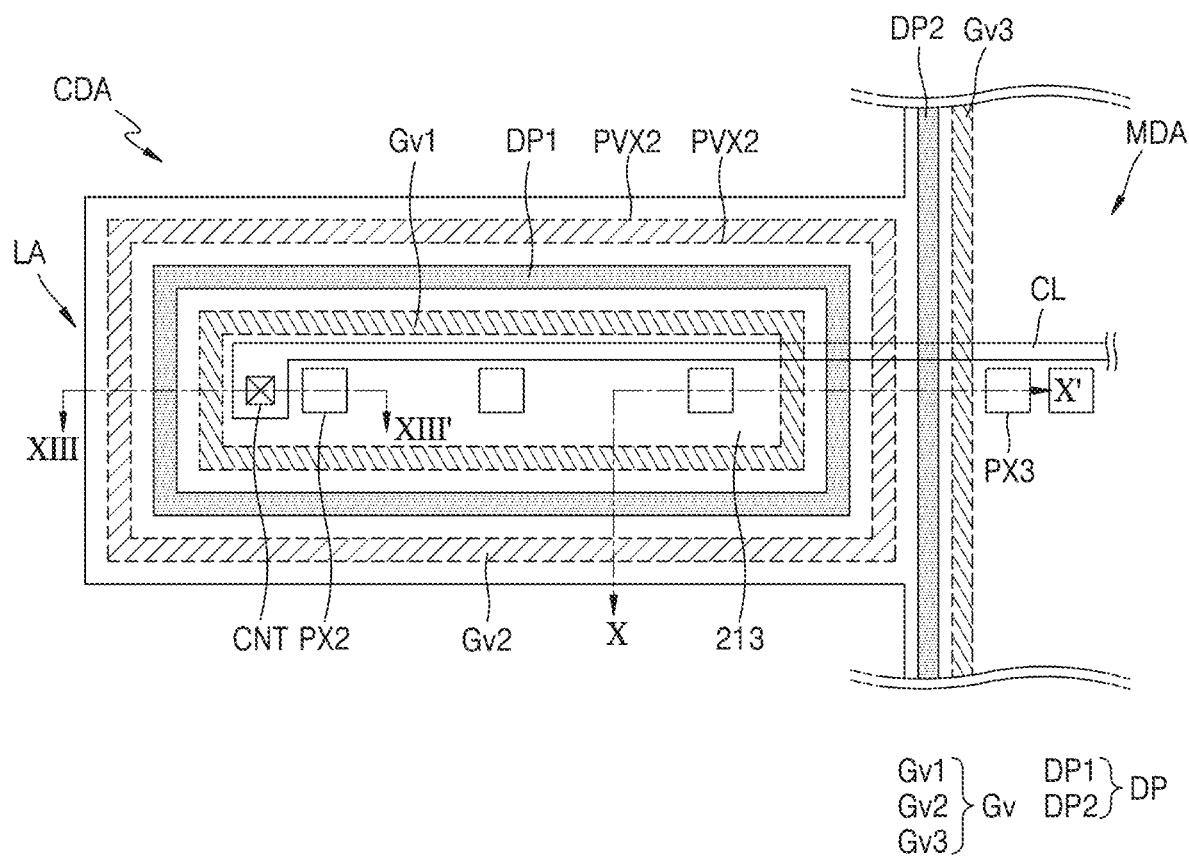
FIGS. 6A and 6B are plan views illustrating one of extension areas according to an embodiment.
Figure 6B:
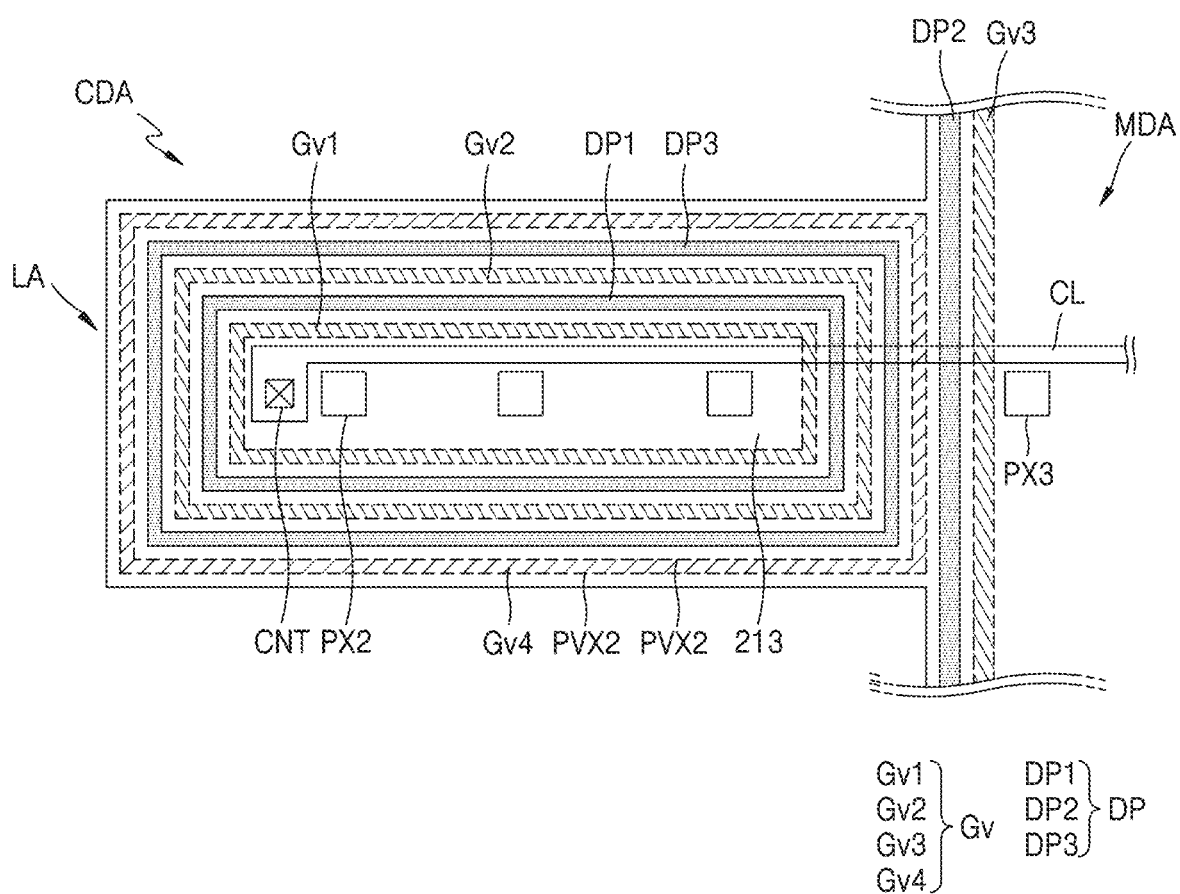

FIGS. 6A and 6B are plan views illustrating one of the extension areas LA according to an embodiment.

Referring to FIG. 6A, in an embodiment, the corner display area CDA may include the plurality of extension areas LA extending from the intermediate display area MDA, and a through-portion may be provided between adjacent extension areas LA. In such an embodiment, the second pixel PX2 including a second display element may be located in the extension area LA, and the third pixel PX3 including a third display element may be located in the intermediate display area MDA.

A display panel may include a groove Gv located on a substrate. The groove Gv may be concave (or recessed) in a thickness direction of the substrate. In the present embodiment, at least one groove Gv may be located in the extension area LA. In one embodiment, for example, the groove Gv may include a first groove Gv1, a second groove Gv2, and a third groove Gv3. In such an embodiment, the first groove Gv1 and the second groove Gv2 may be located in the second extension area LA, and the second groove Gv2 may surround the first groove Gv1. The third groove Gv3 may be spaced apart from the extension area LA. The third groove Gv3 may extend along the corner display area CDA. In an embodiment, the third groove Gv3 may extend in one direction.

At least one groove Gv may surround the second pixel PX2. In one embodiment, for example, the first groove Gv1 and the second groove Gv2 may surround a plurality of second pixels PX2. In such an embodiment, the first groove Gv1 and the second groove Gv2 may surround the second display element. Alternatively, the first groove Gv1 may individually surround the second pixel PX2.

In an embodiment, an inorganic pattern layer PVX2 may be located on opposing sides of the groove Gv and may include a pair of protruding tips protruding toward the center of the groove Gv. The inorganic pattern layer PVX2 is shown by dotted lines in FIGS. 6A and 6B.

In such an embodiment, at least one of the groove Gv and the inorganic pattern layer PVX2 including the protruding tips may be located in the extension area LA. When the second display element included in the second pixel PX2 is an organic light-emitting diode, the second display element may include a pixel electrode, an intermediate layer including an emission layer, and a counter electrode 213. In such an embodiment, the intermediate layer may include a first functional layer between the pixel electrode and the emission layer and/or a second functional layer between the emission layer and the counter electrode 213. The first functional layer and the second functional layer may be entirely formed over the extension area LA and the intermediate display area MDA. The first functional layer and the second functional layer may each include an organic material, and external oxygen or moisture may be introduced through the first functional layer and the second functional layer into the intermediate display area MDA and the extension area LA. The external oxygen or moisture may damage the organic light-emitting diode inside the intermediate display area MDA and the extension area LA. In an embodiment, the first functional layer and the second functional layer may be separated (or disconnected) by the groove Gv and the protruding tips, and the external moisture and oxygen may be prevented from being introduced into the organic light-emitting diode. Accordingly, damage to the organic light-emitting diode may be effectively prevented.

The display panel may include a dam portion DP located on the substrate. The dam portion DP may protrude in the thickness direction of the substrate. In an embodiment, at least one dam portion DP may be located in the extension area LA. In one embodiment, for example, the dam portion DP may include a first dam portion DP1 and a second dam portion DP2. In such an embodiment, the first dam portion DP1 may be located in the extension area LA, and the second dam portion DP2 may be spaced apart from the extension area LA. The second dam portion DP2 may extend along the corner display area CDA.

At least one dam portion DP may surround the second pixel PX2. That is, at least one dam portion DP may surround the second display element. In one embodiment, for example, the first dam portion DP1 may surround the plurality of second pixels PX2. In such an embodiment, the first dam portion DP1 may be located between the first groove Gv1 and the second groove Gv2.

In an embodiment, at least one dam portion DP may be located in the extension area LA. In such an embodiment, when the second display element included in the second pixel PX2 is an organic light-emitting diode, the organic light-emitting diode may be vulnerable to oxygen and moisture as described above. Accordingly, a thin-film encapsulation layer for encapsulating the organic light-emitting diode may be located on the second pixel PX2. In such an embodiment, the thin-film encapsulation layer may include at least one inorganic encapsulation layer and at least one organic encapsulation layer. In such an embodiment, the dam portion DP protrudes in the thickness direction of the substrate, such that the dam portion DP may control the flow of the at least one organic encapsulation layer. In such an embodiment, the dam portion may separate the at least one organic encapsulation layer. In such an embodiment, the at least one organic encapsulation layer may fill the first groove Gv1 and the third groove Gv3.

In an embodiment, a contact hole CNT may be defined through at least one of multiple layers stacked in the extension area LA at an end portion of the extension area LA. In such an embodiment, the contact hole CNT may be located inside the first groove Gv1. That is, the contact hole CNT may be surrounded by the first groove Gv1. The contact hole CNT may be located between the first groove Gv1 and the second pixel PX2 that is farthest from the intermediate display area MDA. In an embodiment, the counter electrode 213 may also be entirely formed over the extension area LA and the intermediate display area MDA, like the first functional layer or the second functional layer.

In such an embodiment, the counter electrode 213 may be separated by the groove Gv. Accordingly, a connection wiring CL for supplying power may be located in the extension area LA, and the connection wiring CL may supply the second power supply voltage ELVSS (see FIG. 3) to the second pixel PX2 through the contact hole CNT.

Referring to FIG. 6B, in an alternative embodiment, the groove Gv may further include a fourth groove Gv4. The fourth groove Gv4 may be located in the extension area LA, and may surround the second groove Gv2.

The dam portion DP may further include a third dam portion DP3. The third dam portion DP3 may surround the first dam portion DP1. In an embodiment, the third dam portion DP3 may be located between the second groove Gv2 and the fourth groove Gv4. As such, in an embodiment, the dam portion DP and the groove Gv may be alternately arranged. In an alternative embodiment, the groove Gv may be continuously located, or the dam portion DP may be continuously located.

Hereinafter, for convenience of description, embodiments where the groove Gv includes the first groove Gv1, the second groove Gv2, and the third groove Gv3, and the dam portion DP includes the first dam portion DP1 and the second dam portion DP2 as shown in FIG. 6A will be described in detail.

Figure 7A:
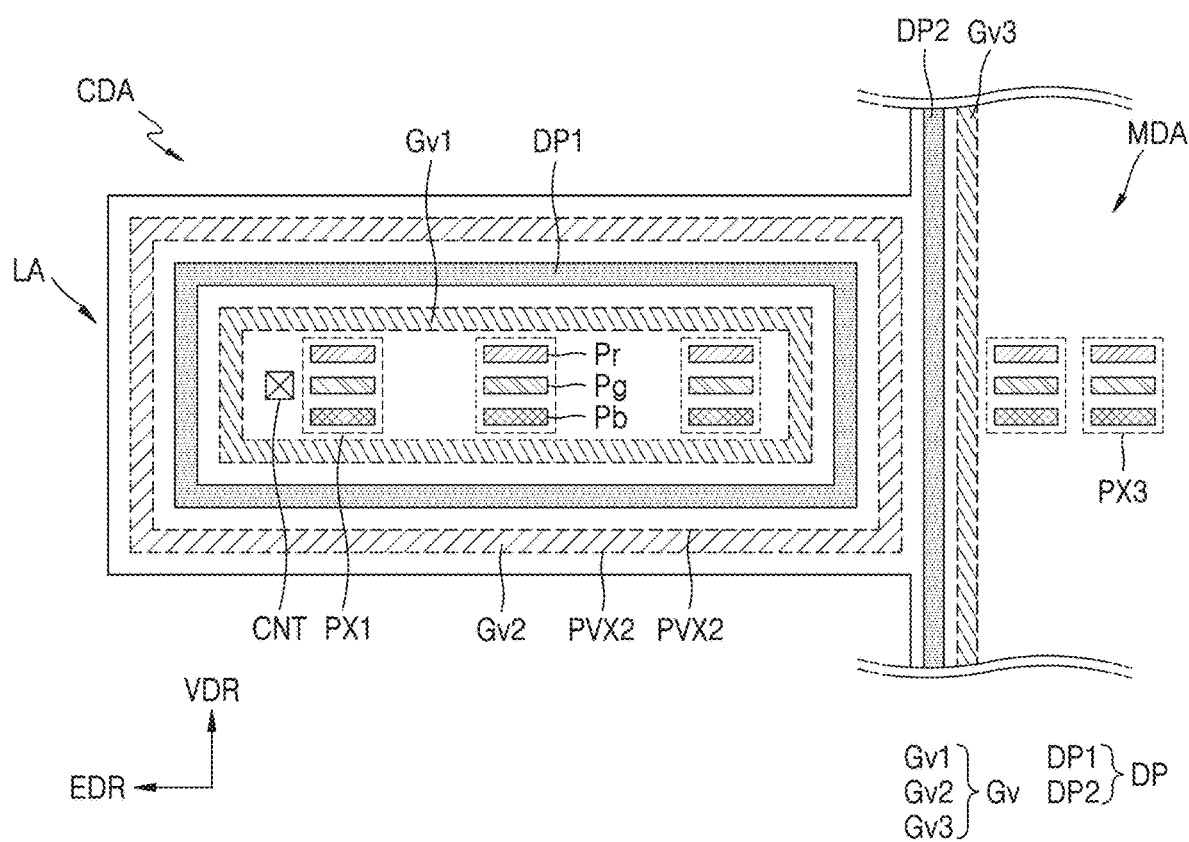
FIGS. 7A and 7B are plan views illustrating a sub-pixel arrangement structure of an extension area according to an embodiment.
Figure 7B:
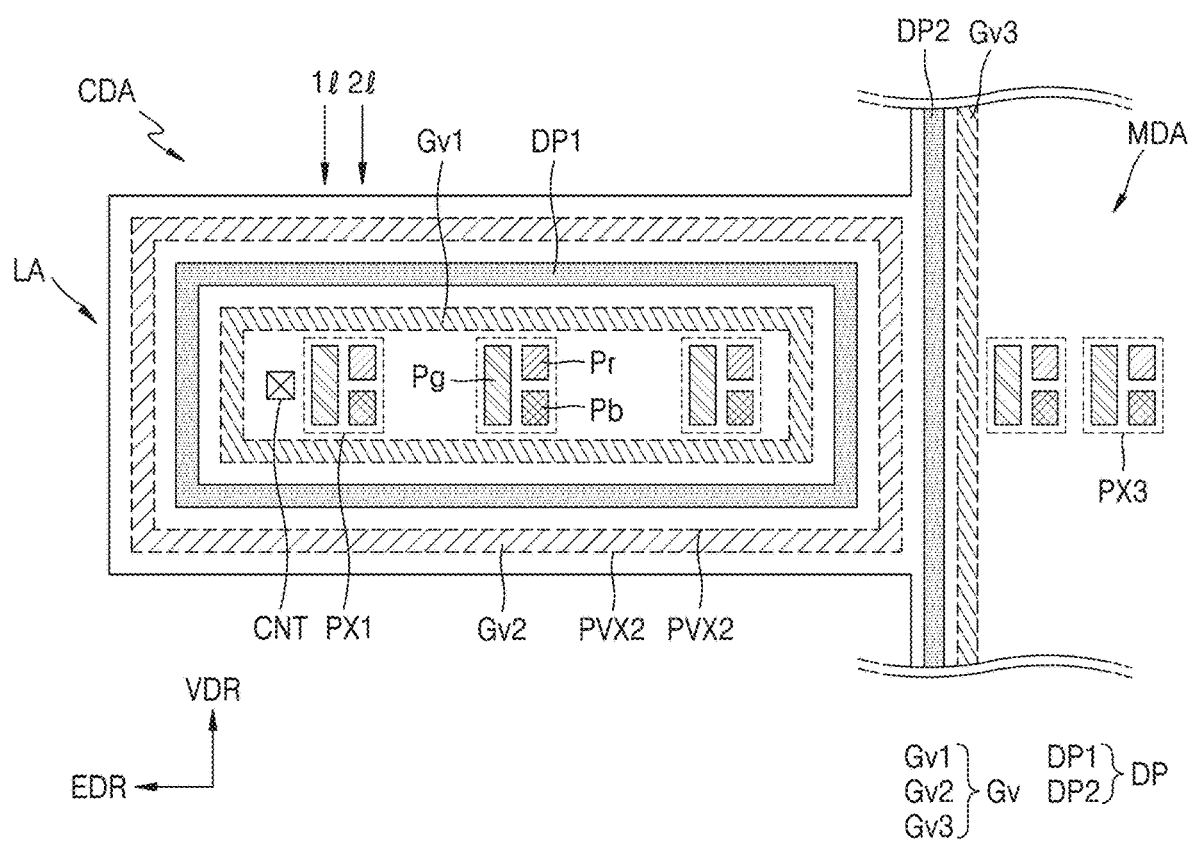

FIGS. 7A and 7B are plan views each illustrating a sub-pixel arrangement structure of the extension area LA according to an embodiment. In FIGS. 7A and 7B, the same elements as those in FIG. 6A are denoted by the same reference numerals, and thus any repetitive detailed description thereof will be omitted.

Referring to FIGS. 7A and 7B, in an embodiment, the corner display area CDA may include the plurality of extension areas LA extending from the intermediate display area MDA, and a through-portion may be provided between adjacent extension areas LA. In such an embodiment, the second pixel PX2 including a second display element may be located in the extension area LA, and the third pixel PX3 including a third display element may be located in the intermediate display area MDA.

A plurality of second pixels PX2 may be provided in the extension area LA. In such an embodiment, the plurality of second pixels PX2 may be located parallel to one another along an extension direction EDR of the extension area LA.

In an embodiment, a plurality of third pixels PX3 may be provided in the intermediate display area MDA. In an embodiment, the plurality of third pixels PX3 may be arranged along the extension direction EDR. In such an embodiment, the plurality of third pixels PX3 may be arranged parallel to the plurality of second pixels PX2.

Each of the second pixel PX2 and the third pixel PX3 may include a red sub-pixel Pr, a green sub-pixel Pg, and a blue sub-pixel Pb. The red sub-pixel Pr, the green sub-pixel Pg, and the blue sub-pixel Pb may respectively emit red light, green light, and blue light. The term 'sub-pixel' used herein refers to an emission area that is a minimum unit for forming an image. In an embodiment where a display element includes an organic light-emitting diode, the emission area may be defined by an opening of a pixel-defining film, which will be described below.

Referring to FIG. 7A, in an embodiment, the red sub-pixel Pr, the green sub-pixel Pg, and the blue sub-pixel Pb may be provided in a stripe structure. In such an embodiment, the red sub-pixel Pr, the green sub-pixel Pg, and the blue sub-pixel Pb may be located parallel to one another in a vertical direction VDR perpendicular to the extension direction EDR. In such an embodiment, the red sub-pixels Pr, the green sub-pixels Pg, and the blue sub-pixels Pb may be respectively located parallel to one another in the extension direction EDR. In such an embodiment, each of the red sub-pixel Pr, the green sub-pixel Pg, and the blue sub-pixel Pb may have a long side in the extension direction EDR.

Alternatively, the red sub-pixel Pr, the green sub-pixel Pg, and the blue sub-pixel Pb may be located parallel to one another in the extension direction EDR. In such an embodiment, each of the red sub-pixel Pr, the green sub-pixel Pg, and the blue sub-pixel Pb may have a long side in the vertical direction VDR.

In an embodiment, the red sub-pixel Pr, the green sub-pixel Pg, and the blue sub-pixel Pb of the third pixel PX3 may be respectively located parallel to the red sub-pixel Pr, the green sub-pixel Pg, and the blue sub-pixel Pb of the second pixel PX2.

Referring to FIG. 7B, in an alternative embodiment, a sub-pixel arrangement structure of the second pixel PX2 and a sub-pixel arrangement structure of the third pixel PX3 may be an S-stripe structure. Each of the second pixel PX2 and the third pixel PX3 may include the red sub-pixel Pr, the green sub-pixel Pg, and the blue sub-pixel Pb.

In such an embodiment, the green sub-pixel Pg may be located in a first column 11, and the red sub-pixel Pr and the blue sub-pixel Pb may be located in a second column 21 adjacent to the first column 11. In such an embodiment, the green sub-pixel Pg may have a quadrangular shape having a long side in the vertical direction VDR, and the red sub-pixel Pr and the blue sub-pixel Pb may have a quadrangular shape. In such an embodiment, a side of the red sub-pixel Pr and a side of the blue sub-pixel Pb may face a long side of the green sub-pixel Pg.

In another alternative embodiment, a sub-pixel arrangement structure of each of the second pixel PX2 and the third pixel PX3 may be a pentile structure.

Figure 8A:
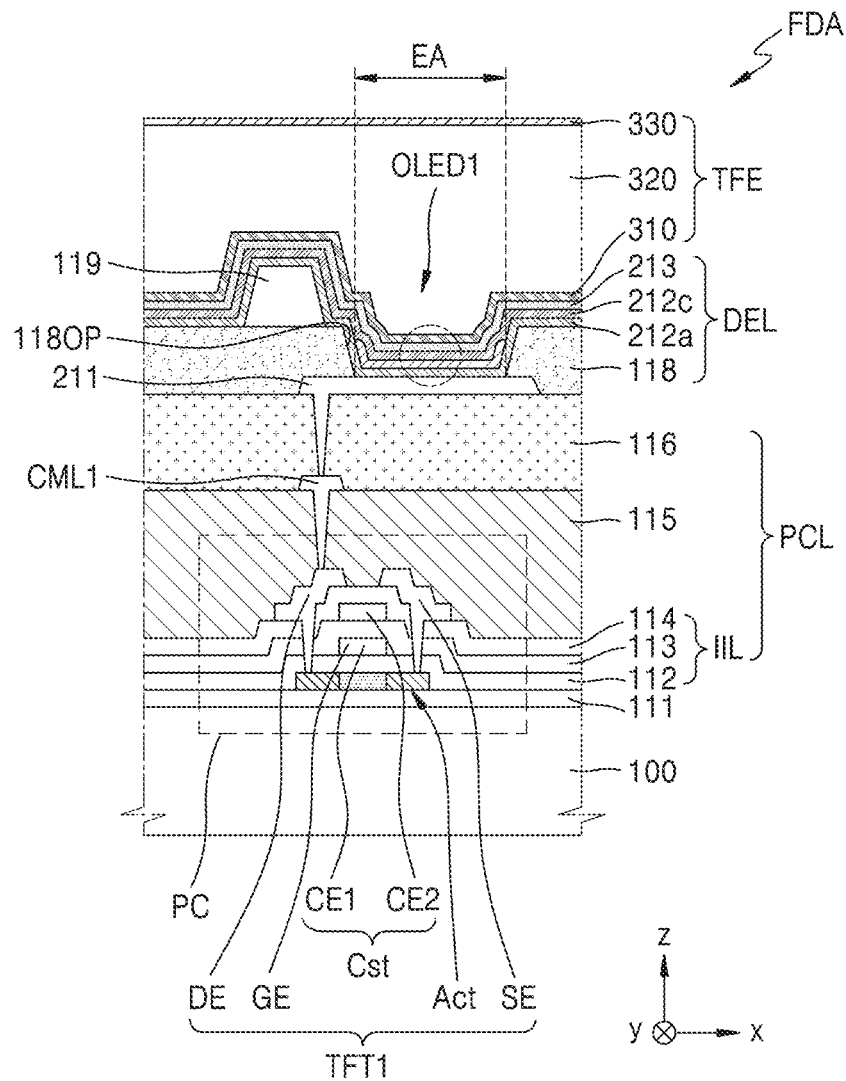
FIG. 8A is a cross-sectional view illustrating a front display area according to an embodiment.
Figure 8B:
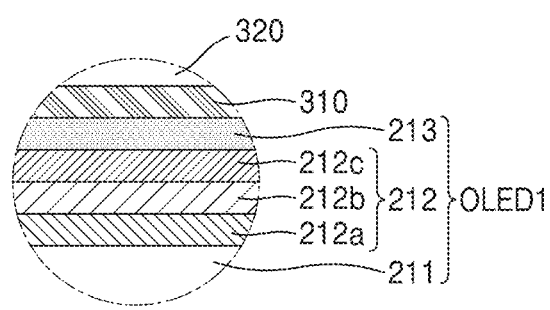
FIG. 8B is an enlarged view of the encircled portion of FIG. 8A.

FIG. 8A is a cross-sectional view illustrating the front display area FDA according to an embodiment. FIG. 8B is an enlarged view of the encircled portion of FIG. 8A.

Referring to FIGS. 8A and 8B, an embodiment of a display panel may include the substrate 100, a buffer layer 111, a pixel circuit layer PCL, a display element layer DEL, and a thin-film encapsulation layer TFE.

The buffer layer 111 may be located on the substrate 100. The buffer layer 111 may include an inorganic insulating material such as silicon nitride, silicon oxynitride, or silicon oxide, and may have a single or multi-layer structure including the above inorganic insulating material.

The pixel circuit layer PCL may be located on the buffer layer 111. The pixel circuit layer PCL may include a first thin-film transistor TFT1, an inorganic insulating layer IIL located under and/or over elements of the first thin-film transistor TFT1, a first planarization layer 115, and a second planarization layer 116. The inorganic insulating layer IIL may include a first gate insulating layer 112, a second gate insulating layer 113, and an interlayer insulating layer 114.

In an embodiment, the first thin-film transistor TFT1 may include a semiconductor layer Act, and the semiconductor layer Act may include polysilicon. Alternatively, the semiconductor layer Act may include amorphous silicon, an oxide semiconductor, or an organic semiconductor. The semiconductor layer Act may include a channel region, and a drain region and a source region located on opposing sides of the channel region. A gate electrode GE may overlap the channel region.

The gate electrode GE may include a low-resistance metal material. The gate electrode GE may include a conductive material including molybdenum (Mo), aluminum (Al), copper (Cu), or titanium (Ti), and may have a single or multi-layer structure including the above material.

The first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The second gate insulating layer 113 may cover the gate electrode GE. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO), and may include a same material as the first gate insulating layer 112.

An upper electrode CE2 of the storage capacitor Cst may be located over the second gate insulating layer 113. The upper electrode CE2 may overlap the gate electrode GE located under the upper electrode CE2. In such an embodiment, the gate electrode GE and the upper electrode CE2 overlapping each other with the second gate insulating layer 113 therebetween may constitute the storage capacitor Cst. In such an embodiment, the gate electrode GE may function as a lower electrode CE1 of the storage capacitor Cst.

In such an embodiment, the storage capacitor Cst and the first thin-film transistor TFT1 may overlap each other. In an alternative embodiment, the storage capacitor Cst may not overlap the first thin-film transistor TFT1.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 114 may have a single or multi-layer structure including the above inorganic insulating material.

Each of a drain electrode DE and a source electrode SE may be located on the interlayer insulating layer 114. Each of the drain electrode DE and the source electrode SE may include a material having high conductivity. Each of the drain electrode DE and the source electrode SE may include a conductive material including molybdenum (Mo), aluminum (Al), copper (Cu), or titanium (Ti), and may have a single or multi-layer structure including the above material. In an embodiment, each of the drain electrode DE and the source electrode SE may have a multi-layer structure including Ti/Al/Ti.

The first planarization layer 115 may cover the drain electrode DE and the source electrode SE. The first planarization layer 115 may include an organic insulating layer. The first planarization layer 115 may include an organic insulating material such as a general-purpose polymer (e.g., polymethyl methacrylate ("PMMA") or polystyrene ("PS")), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a combination (e.g., a blend) thereof.

A first connection electrode CML1 may be located on the first planarization layer 115. In such an embodiment, the first connection electrode CML1 may be connected to the drain electrode DE or the source electrode SE through a contact hole defined in the first planarization layer 115. The first connection electrode CML1 may include a material having high conductivity. The first connection electrode CML1 may include a conductive material including molybdenum (Mo), aluminum (Al), copper (Cu), or titanium (Ti) and may have a single or multi-layer structure including the above material. In an embodiment, the first connection electrode CML1 may have a multi-layer structure including Ti/Al/Ti.

The second planarization layer 116 may cover the first connection electrode CML1. The second planarization layer 116 may include an organic insulating layer. The second planarization layer 116 may include an organic insulating material such as a general-purpose polymer (e.g., PMMA or PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a combination thereof.

The display element layer DEL may be located on the pixel circuit layer PCL. The display element layer DEL may include a first organic light-emitting diode OLED1, and a pixel electrode 211 of the first organic light-emitting diode OLED1 may be electrically connected to the first connection electrode CML1 through a contact hole defined in the second planarization layer 116.

The pixel electrode 211 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In an alternative embodiment, the pixel electrode 211 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a combination (e.g., a compound) thereof. In another alternative embodiment, the pixel electrode 211 may further include a film formed of ITO, IZO, ZnO, or $In_2O_3$ over/under the reflective film.

A pixel-defining film 118, through which an opening 1180P is defined to expose a central portion of the pixel electrode 211, may be located on the pixel electrode 211. The pixel-defining film 118 may include an organic insulating material and/or an inorganic insulating material. The opening 1180P may define an emission area EA of light emitted by the first organic light-emitting diode OLED1. In one embodiment, for example, a width of the opening 1180P may correspond to a width of the emission area EA.

A spacer 119 may be located on the pixel-defining film 118. The spacer 119 may prevent damage to the substrate 100 in a method of manufacturing a display apparatus. A mask sheet may be used in an embodiment of a method of manufacturing a display panel, and in such an embodiment, the spacer 119 may effectively prevent the mask sheet from being introduced into the opening 1180P of the pixel-defining film 118 or being closely attached to the pixel-defining film 118, such that a part of the substrate 100 is effectively prevented from being damaged by the mask sheet when a deposition material is deposited on the substrate 100.

The spacer 119 may include an organic insulating material such as polyimide. Alternatively, the spacer 119 may include an inorganic insulating material such as silicon nitride or silicon oxide, or may include an organic insulating material and an inorganic insulating material.

In an embodiment, the spacer 119 may include a material different from that of the pixel-defining film 118. In an alternative embodiment, the spacer 119 may include a same material as that of the pixel-defining film 118, and in such an embodiment, the pixel-defining film 118 and the spacer 119 may be formed together during a same mask process using a halftone mask or the like.

In an embodiment, as shown in FIG. 8B, an intermediate layer 212 may be located on the pixel-defining film 118. The intermediate layer 212 may include an emission layer 212b located in the opening 1180P of the pixel-defining film 118. The emission layer 212b may include a high molecular weight organic material or a low molecular weight organic material emitting light of a certain color.

A first functional layer 212a and a second functional layer 212c may be respectively located under and over the emission layer 212b. The first functional layer 212a may include, for example, a hole transport layer ("HTL"), or may include a hole transport layer and a hole injection layer ("HIL"). The second functional layer 212c that is located over the emission layer 212b may be optional. The second functional layer 212c may include an electron transport layer ("ETL") and/or an electron injection layer ("EIL"). The first functional layer 212a and/or the second functional layer 212c may be a common layer formed to entirely cover the substrate 100, like the counter electrode 213 described below.

The counter electrode 213 may be formed of a conductive material having a low work function. In one embodiment, for example, the counter electrode 213 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a combination thereof. Alternatively, the counter electrode 213 may further include a layer formed of ITO, IZO, ZnO, or $In_2O_3$ on the (semi-)transparent layer including the above material.

In an embodiment, a capping layer (not shown) may be further located on the counter electrode 213. The capping layer may include LiF, an inorganic material, and/or an organic material.

The thin-film encapsulation layer TFE may be located on the counter electrode 213. In an embodiment, the thin-film encapsulation layer TFE may include at least one inorganic encapsulation layer and at least one organic encapsulation layer. In an embodiment, as shown in FIG. 8A, the thin-film encapsulation layer TFE includes a first inorganic encapsulation layer 310, an organic encapsulation layer 320, and a second inorganic encapsulation layer 330 that are sequentially stacked.

Each of the first and second inorganic encapsulation layers 310 and 330 may include at least one inorganic material selected from aluminum oxide, titanium oxide, tantalum oxide, hafnium oxide, zinc oxide, silicon oxide, silicon nitride, and silicon oxynitride. In an embodiment, the organic encapsulation layer 320 may include a polymer-based material. In such an embodiment, the polymer-based material may include at least one selected from an acrylic resin, an epoxy resin, polyimide, and polyethylene. In one embodiment, for example, the organic encapsulation layer 320 may include acrylate.

In an embodiment, although not shown in FIG. 8A, a touch electrode layer may be located on the thin-film encapsulation layer TFE, and an optical functional layer may be located on the touch electrode layer. The touch electrode layer may obtain coordinate information according to an external input, for example, a touch event. The optical functional layer may reduce a reflectance of light (external light) incident on the display apparatus, and/or improve color purity of light emitted from the display apparatus. In an embodiment, the optical functional layer may include a phase retarder and/or a polarizer. The phase retarder may be of a film type or a liquid crystal coating type, and may include a $\lambda/2$ phase retarder and/or a $\lambda/4$ phase retarder. The polarizer may also be of a film type or a liquid crystal coating type. The film type polarizer may include a stretchable synthetic resin film, and the liquid crystal coating type polarizer may include liquid crystals arranged in a certain arrangement. The phase retarder and the polarizer may further include a protective film.

In an alternative embodiment, the optical functional layer may include a black matrix and color filters. The color filters may be arranged in consideration of a color of light emitted by each of pixels of the display apparatus. Each of the color filters may include a red, green, or blue pigment or dye. Alternatively, each of the color filters may further include quantum dots in addition to the pigment or dye. Alternatively, some of the color filters may not include the pigment or dye, and may include scattering particles such as titanium oxide.

In another alternative embodiment, the optical functional layer may have a destructive interference structure. The destructive interference structure may include a first reflective layer and a second reflective layer that are located on different layers. First reflected light and second reflected light respectively reflected by the first reflective layer and the second reflective layer may be destructively interfered with each other, thereby reducing a reflectance of external light.

In an embodiment, an adhesive member (not shown) may be placed between the touch electrode layer and the optical functional layer. Any adhesive member that is known in the related art may be used without limitation. In one embodiment, for example, the adhesive member may be a pressure sensitive adhesive ("PSA").

Figure 9:
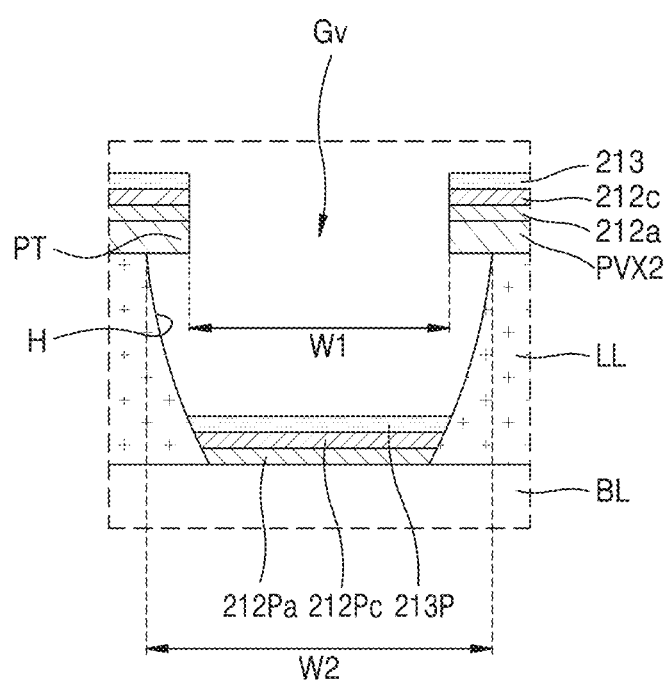
FIG. 9 is a cross-sectional view illustrating a groove in a display panel according to an embodiment.

FIG. 9 is a cross-sectional view illustrating the groove Gv in a display panel according to an embodiment.

Referring to FIG. 9, in an embodiment, the groove Gv may be defined or provided in a base layer BL and a lower layer LL. The groove Gv may be located on a substrate, and may be concave in a thickness direction of the substrate. In such an embodiment, the groove Gv may be defined by a top surface of the base layer BL and a hole H of the lower layer LL.

In an embodiment, the base layer BL may be a lower inorganic layer or a lower inorganic pattern layer. In such an embodiment, the base layer BL may have a single or multi-layer structure including silicon nitride (SiNx) and/or silicon oxide (SiOx). In an alternative embodiment, the base layer BL may be a metal pattern layer. In such an embodiment, the base layer BL may include a conductive material including molybdenum (Mo), aluminum (Al), copper (Cu), or titanium (Ti), and may have a single or multi-layer structure including the above material.

The lower layer LL may correspond to some of elements of the display panel of FIG. 8. In one embodiment, for example, the lower layer LL may be the second planarization layer 116 of FIG. 8. Alternatively, the lower layer LL may include the first planarization layer 115 and the second planarization layer 116. Alternatively, the lower layer LL may further include a third planarization layer between the first planarization layer 115 and the second planarization layer 116. In such an embodiment, the lower layer LL may include at least one of the first planarization layer 115, the second planarization layer 116, and the third planarization layer.

In an embodiment, where the base layer BL is a lower inorganic pattern layer or a metal pattern layer, the lower layer LL may cover an edge of the lower inorganic pattern layer or the metal pattern layer. In an embodiment, the hole H of the lower layer LL may expose a central portion of the lower inorganic pattern layer or a central portion of the metal pattern layer.

In such an embodiment, the inorganic pattern layer PVX2 may be located on opposing sides of the groove Gv. The inorganic pattern layer PVX2 may include a pair of protruding tips PT protruding toward the center of the groove Gv. In such an embodiment, a first width W1 between the protruding tips PT may be less than a second width (or a diameter) W2 of the hole H of the lower layer LL. In such an embodiment, the second width W2 is a distance between side surfaces of the lower layer LL which face each other and meet the inorganic pattern layer PVX2.

At least one of the first functional layer 212a and the second functional layer 212c may be located on the inorganic pattern layer PVX2. In such an embodiment, at least one of the first functional layer 212a and the second functional layer 212c may be separated by the protruding tips PT and the groove Gv.

At least one of a first functional layer pattern 212Pa and a second functional layer pattern 212Pc may be located in the groove Gv. In such an embodiment, the first functional layer pattern 212Pa and the second functional layer pattern 212Pc may include a same material as that of at least one of the first functional layer 212a and the second functional layer 212c. At least one of the first functional layer pattern 212Pa and the second functional layer pattern 212Pc may be formed at the same time as when at least one of the first functional layer 212a and the second functional layer 212c is formed.

The counter electrode 213 may be located on at least one of the first functional layer 212a and the second functional layer 212c. The counter electrode 213 may be separated by the protruding tips PT and the groove Gv. A counter electrode pattern 213P may be located in the groove Gv. In such an embodiment, the counter electrode pattern 213P may include same material as that of the counter electrode 213. The counter electrode pattern 213P may be formed at the same time as when the counter electrode 213 is formed.

Accordingly, in an embodiment, at least one of the first functional layer 212a and the second functional layer 212c and the counter electrode 213 may be separated by the protruding tips PT and the groove Gv. For convenience of description, embodiments where the first functional layer 212a, the second functional layer 212c, and the counter electrode 213 are separated by the protruding tips PT and the groove Gv will be described in detail.

Figure 10A:
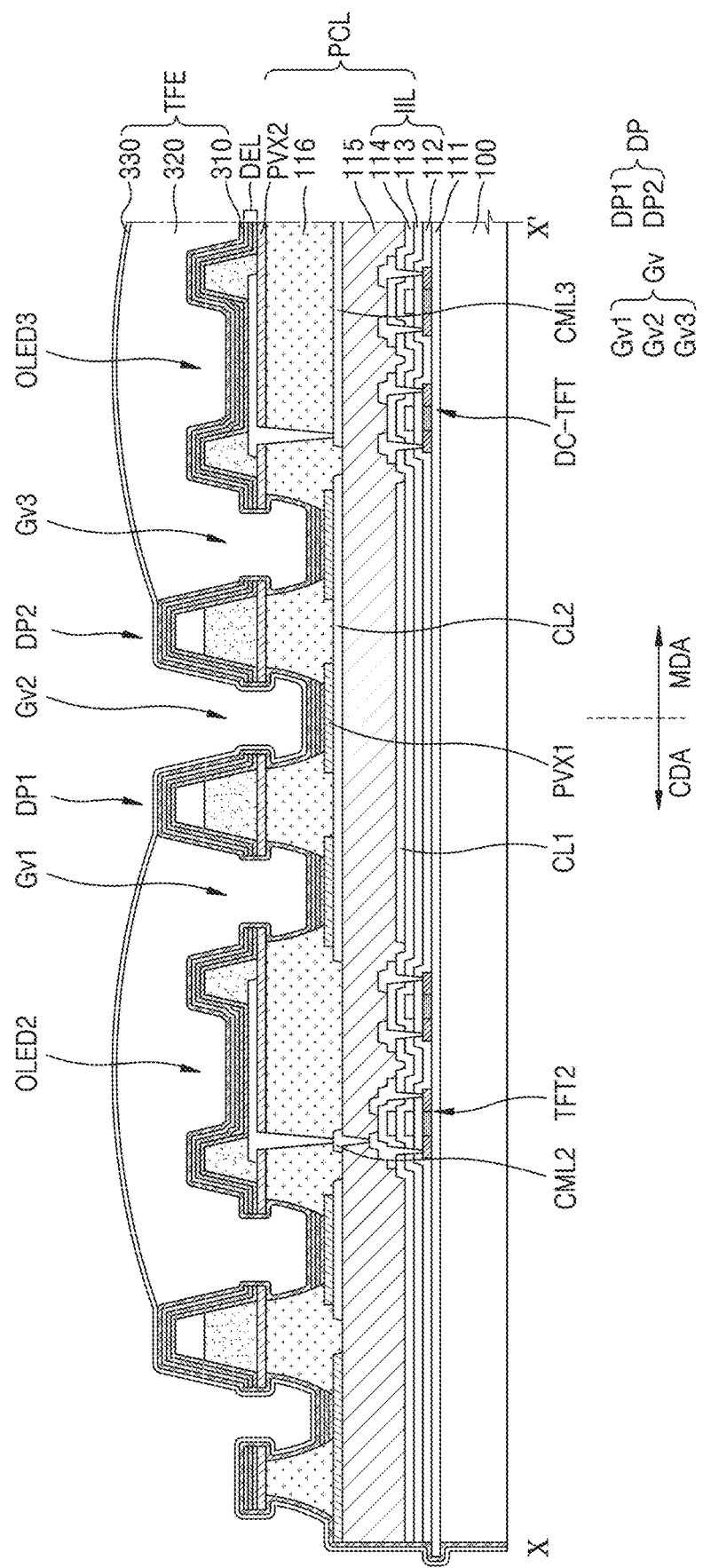
FIG. 10A is a cross-sectional view taken along line X-X' of FIG. 6A.
Figure 10B:
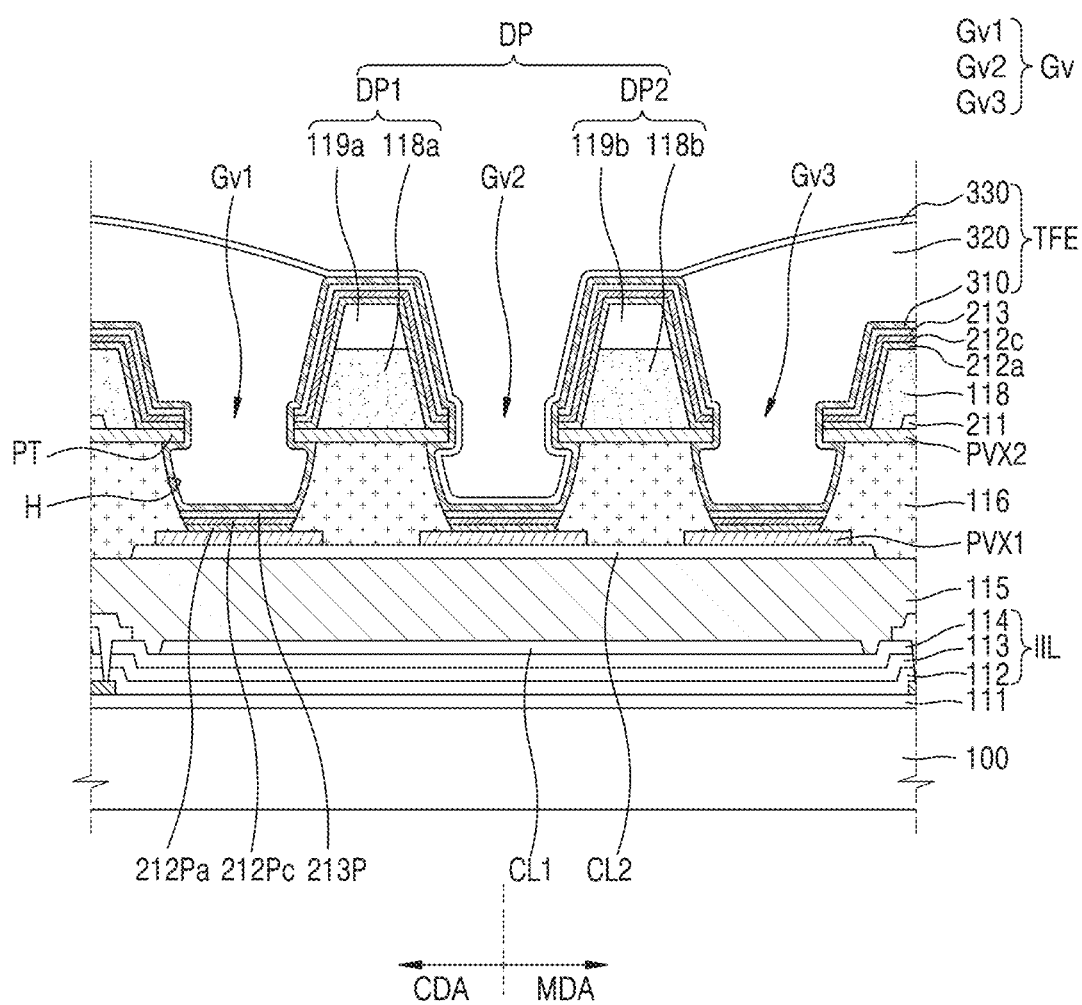
FIG. 10B is an enlarged view illustrating a groove and a dam portion of FIG. 10A.
Figure 10C:
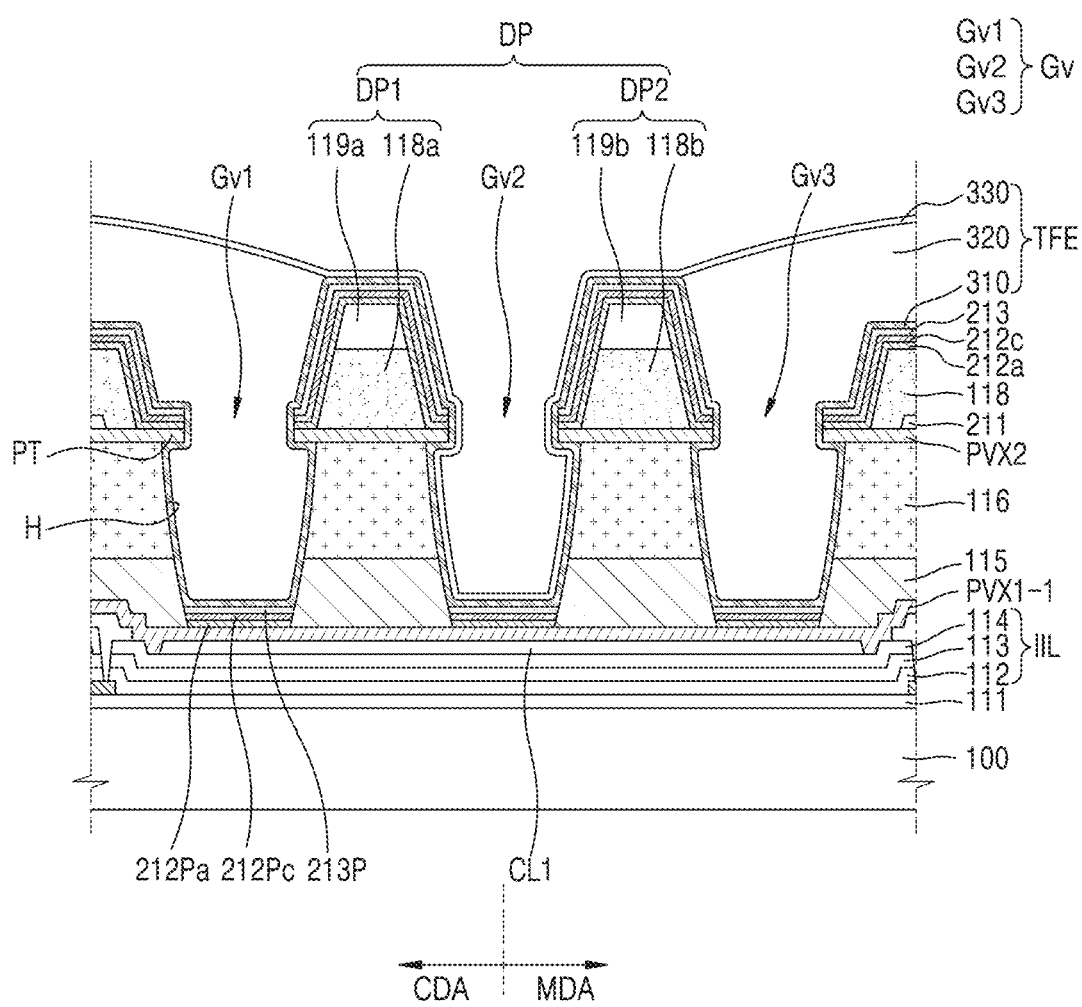
FIG. 10C is an enlarged view illustrating a groove and a dam portion according to an alternative embodiment.

FIG. 10A is a cross-sectional view taken along line X-X' of FIG. 6A. FIG. 10B is an enlarged view illustrating the groove Gv and the dam portion DP of FIG. 10A. In FIGS. 10A and 10B, the same elements as those in FIG. 8 are denoted by the same reference numerals, and thus any repetitive detailed description thereof will be omitted.

Referring to FIGS. 10A and 10B, an embodiment of a display panel may include the corner display area CDA and the intermediate display area MDA. The corner display area CDA may include a second thin-film transistor TFT2 and a second organic light-emitting diode OLED2 that is a second display element, and the intermediate display area MDA may include a third organic light-emitting diode OLED3 that is a third display element. The second thin-film transistor TFT2 and the second organic light-emitting diode OLED2 may constitute a second sub-pixel in the corner display area CDA, and the third organic light-emitting diode OLED3 may constitute a third sub-pixel in the intermediate display area MDA.

In an embodiment, the display panel may include the groove Gv on the substrate 100, and the groove Gv may be concave in a thickness direction of the substrate 100. In such an embodiment, the groove Gv may be located between the second organic light-emitting diode OLED2 and the third organic light-emitting diode OLED3. The groove Gv may include a first groove Gv1, a second groove Gv2, and a third groove Gv3. Each of the first groove Gv1, the second groove Gv2, and the third groove Gv3 may be the same as or similar to the groove Gv of FIG. 9. In such an embodiment, a lower layer of the first groove Gv1, the second groove Gv2, and the third groove Gv3 may be the second planarization layer 116.

Hereinafter, the structure of the display panel in the intermediate display area MDA and the corner display area CDA will be described in detail.

In an embodiment, the substrate 100, the buffer layer 111, the pixel circuit layer PCL, the display element layer DEL, and the thin-film encapsulation layer TFE may be stacked in the intermediate display area MDA and the corner display area CDA. The pixel circuit layer PCL may include the inorganic insulating layer IIL, a first connection wiring CL1, the first planarization layer 115, a second connection wiring CL2, the second planarization layer 116, and the inorganic pattern layer PVX2.

The buffer layer 111 may be located on the substrate 100. In an embodiment, the buffer layer 111 may include protruding tips in the corner display area CDA. The protruding tips of the buffer layer 111 may prevent the first functional layer 212a and/or the second functional layer 212c from being formed between adjacent extension areas LA.

The inorganic insulating layer IIL may be located on the buffer layer 111. The inorganic insulating layer IIL may include the first gate insulating layer 112, the second gate insulating layer 113, and the interlayer insulating layer 114.

The first connection wiring CL1 may be located on the inorganic insulating layer IIL. The first connection wiring CL1 may extend from the intermediate display area MDA to the corner display area CDA. The first connection wiring CL1 may be a power wiring for supplying power or a signal line for applying an electrical signal to the second pixel PX2 of the corner display area CDA.

The first planarization layer 115 may be located on the inorganic insulating layer IIL, and the first planarization layer 115 may cover the first connection wiring CL1. The second connection wiring CL2, a second connection electrode CML2, and a third connection electrode CML3 may be located on the first planarization layer 115.

The second connection wiring CL2 may extend from the intermediate display area MDA to the corner display area CDA. The second connection wiring CL2 may be a power wiring for supplying power or a signal line for applying an electrical signal to the second thin-film transistor TFT2 of the corner display area CDA, as the first connection wiring CL1.

In an embodiment, a lower inorganic pattern layer PVX1 may be located on the second connection wiring CL2. In an embodiment, a plurality of lower inorganic pattern layers PVX1 may be located on the second connection wiring CL2, and the plurality of lower inorganic pattern layers PVX1 may be spaced apart from one another on the second connection wiring CL2.

The second planarization layer 116 may cover the second connection wiring CL2, the second connection electrode CML2, and the third connection electrode CML3. In an embodiment, the second planarization layer 116 may be a lower layer for defining the groove Gv. In such an embodiment, the hole H may be defined through the second planarization layer 116, and the hole H may correspond to the lower inorganic pattern layer PVX1. In such an embodiment, the second planarization layer 116 may cover an edge of the lower inorganic pattern layer PVX1. Accordingly, the groove Gv may be defined by a central portion of the lower inorganic pattern layer PVX1 and the hole H of the second planarization layer 116.

In an embodiment, the inorganic pattern layer PVX2 may be located on the second planarization layer 116. The inorganic pattern layer PVX2 may be located on opposing sides of the groove Gv and may include a pair of protruding tips PT protruding toward the center of the groove Gv.

The first functional layer 212a, the second functional layer 212c, and the counter electrode 213 located on the inorganic pattern layer PVX2 may be separated by the groove Gv and the protruding tips PT. In such an embodiment, the first functional layer pattern 212Pa, the second functional layer pattern 212Pc, and the counter electrode pattern 213P may be located in the groove Gv.

In an embodiment, the dam portion DP protruding in the thickness direction of the substrate 100 may be provided over the inorganic pattern layer PVX2. In an embodiment, the dam portion DP may include the first dam portion DP1 and the second dam portion DP2. In such an embodiment, the dam portion DP and the groove Gv may be alternately arranged. In one embodiment, for example, the first groove Gv1, the first dam portion DP1, the second groove Gv2, the second dam portion DP2, and the third groove Gv3 may be sequentially arranged in a direction from the corner display area CDA to the intermediate display area MDA.

The first and second dam portions DP1 and DP2 may include first layers 118a and 118b, and second layers 119a and 119b located on the first layers 118a and 118b. In such an embodiment, the first layers 118a and 118b may include the same material as that of the pixel-defining film 118. In an embodiment, the first layers 118a and 118b may be formed at the same time as when the pixel-defining film 118 is formed. The second layers 119a and 119b may include a same material as that of the spacer 119 (see FIG. 8). In such an embodiment, the second layers 119a and 119b may be formed at the same time as when the spacer 119 is formed.

The thin-film encapsulation layer TFE may cover the second organic light-emitting diode OLED2 and the third organic light-emitting diode OLED3. The thin-film encapsulation layer TFE may include at least one inorganic encapsulation layer and at least one organic encapsulation layer. In an embodiment, as shown in FIGS. 10A and 10b, the thin-film encapsulation layer TFE includes the first inorganic encapsulation layer 310, the organic encapsulation layer 320, and the second inorganic encapsulation layer 330.

The thin-film encapsulation layer TFE may extend from the second organic light-emitting diode OLED2 to the first dam portion DP1. In such an embodiment, the thin-film encapsulation layer TFE may extend from the third organic light-emitting diode OLED3 to the second dam portion DP2.

The first inorganic encapsulation layer 310 may entirely and continuously cover the corner display area CDA and the intermediate display area MDA. In an embodiment, the first inorganic encapsulation layer 310 may be entirely and continuously located over the first groove Gv1, the first dam portion DP1, the second groove Gv2, the second dam portion DP2, and the third groove Gv3. Also, the first inorganic encapsulation layer 310 may cover the first functional layer pattern 212Pa, the second functional layer pattern 212Pc, and the counter electrode pattern 213P located in the groove Gv. The first inorganic encapsulation layer 310 may contact the inorganic pattern layer PVX2. In an embodiment, the first inorganic encapsulation layer 310 may contact the protruding tips PT of the inorganic pattern layer PVX2.

In an embodiment, the organic encapsulation layer 320 may be separated by the dam portion DP. In one embodiment, for example, the organic encapsulation layer 320 may extend from the second organic light-emitting diode OLED2 to the first dam portion DP1, and may fill the first groove Gv1. In such an embodiment, the organic encapsulation layer 320 may extend from the third organic light-emitting diode OLED3 to the second dam portion DP2, and may fill the third groove Gv3. In such an embodiment, the organic encapsulation layer 320 may be controlled by the first dam portion DP1 and the second dam portion DP2. In such an embodiment, the organic encapsulation layer 320 may not fill the second groove Gv2.

The second inorganic encapsulation layer 330 may entirely and continuously cover the corner display area CDA and the intermediate display area MDA, as the first inorganic encapsulation layer 310. In an embodiment, the second inorganic encapsulation layer 330 may contact the first inorganic encapsulation layer 310 on the first dam portion DP1 and the second dam portion DP2. In such an embodiment, the second inorganic encapsulation layer 330 may contact the first inorganic encapsulation layer 310 in the second groove Gv2. Accordingly, the organic encapsulation layer 320 may be separated by the dam portion DP. In an alternative embodiment, at least one of the first layers 118a and 118b and the second layers 119a and 119b of the first and second dam portions DP1 and DP2 may be omitted, and the organic encapsulation layer 320 may extend from the intermediate display are area MDA to the corner display area CDA. In such an embodiment, the organic encapsulation layer 320 may be integrally provided in the intermediate display area MDA and the corner display area CDA.

In an embodiment, the first inorganic encapsulation layer 310 and the second inorganic encapsulation layer 330 may cover exposed side surfaces of the substrate 100, the buffer layer 111, the inorganic insulating layer IIL, and the first planarization layer 115.

In an embodiment, the hole H of the second planarization layer 116 may be formed by using an etching process. In case where the lower inorganic pattern layer PVX1 is omitted, the second connection wiring CL2 may be etched during the etching process. In this case, a resistance of the second connection wiring CL2 may increase. In an embodiment of the invention, the lower inorganic pattern layer PVX1 is located on the second connection wiring CL2 to correspond to the hole H of the second planarization layer 116, such that the second connection wiring CL2 may be effectively prevented from being etched.

In an embodiment, a driving circuit or a power wiring may be located in the intermediate display area MDA, and the third organic light-emitting diode OLED3 may overlap the driving circuit or the power wiring. In an embodiment, as shown in FIG. 10A, the third organic light-emitting diode OLED3 overlaps a driving circuit transistor DC-TFT included in the driving circuit. In an embodiment, a third thin-film transistor connected to the third organic light-emitting diode OLED3 may be spaced apart from the intermediate display area MDA. In such an embodiment, the third organic light-emitting diode OLED3 may be connected through the third connection electrode CML3 to the third thin-film transistor. In an alternative embodiment, the third thin-film transistor may be located in the intermediate display area MDA. In such an embodiment, the third organic light-emitting diode OLED3 may be connected to the third thin-film transistor located in the intermediate display area MDA.

FIG. 100 is an enlarged view illustrating the groove Gv and the dam portion DP according to an alternative embodiment. In FIG. 100, the same elements as those in FIG. 10B are denoted by the same reference numerals, and thus any repetitive detailed description thereof will be omitted.

Referring to FIG. 100, an embodiment of the display panel may include the groove Gv on the substrate 100, and the groove Gv may be concave in a thickness direction of the substrate 100. In such an embodiment, the groove Gv may be located between the second organic light-emitting diode OLED2 and the third organic light-emitting diode OLED3. The groove Gv may include the first groove Gv1, the second groove Gv2, and the third groove Gv3. Each of the first groove Gv1, the second groove Gv2, and the third groove Gv3 may be the same as or similar to the groove Gv of FIG. 9. In such an embodiment, a lower layer of the first groove Gv1, the second groove Gv2, and the third groove Gv3 may include the first planarization layer 115 and the second planarization layer 116.

In an embodiment, the substrate 100, the buffer layer 111, the pixel circuit layer PCL, the display element layer DEL, and the thin-film encapsulation layer TFE may be stacked in the intermediate display area MDA and the corner display area CDA. The pixel circuit layer PCL may include the inorganic insulating layer IIL, the first connection wiring CL1, a lower inorganic layer PVX1-1, the first planarization layer 115, the second planarization layer 116, and the inorganic pattern layer PVX2.

The buffer layer 111 and the inorganic insulating layer IIL may be located on the substrate 100, and the first connection wiring CL1 may extend from the intermediate display area MDA to the corner display area CDA.

In an embodiment, the lower inorganic layer PVX1-1 may cover the first connection wiring CL1. In such an embodiment, the lower inorganic layer PVX1-1 may entirely cover the first connection wiring CL1. In some embodiments, the lower inorganic layer PVX1-1 may expose at least a part of the first connection wiring CL1. The lower inorganic layer PVX1-1 may have a single or multi-layer structure including an inorganic material such as silicon nitride ($SiN_x$) or silicon oxide (SiOx).

The lower layer including the first planarization layer 115 and the second planarization layer 116 may be located on the lower inorganic layer PVX1-1. The lower layer may expose a part of the lower inorganic layer PVX1-1. In such an embodiment, the hole H is defined through the lower layer including the first planarization layer 115 and the second planarization layer 116. In such an embodiment, the hole H of the lower layer may be formed by connecting a hole of the first planarization layer 115 and a hole of the second planarization layer 116. Accordingly, in such an embodiment, the groove Gv may be defined by the part of the lower inorganic layer PVX1-1 and the hole H of the lower layer.

The inorganic pattern layer PVX2 may be located on opposing sides of the groove Gv, and the first functional layer 212a, the second functional layer 212c, and the counter electrode 213 may be separated by the protruding tips PT of the inorganic pattern layer PVX2 and the groove Gv.

In an embodiment, because the hole H is defined in the lower layer including the first planarization layer 115 and the second planarization layer 116, a depth of the groove Gv may increase. Accordingly, because the first functional layer 212a, the second functional layer 212c, and the counter electrode 213 may be separated more effectively by the groove Gv and the protruding tips PT, the reliability of the display panel may be ensured.

Figure 11A:
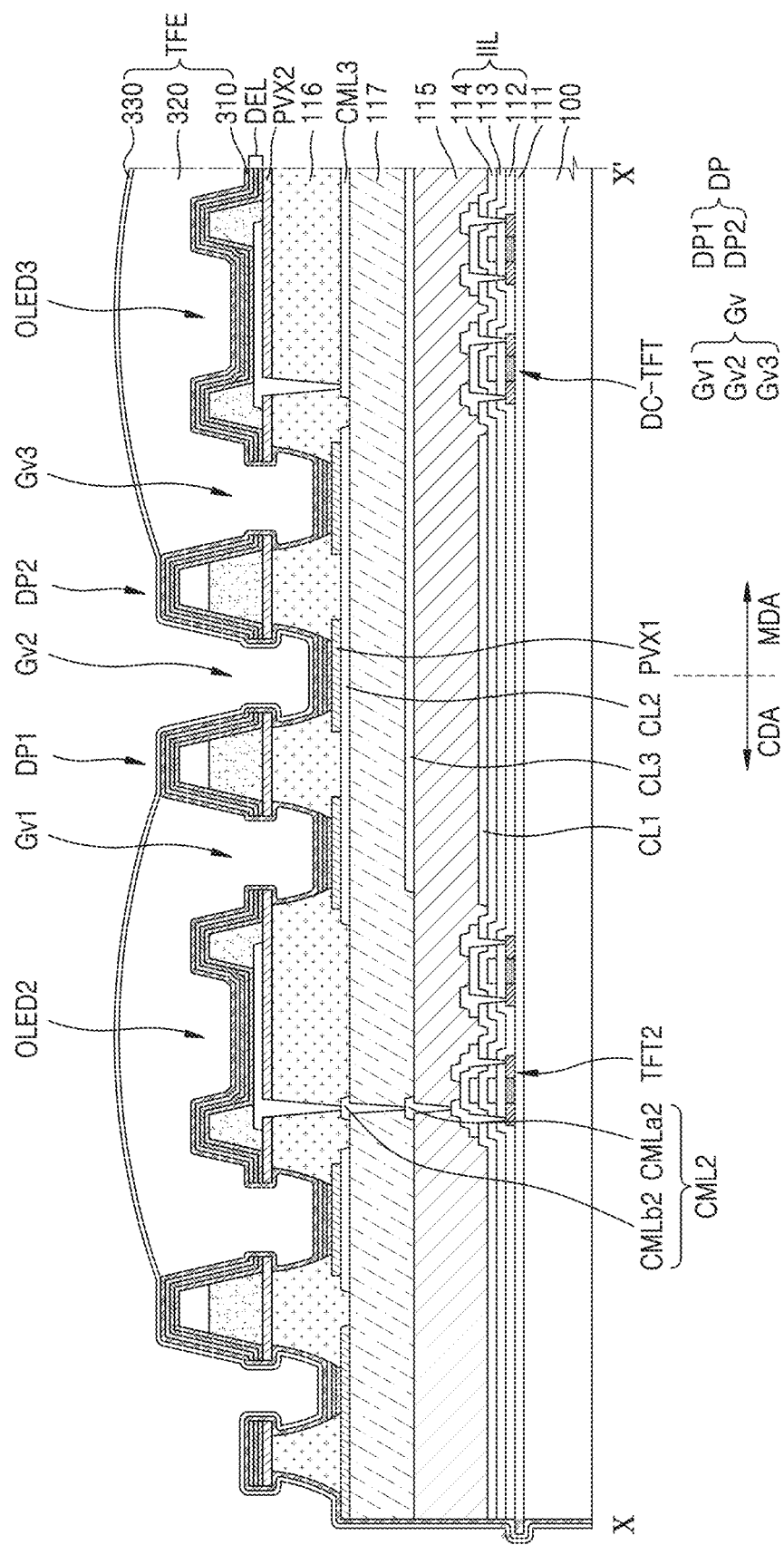
FIG. 11A is a cross-sectional view taken along line X-X' of FIG. 6A according to an alternative embodiment.
Figure 11B:
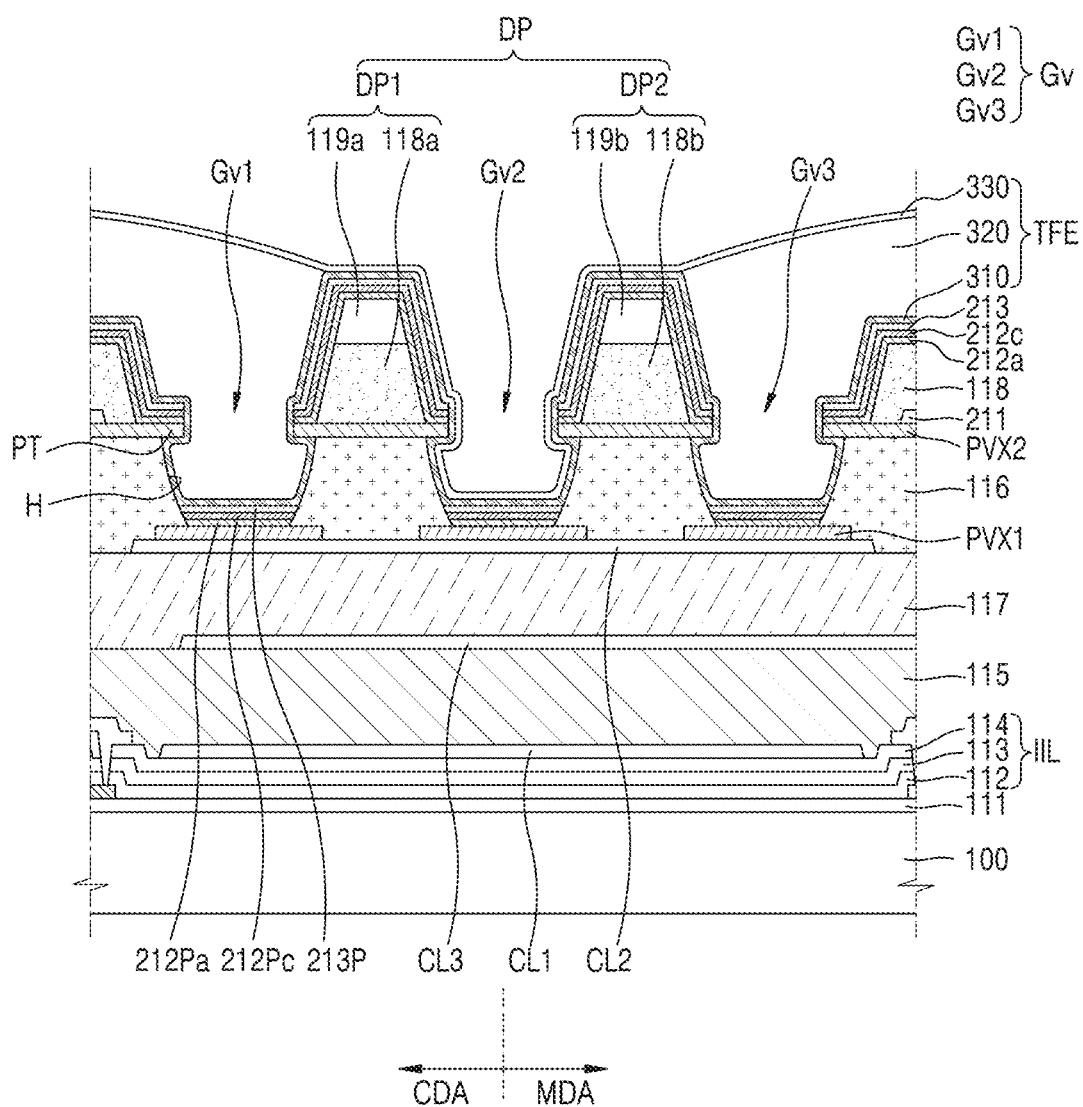
FIG. 11B is an enlarged view illustrating a groove and a dam portion of FIG. 11A.

FIG. 11A is a cross-sectional view taken along line X-X' of FIG. 6A according to an alternative embodiment. FIG. 11B is an enlarged view illustrating the groove Gv and the dam portion DP of FIG. 11A. In FIGS. 11A and 11B, the same elements as those in FIGS. 10A and 10B are denoted by the same reference numerals, and thus any repetitive detailed description thereof will be omitted.

An embodiment of FIGS. 11A and 11B is substantially the same as an embodiment of FIGS. 10A and 10B except that a third connection wiring CL3 and a third planarization layer 117 are provided.

Referring to FIGS. 11A and 11B, an embodiment of a display panel may include the corner display area CDA and the intermediate display area MDA. The corner display area CDA may include the second thin-film transistor TFT2 and the second organic light-emitting diode OLED2 that is a second display element, and the intermediate display area MDA may include the third organic light-emitting diode OLED3 that is a third display element.

In an embodiment, the display panel may include the groove Gv on the substrate 100, and the groove Gv may be concave in a thickness direction of the substrate 100. The inorganic pattern layer PVX2 may include a pair of protruding tips PT protruding toward the center of the groove Gv, and the groove Gv may be located between the second organic light-emitting diode OLED2 and the third organic light-emitting diode OLED3.

In an embodiment, the third planarization layer 117 may be located between the first planarization layer 115 and the second planarization layer 116. The third planarization layer 117 may include an organic insulating material such as a general-purpose polymer (e.g., PMMA or PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a combination thereof.

The third connection wiring CL3 may be located between the first planarization layer 115 and the third planarization layer 117. The third connection wiring CL3 may extend from the intermediate display area MDA to the corner display area CDA. Accordingly, in such an embodiment, a signal or a power voltage applied by a driving circuit located in the intermediate display area MDA may be transmitted through the first connection wiring CL1, the second connection wiring CL2, and the third connection wiring CL3 to the corner display area CDA. The third connection wiring CL3 may include a conductive material including molybdenum (Mo), aluminum (Al), copper (Cu), or titanium (Ti), as the first connection wiring CL1 or the second connection wiring CL2, and may have a single or multi-layer structure including the above material. In an embodiment, the third connection wiring CL3 may have a multi-layer structure including Ti/Al/Ti.

In an embodiment, the second connection electrode CML2 for connecting the second thin-film transistor TFT2 to the second organic light-emitting diode OLED2 may be provided. The second connection electrode CML2 may include a second lower connection electrode CMLa2 and a second upper connection electrode CMLb2. The second lower connection electrode CMLa2 may be located between the first planarization layer 115 and the third planarization layer 117, and may be connected to the second thin-film transistor TFT2 through a contact hole defined in the first planarization layer 115. The second lower connection electrode CMLa2 may include a same material as that of the third connection wiring CL3, and may be formed at the same time as when the third connection wiring CL3 is formed.

The second upper connection electrode CMLb2 may be located between the third planarization layer 117 and the second planarization layer 116. The second upper connection electrode CMLb2 may be connected to the second lower connection electrode CMLa2 through a contact hole defined in the third planarization layer 117. In such an embodiment, the second upper connection electrode CMLb2 may be connected to the second organic light-emitting diode OLED2 through a contact hole formed in the second planarization layer 116. The second upper connection electrode CMLb2 may include a same material as that of the second connection wiring CL2, and may be formed at the same time as when the second connection wiring CL2 is formed.

Figure 12A:
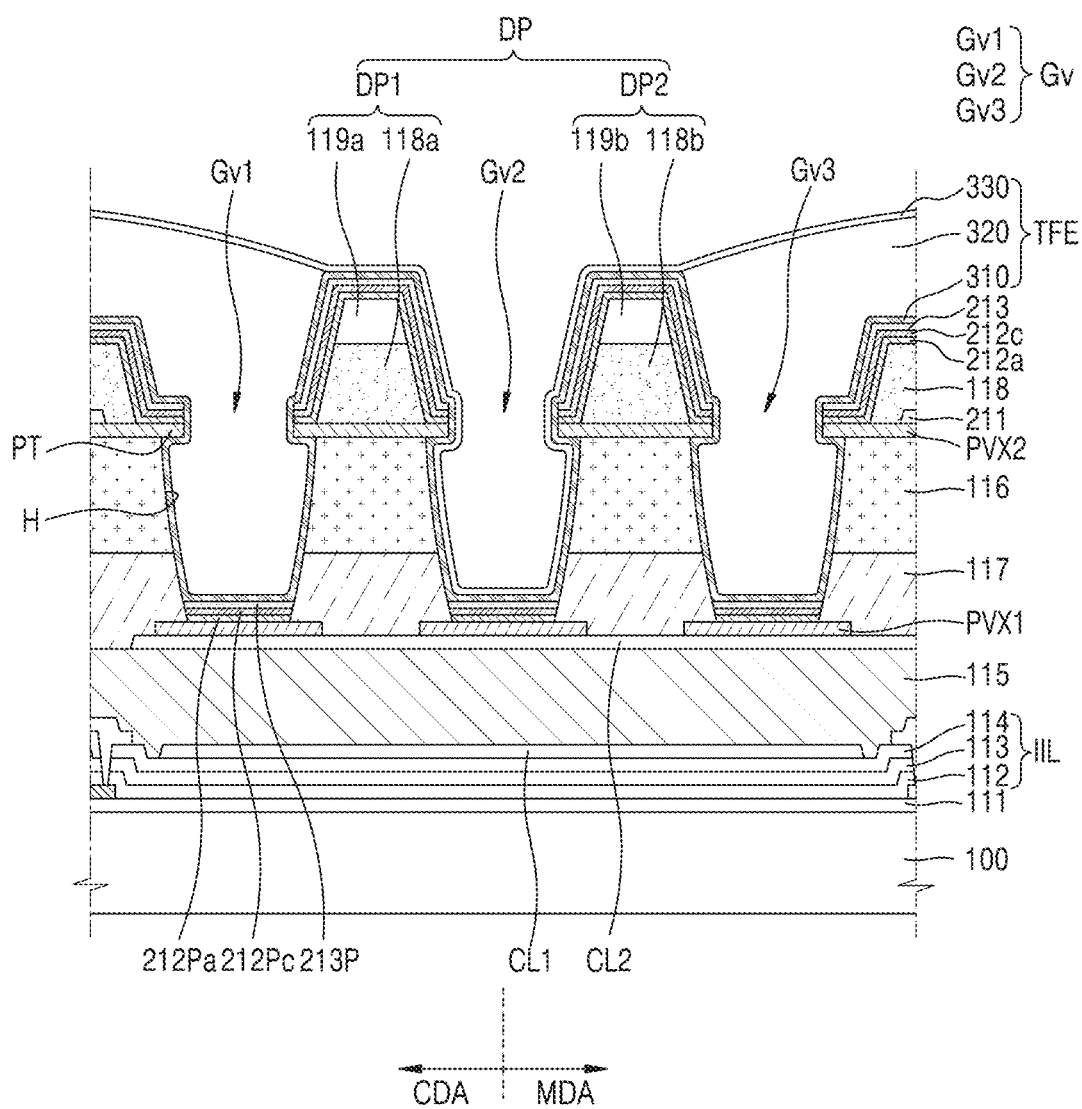
FIGS. 12A, 12B, and 12C are enlarged views illustrating a groove and a dam portion according to various embodiments.
Figure 12B:
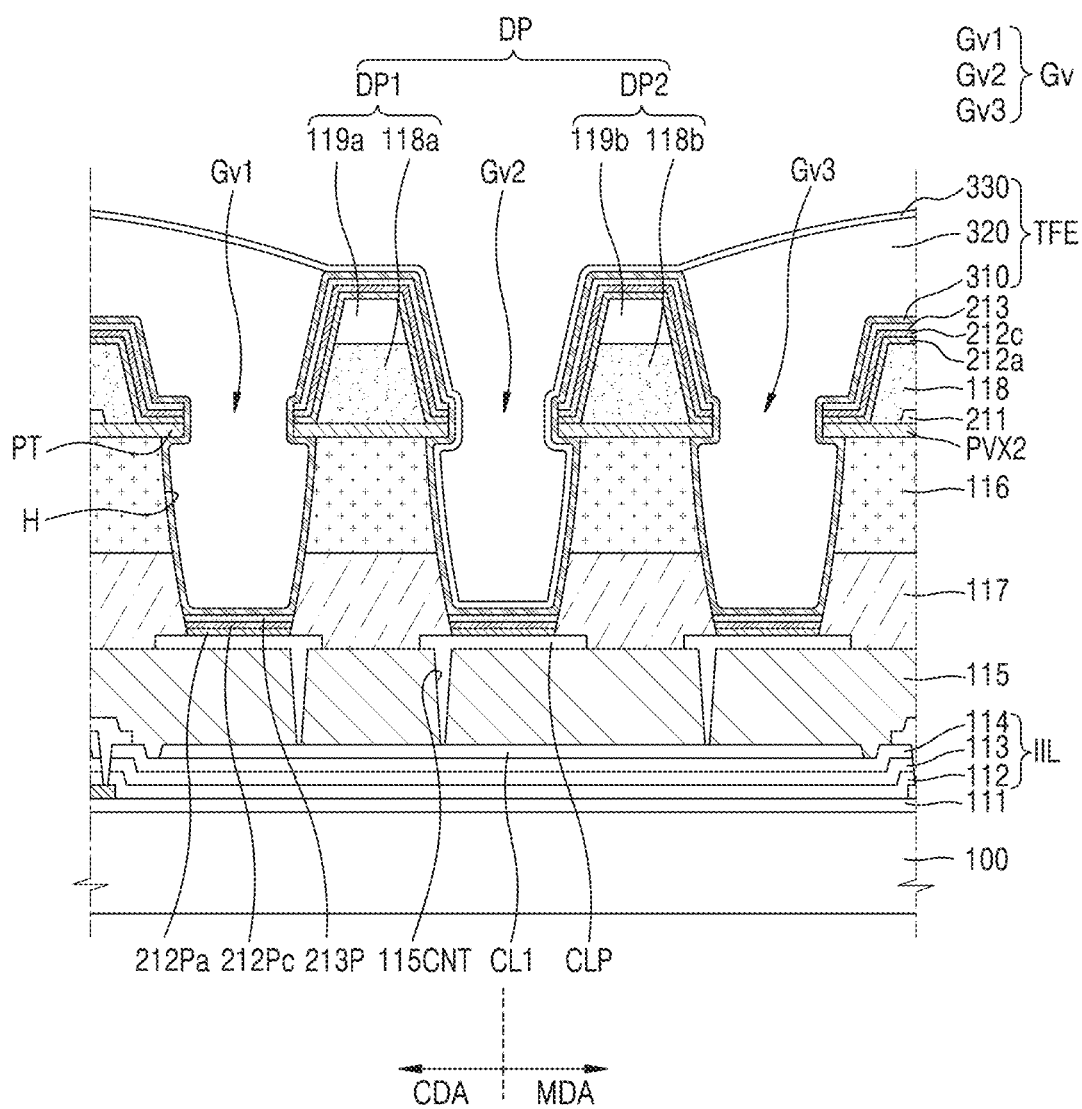
Figure 12C:
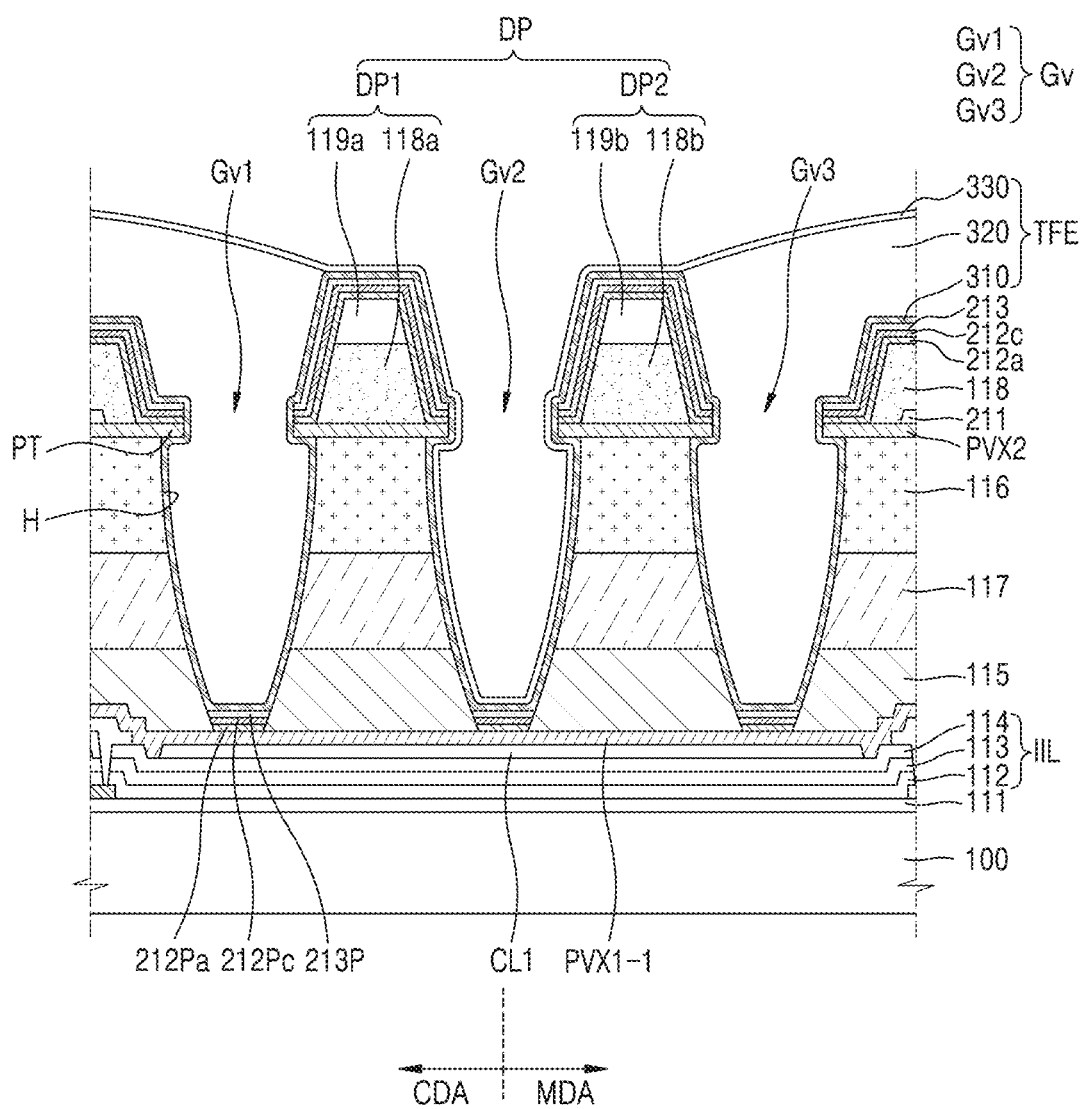

FIGS. 12A, 12B, and 12C are enlarged views illustrating the groove Gv and the dam portion DP according to various embodiments. In FIGS. 12A through 12C, the same elements as those in FIGS. 11A and 11B are denoted by the same reference numerals, and thus any repetitive detailed description thereof will be omitted.

Referring to FIGS. 12A through 12C, an embodiment of a display panel may include the corner display area CDA and the intermediate display area MDA. The corner display area CDA may include the second thin-film transistor TFT2 and the second organic light-emitting diode OLED2 that is a second display element, and the intermediate display area MDA may include the third organic light-emitting diode OLED3 that is a third display element.

In such an embodiment, the display panel may include the groove Gv on the substrate 100, and the groove Gv may be concave in a thickness direction of the substrate 100. In such an embodiment, the groove Gv may be located between the second organic light-emitting diode OLED2 and the third organic light-emitting diode OLED3. The groove Gv may include the first groove Gv1, the second groove Gv2, and the third groove Gv3.

Referring to FIGS. 12A and 12B, in an embodiment, each of the first groove Gv1, the second groove Gv2, and the third groove Gv3 may be the same as or similar to the groove Gv of FIG. 9. In such an embodiment, a lower layer of the first groove Gv1, the second groove Gv2, and the third groove Gv3 may include the third planarization layer 117 and the second planarization layer 116.

Referring to FIG. 12B, in such an embodiment, a metal pattern layer CLP may be located on the first planarization layer 115. In an embodiment, a plurality of metal pattern layers CLP may be located on the first planarization layer 115, and the plurality of metal pattern layers CLP may be spaced apart from one another. In an embodiment, the metal pattern layer CLP may be connected to the first connection wiring CL1 through a contact hole 115CNT of the first planarization layer 115.

The third planarization layer 117 and the second planarization layer 116 may cover an edge of the metal pattern layer CLP. In such an embodiment, the hole H may be defined through the lower layer including the third planarization layer 117 and the second planarization layer 116, and the hole H of the lower layer may expose a central portion of the metal pattern layer CLP. Accordingly, the hole H of the lower layer and a central portion of the metal pattern layer CLP may define the groove Gv.

In such an embodiment, a lower inorganic pattern layer may be omitted, and the metal pattern layer CLP may be formed at the same time as when a connection wiring is formed. Accordingly, a process of manufacturing the display panel may be simplified.

Referring to FIG. 12C, in another alternative embodiment, each of the first groove Gv1, the second groove Gv2, and the third groove Gv3 may be the same as or similar to the groove Gv of FIG. 9. In such an embodiment, a lower layer of the first groove Gv1, the second groove Gv2, and the third groove Gv3 may include the first planarization layer 115, the third planarization layer 117, and the second planarization layer 116.

The lower inorganic layer PVX1-1 may cover the first connection wiring CL1. The lower layer including the first planarization layer 115 and the second planarization layer 116 may be located on the lower inorganic layer PVX1-1. In such an embodiment, the hole H of the lower layer may expose a part of the lower inorganic layer PVX1-1. In such an embodiment, the hole H of the lower layer may be formed by connecting a hole of the first planarization layer 115, a hole of the third planarization layer 117, and a hole of the second planarization layer 116. Accordingly, the groove Gv may be defined by the part of the lower inorganic layer PVX1-1 and the hole H of the lower layer.

Figure 13:
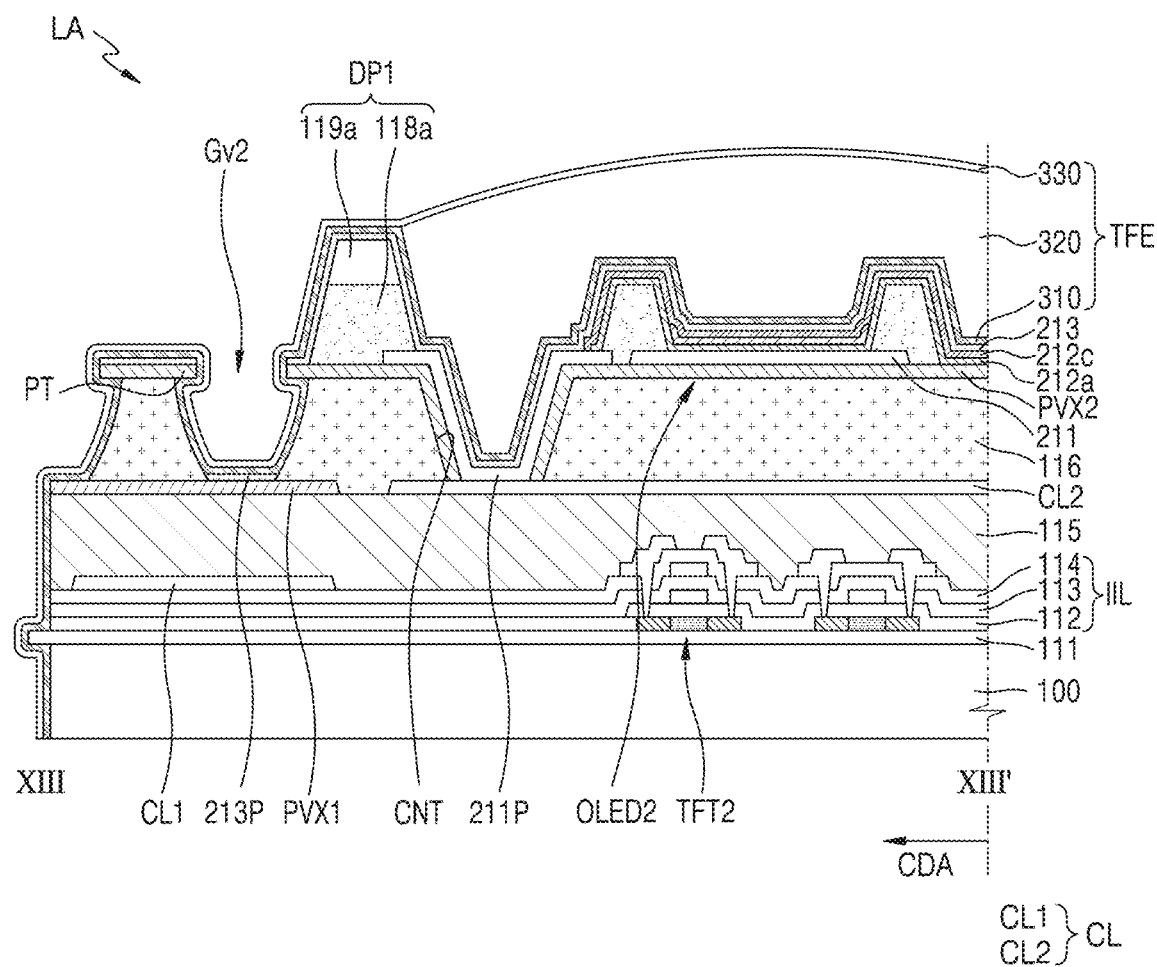
FIG. 13 is a cross-sectional view taken along line XIII-XIII' of FIG. 6A.

FIG. 13 is a cross-sectional view taken along line XIII-XIII' of FIG. 6A. In FIG. 13, the same elements as those in FIGS. 10A and 10B are denoted by the same reference numerals, and thus any repetitive detailed description thereof will be omitted.

Referring to FIG. 13, an embodiment of a display panel may include the corner display area CDA. The corner display area CDA may include a plurality of extension areas LA extending from an intermediate display area, and a through-portion may be provided between adjacent extension areas LA. The second organic light-emitting diode OLED2 and the second thin-film transistor TFT2 may be located in the extension area LA. The second organic light-emitting diode OLED2 of FIG. 13 is an organic light-emitting diode that is farthest from the intermediate display area from among the second organic light-emitting diodes OLED2 located in the extension area LA.

The connection wiring CL may extend from the intermediate display area to the extension areas LA. In one embodiment, for example, the connection wiring CL may include the first connection wiring CL1 and the second connection wiring CL2. In an embodiment, the first connection wiring CL1 may be located between the inorganic insulating layer IIL and the first planarization layer 115, and the second connection wiring CL2 may be located between the first planarization layer 115 and the second planarization layer 116. In an embodiment, the second connection wiring CL2 may supply the second power supply voltage ELVSS (see FIG. 3) to the second organic light-emitting diode OLED2.

In such an embodiment, the contact hole CNT is defined through the second planarization layer 116 to expose at least a part of the second connection wiring CL2. In such an embodiment, the contact hole CNT may be located in an end portion of the extension area LA. In such an embodiment, the contact hole CNT may be located between the second groove Gv2 and the second organic light-emitting diode OLED2 that is farthest from the intermediate display area MDA from among the second organic light-emitting diodes OLED2 located in the extension area LA. In an embodiment, the inorganic pattern layers PVX2 may be spaced apart from each other to correspond to the contact hole CNT of the second planarization layer 116 and expose the second connection wiring CL2.

The second connection wiring CL2 may be connected to the counter electrode 213. In an embodiment, the second connection wiring CL2 and the counter electrode 213 may be connected through a pixel electrode pattern 211P including the same material as that of the pixel electrode 211. The pixel electrode pattern 211P may be spaced apart from the pixel electrode 211 and may be located in the contact hole CNT. In an embodiment, the pixel electrode pattern 211P may be formed at the same time as when the pixel electrode 211 is formed.

In an embodiment, the contact hole CNT of the second planarization layer 116 may be formed in the end portion of the extension area LA. In such an embodiment, the first functional layer 212a and the second functional layer 212c may be spaced apart from the contact hole CNT to expose the contact hole CNT. That is, the first functional layer 212a and the second functional layer 212c may not extend to the contact hole CNT through which the second connection wiring CL2 is exposed. Accordingly, the second connection wiring CL2 and the counter electrode 213 connected through the pixel electrode pattern 211P may maintain a low resistance. That is, a range in which the first functional layer 212a and the second functional layer 212c are formed on an entire surface of the extension area LA may be adjusted or limited so that the first functional layer 212a and the second functional layer 212c are not formed on the end portion of the extension area LA. Also, a range in which the first functional layer 212a and the second functional layer 212c are formed on an entire surface of the extension area LA may be adjusted or limited so that the counter electrode 213 is also formed on the end portion of the extension area LA.

In such an embodiment, the counter electrode pattern 213P inside the second groove Gv2 may contact the lower inorganic pattern layer PVX1 or the first planarization layer 115, and the protruding tips PT of the inorganic pattern layer PVX2 may contact the counter electrode 213.

Figure 14:
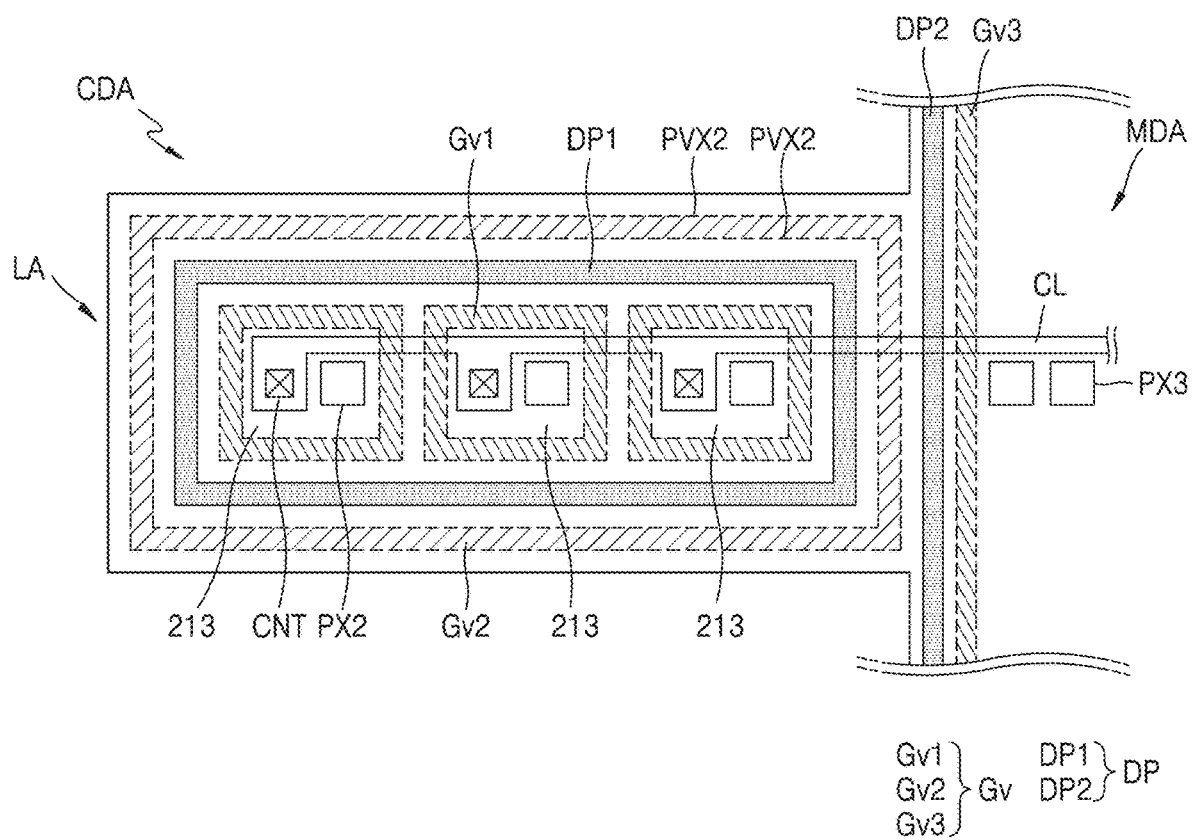
FIG. 14 is a plan view illustrating one of extension areas according to an alternative embodiment.

FIG. 14 is a plan view illustrating one of the extension areas LA according to an alternative embodiment. In FIG. 14, the same elements as those in FIG. 6A are denoted by the same reference numerals, and thus any repetitive detailed description thereof will be omitted.

Referring to FIG. 14, in an embodiment, the corner display area CDA may include a plurality of extension areas LA extending from the intermediate display area MDA, and a through-portion may be provided between adjacent extension areas LA. In such an embodiment, the second pixel PX2 including a second display element may be located in the extension area LA, and the third pixel PX3 including a third display element may be located in the intermediate display area MDA.

In such an embodiment, the display panel may include the groove Gv located on a substrate. The groove Gv may be concave in a thickness direction of the substrate. In such an embodiment, the inorganic pattern layer PVX2 including a pair of protruding tips protruding toward the center of the groove Gv may be located on opposing sides of the groove Gv. In such an embodiment, at least one groove Gv may be located in the extension area LA. In one embodiment, for example, the groove Gv may include the first groove Gv1, the second groove Gv2, and the third groove Gv3.

In an embodiment, the connection wiring CL may extend from the intermediate display area MDA to the extension area LA.

In an embodiment, a plurality of second pixels PX2 may be located in the extension area LA. In such an embodiment, the counter electrodes 213 of second organic light-emitting diodes may be spaced apart from each other, and may each be connected to the connection wiring CL. That is, a plurality of contact holes CNT may be through a planarization layer in the extension area LA. In such an embodiment, the first groove Gv1 and the inorganic pattern layer PVX2 may surround each of the plurality of second pixels PX2.

In an embodiment, where a first functional layer and a second functional layer of an organic light-emitting diode are formed by using a fine metal mask ("FMM"), the first functional layer and the second functional layer may be spaced apart from each other in each organic light-emitting diode. In such an embodiment, the first groove Gv1 and the inorganic pattern layer PVX2 surround each of the plurality of second pixels PX2, such that a counter electrode 213 of the organic light-emitting diode may be separated by the first groove Gv1 and protruding tips of the inorganic pattern layer PVX2. Accordingly, the counter electrodes 213 of the second organic light-emitting diodes may each be connected a connection wiring CL to receive a second power supply voltage.

Figure 15:
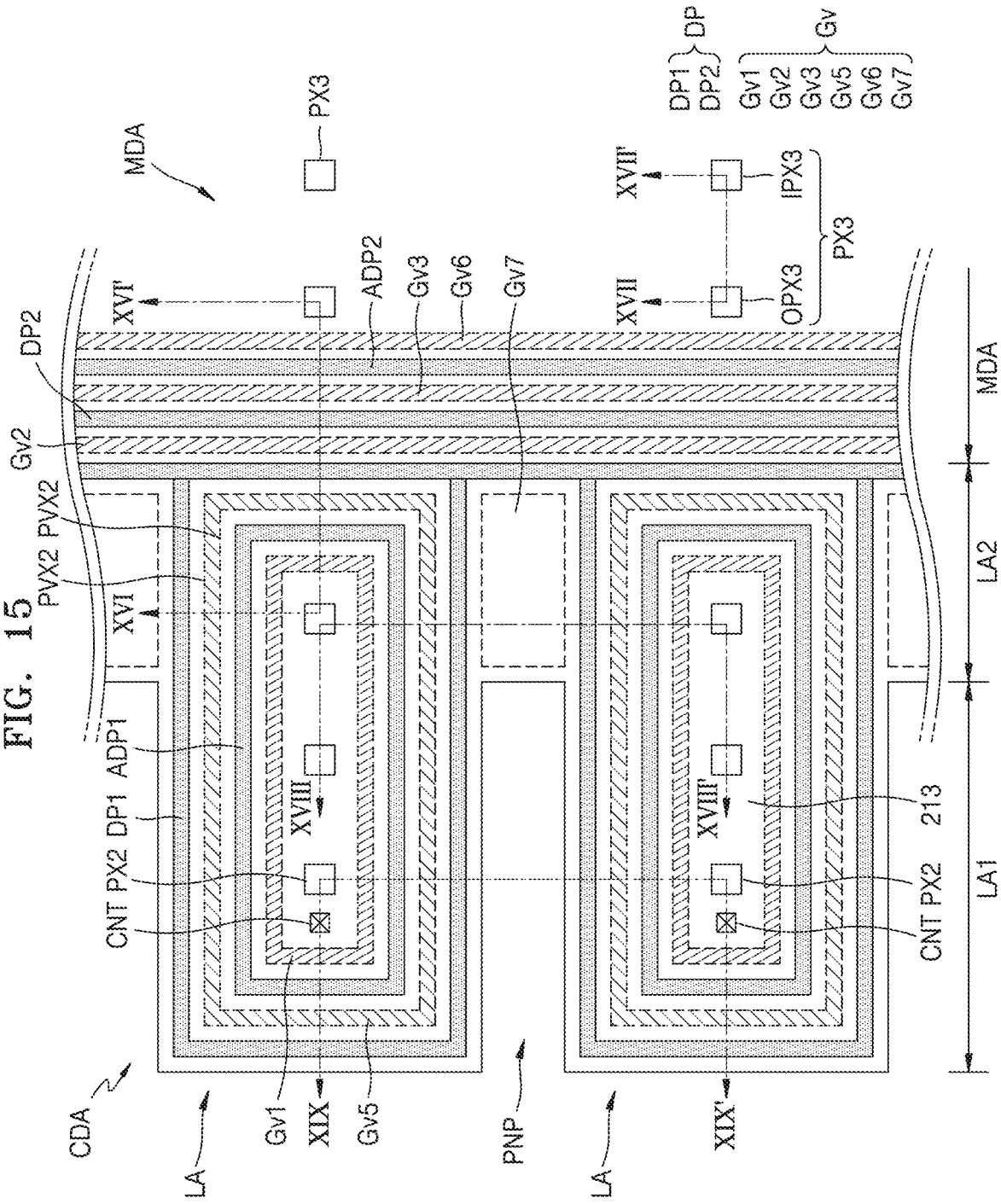
FIG. 15 is a plan view illustrating a corner display area and an intermediate display area according to an embodiment.

FIG. 15 is a plan view illustrating the corner display area CDA and the intermediate display area MDA according to an embodiment. In FIG. 15, the same elements as those in FIG. 6A are denoted by the same reference numerals, and thus any repetitive detailed description thereof will be omitted.

Referring to FIG. 15, in an embodiment, the corner display area CDA may include a plurality of extension areas LA extending from the intermediate display area MDA, and the through-portion PNP may be provided between adjacent extension areas LA. In such an embodiment, the second pixel PX2 including a second display element may be located in the extension area LA, and the third pixel PX3 including a third display element may be located in the intermediate display area MDA.

A plurality of second pixels PX2 may be provided in the extension area LA, and a plurality of third pixels PX3 may be provided in the intermediate display area MDA. In such an embodiment, the second pixels PX2 and the third pixels PX3 may be located parallel to each other in an extension direction of the extension area LA.

The third pixels PX3 may include an inner pixel IPX3 and an outer pixel OPX3. In such an embodiment, the outer pixel OPX3 may face the second pixel PX2. In such an embodiment, the outer pixel OPX3 may be located between the inner pixel IPX3 and the second pixel PX2.

In an embodiment, each of the plurality of extension areas LA may include a first extension area LA1 and a second extension area LA2. In such an embodiment, the second extension area LA2 may be located between the first extension area LA1 and the intermediate display area MDA. In such an embodiment, the second extension areas LA2 of the plurality of extension areas LA may be connected to one another. In one embodiment, for example, the second extension areas LA2 may be integrally formed with one another. Accordingly, the through-portion PNP may be defined by edges of adjacent first extension areas LA1 and an edge of the second extension area LA2.

The groove Gv may be located in the corner display area CDA and the intermediate display area MDA. The groove Gv may be concave in a thickness direction of a substrate. In an embodiment, at least one groove Gv may be located in the extension area LA. The groove Gv may include, for example, the first groove Gv1, the second groove Gv2, the third groove Gv3, a fifth groove Gv5, a sixth groove Gv6, and a seventh groove Gv7.

The first groove Gv1 may be located in the extension area LA. In one embodiment, for example, the first groove Gv1 may surround a plurality of second pixels PX2. Alternatively, the first groove Gv1 may individually surround the second pixel PX2.

The second groove Gv2 may be located between the second pixel PX2 and the third pixel PX3. In an embodiment, the second groove Gv2 may extend in a direction in which the plurality of extension areas LA are spaced apart from one another. In one embodiment, for example, the second groove Gv2 may extend in one direction. Alternatively, the second groove Gv2 may extend along an edge of the intermediate display area MDA.

The third groove Gv3 may be located between the second groove Gv2 and the third pixel PX3. In an embodiment, the third groove Gv3 may extend parallel to the second groove Gv2. In one embodiment, for example, the third groove Gv3 may extend in the direction in which the plurality of extension areas LA are spaced apart from one another.

The fifth groove Gv5 may be located in the extension area LA. In such an embodiment, the fifth groove Gv5 may surround the first groove Gv1. In one embodiment, for example, the fifth groove Gv5 may surround the plurality of second pixels PX2 and the first groove Gv1.

The sixth groove Gv6 may be located between the third groove Gv3 and the third pixel PX3. In an embodiment, the sixth groove Gv6 may extend parallel to the second groove Gv2 and/or the third groove Gv3. In one embodiment, for example, the sixth groove Gv6 may extend in the direction in which the plurality of extension areas LA are spaced apart from one another.

The seventh groove Gv7 may be located in the second extension area LA2. In an embodiment, the seventh groove Gv7 may be located between adjacent first grooves Gv1. In such an embodiment, the seventh groove Gv7 may be located between the first dam portions DP1 of adjacent extension areas LA.

The inorganic pattern layer PVX2 may be located on opposing sides of the groove Gv, and may include a pair of protruding tips protruding toward the center of the groove Gv.

At least one dam portion DP may surround the second pixel PX2. In an embodiment, at least one dam portion DP may surround the second display element. The dam portion DP may include the first dam portion DP1 and the second dam portion DP2.

The first dam portion DP1 may surround the plurality of second pixels PX2. In an embodiment, the first dam portion DP1 may surround the first groove Gv1 and the fifth groove Gv5. In an embodiment, a part of the first dam portion DP1 may extend in the direction in which the plurality of extension areas LA are spaced apart from one another. In one embodiment, for example, the first dam portion DP1 may extend along the edge of the intermediate display area MDA. In such an embodiment, the first dam portion DP1 may be integrally formed as a single unitary unit.

The second dam portion DP2 may be located between the first dam portion DP1 and the third pixel PX3. In an embodiment, the second dam portion DP2 may be located between the second groove Gv2 and the third groove Gv3. In such an embodiment, the second dam portion DP2 may extend in a direction in which the second groove Gv2 and/or the third groove Gv3 extends. The second dam portion DP2 may extend in the direction in which the plurality of extension areas LA are spaced apart from one another.

In an embodiment, a first auxiliary dam portion ADP1 may be located between the second pixel PX2 and the first dam portion DP1. In an embodiment, the first auxiliary dam portion ADP1 may be located between the first groove Gv1 and the fifth groove Gv5. Accordingly, the first auxiliary dam portion ADP1 may surround the second pixel PX2 and the first groove Gv1.

A second auxiliary dam portion ADP2 may be located between the third pixel PX3 and the second dam portion DP2. In an embodiment, the second auxiliary dam portion ADP2 may be located between the third groove Gv3 and the sixth groove Gv6. In such an embodiment, the second auxiliary dam portion ADP2 may extend in a direction in which the third groove Gv3 and/or the sixth groove Gv6 extends. In one embodiment, for example, the second auxiliary dam portion ADP2 may extend in the direction in which the plurality of extension areas LA are spaced apart from one another.

The first auxiliary dam portion ADP1 and the second auxiliary dam portion ADP2 may be located over the inorganic pattern layer PVX2 and may protrude in a thickness direction of the substrate. In such an embodiment, a thickness of the first auxiliary dam portion ADP1 and a thickness of the second auxiliary dam portion ADP2 may each be less than a thickness of the dam portion DP.

Figure 16A:
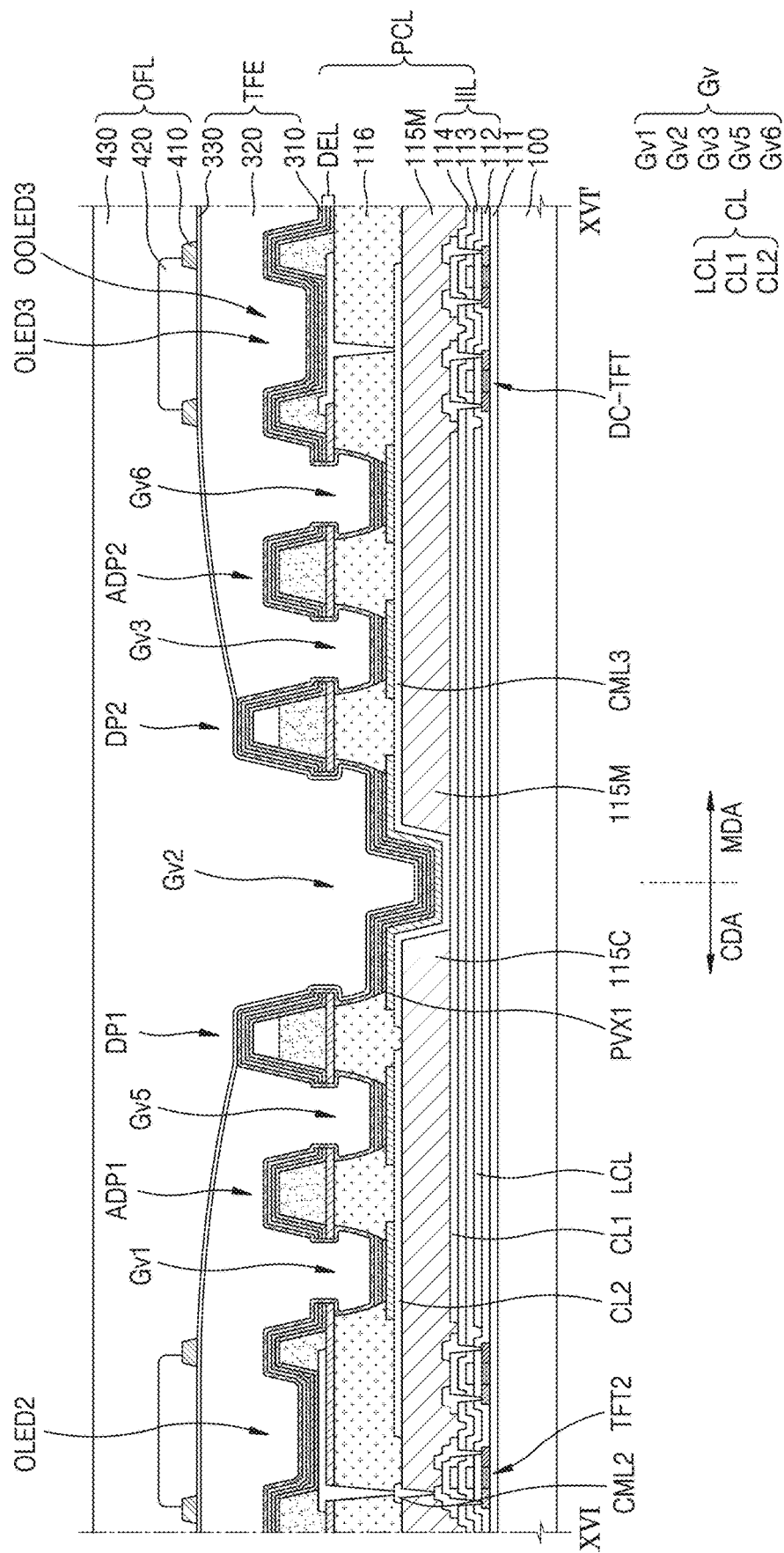
FIG. 16A is a cross-sectional view taken along line XVI-XVI' of FIG. 15.
Figure 16B:
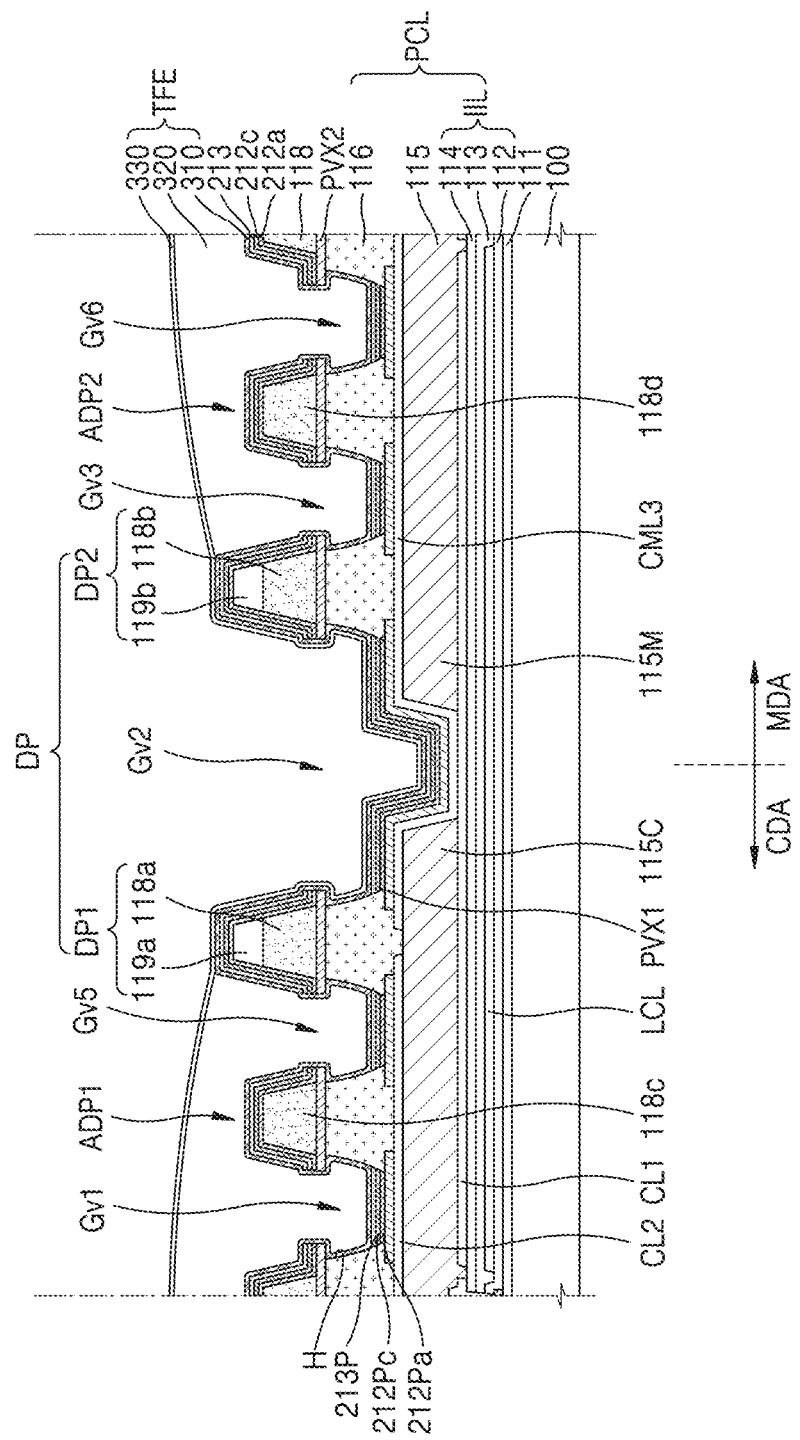
FIG. 16B is an enlarged view illustrating a groove and a dam portion of FIG. 16A.

FIG. 16A is a cross-sectional view taken along line XVI-XVI' of FIG. 15. FIG. 16B is an enlarged view illustrating a groove and a dam portion of FIG. 16A. In FIGS. 16A and 16B, the same elements as those in FIGS. 10A, 10B, and 15 are denoted by the same reference numerals, and thus any repetitive detailed description thereof will be omitted.

Referring to FIGS. 16A and 16B, an embodiment of a display panel may include the corner display area CDA and the intermediate display area MDA. The corner display area CDA may include a second thin-film transistor TFT2 and the second organic light-emitting diode OLED2 that is a second display element, and the intermediate display area MDA may include the third organic light-emitting diode OLED3 that is a third display element. The second thin-film transistor TFT2 and the second organic light-emitting diode OLED2 may constitute a second sub-pixel in the corner display area CDA, and the third organic light-emitting diode OLED3 may constitute a third sub-pixel in the intermediate display area MDA.

An outer (or outermost) organic light-emitting diode OOLED3 of the third organic light-emitting diodes OLED3 may be located closest to an edge of the intermediate display area MDA among the third organic light-emitting diodes OLED3, and may face the second organic light-emitting diode OLED2 in the corner display area CDA.

In an embodiment, the display panel may include the groove Gv on the substrate 100, and the groove Gv may be concave in a thickness direction of the substrate 100. In such an embodiment, the groove Gv may be located between the second organic light-emitting diode OLED2 and the third organic light-emitting diode OLED3. A lower layer of the groove Gv may be the second planarization layer 116.

The substrate 100, the buffer layer 111, the pixel circuit layer PCL, the display element layer DEL, the thin-film encapsulation layer TFE, and an optical functional layer OFL may be stacked in the intermediate display area MDA and the corner display area CDA. The pixel circuit layer PCL may include the inorganic insulating layer IIL, the connection wiring CL, the first planarization layer 115, the second planarization layer 116, and the inorganic pattern layer PVX2. The connection wiring CL may include a lower connection wiring LCL, the first connection wiring CL1, and the second connection wiring CL2.

In an embodiment, the lower connection wiring LCL may be located between the first gate insulating layer 112 and the second gate insulating layer 113. In an alternative embodiment, the lower connection wiring LCL may be located between the second gate insulating layer 113 and the interlayer insulating layer 114. In such an embodiment, the lower connection wiring LCL may include a same material as that of one of the gate electrode GE and the upper electrode CE2 of FIG. 8.

In an alternative embodiment, the lower connection wiring LCL may be located between the buffer layer 111 and the first gate insulating layer 112. In such an embodiment, the lower connection wiring LCL may include a same material as that of the semiconductor layer Act of FIG. 8.

The lower connection wiring LCL may extend from the intermediate display area MDA to the corner display area CDA. The lower connection wiring LCL may be a power wiring for supplying power or a signal line for applying an electrical signal to the second organic light-emitting diode OLED2.

The first connection wiring CL1 may be located on the inorganic insulating layer IIL, and the first planarization layer 115 may be located on the first connection wiring CL1. In an embodiment, the first planarization layer 115 may be separated by the groove Gv into a corner planarization layer 115C and an intermediate planarization layer 115M. In such an embodiment, the first planarization layer 115 may be separated by the second groove Gv2 into the corner planarization layer 115C and the intermediate planarization layer 115M. In such an embodiment, the corner planarization layer 115C may cover the second thin-film transistor TFT2, and the intermediate planarization layer 115M may cover the driving circuit transistor DC-TFT. In an embodiment, the corner planarization layer 115C and the intermediate planarization layer 115M may expose a part of the first connection wiring CL1.

The second connection wiring CL2, the second connection electrode CML2, and the third connection electrode CML3 may be located on the first planarization layer 115. In such an embodiment, the second connection electrode CML2 may be located on the corner planarization layer 115C. In such an embodiment, the third connection electrode CML3 may be defined by a part of the second connection wiring CL2.

The third connection electrode CML3 may be located on the intermediate planarization layer 115M. In an embodiment, the third connection electrode CML3 may be connected to the first connection wiring CL1. In such an embodiment, the third connection electrode CML3 may extend from the intermediate planarization layer 115M to the corner planarization layer 115C, and may cover a side surface of the intermediate planarization layer 115M and a side surface of the corner planarization layer 115C which face each other. In such an embodiment, the third connection electrode CML3 may be connected to the first connection wiring CL1 exposed between the corner planarization layer 115C and the intermediate planarization layer 115M. Accordingly, the first connection wiring CL1 and the third connection electrode CML3 may effectively prevent external moisture from penetrating into the second organic light-emitting diode OLED2 or the third organic light-emitting diode OLED3.

The lower inorganic pattern layer PVX1 may be located on the second connection wiring CL2 and the third connection electrode CML3. In an embodiment, a plurality of lower inorganic pattern layers PVX1 may be located on the second connection wiring CL2 and/or the third connection electrode CML3, and the plurality of lower inorganic pattern layers PVX1 may be spaced apart from one another on the second connection wiring CL2 and/or the third connection electrode CML3. In such an embodiment, one of the plurality of lower inorganic pattern layers PVX1 may cover a side surface of the intermediate planarization layer 115M and a side surface of the corner planarization layer 115C which face each other.

The second planarization layer 116 may cover the second connection wiring CL2, the second connection electrode CML2, and the third connection electrode CML3. In an embodiment, the second planarization layer 116 may be a lower layer for defining the groove Gv. In such an embodiment, the hole H may be defined through the second planarization layer 116, and the hole H may correspond to the lower inorganic pattern layer PVX1. In such an embodiment, the second planarization layer 116 may cover an edge of the lower inorganic pattern layer PVX1. Accordingly, the groove Gv may be defined by a central portion of the lower inorganic pattern layer PVX1 and the hole H of the second planarization layer 116.

The inorganic pattern layer PVX2 may be located on the second planarization layer 116. In such an embodiment, the inorganic pattern layer PVX2 may be located on opposing sides of the groove Gv, and may include a pair of protruding tips PT protruding toward the center of the groove Gv.

The first functional layer 212a, the second functional layer 212c, and the counter electrode 213 located on the inorganic pattern layer PVX2 may be separated by the groove Gv and the protruding tips PT. In such an embodiment, the first functional layer pattern 212Pa, the second functional layer pattern 212Pc, and the counter electrode pattern 213P may be located in the groove Gv.

The dam portion DP protruding in the thickness direction of the substrate 100 may be provided over the inorganic pattern layer PVX2. In an embodiment, the dam portion DP may include the first dam portion DP1 and the second dam portion DP2 that are spaced apart from each other.

In an embodiment, the first auxiliary dam portion ADP1 may be located between the second organic light-emitting diode OLED2 and the first dam portion DP1. In such an embodiment, the first auxiliary dam portion ADP1 may be located between the first groove Gv1 and the fifth groove Gv5. In an embodiment, the second auxiliary dam portion ADP2 may be located between the third organic light-emitting diode OLED3 and the second dam portion DP2. In such an embodiment, the second auxiliary dam portion ADP2 may be located between the third groove Gv3 and the sixth groove Gv6.

The first auxiliary dam portion ADP1 and the second auxiliary dam portion ADP2 may be located over the inorganic pattern layer PVX2 and may protrude in the thickness direction of the substrate 100. In such an embodiment, the first auxiliary dam portion ADP1 and the second auxiliary dam portion ADP2 may respectively include first layers 118c and 118d. In such an embodiment, each of the first layers 118c and 118d may include a same material as that of the pixel-defining film 118.

In an embodiment, a thickness of the dam portion DP may be greater than a thickness of the first auxiliary dam portion ADP1. In such an embodiment, a thickness of the dam portion DP may be greater than a thickness of the second auxiliary dam portion ADP2. In such an embodiment, because the first and second dam portions DP1 and DP2 of the dam portion DP include the first layers 118a and 118b and the second layers 119a and 119b, and the first auxiliary dam portion ADP1 and the second auxiliary dam portion ADP2 include the first layers 118c and 118d, a thickness of the dam portion DP and a thickness of the first auxiliary dam portion ADP1 and the second auxiliary dam portion ADP2 may be different from each other. In such an embodiment, the thickness of the dam portion DP may be a distance from a top surface of the inorganic pattern layer PVX2 to top surfaces of the second layers 119a and 119b. In such an embodiment, the thickness of the first auxiliary dam portion ADP1 or the thickness of the second auxiliary dam portion ADP2 may be a distance from the top surface of the inorganic pattern layer PVX2 to top surfaces of the first layers 118c and 118d.

In an embodiment, a distance from a top surface of the substrate 100 to the top surfaces of the second layers 119a and 119b may be greater than a distance from the top surface of the substrate 100 to the top surface of the first layer 118c of the first auxiliary dam portion ADP1. In such an embodiment, a distance from the top surface of the substrate 100 to the top surfaces of the second layers 119a and 119b may be greater than a distance from the top surface of the substrate 100 to the top surface of the first layer 118d of the second auxiliary dam portion ADP2.

In an embodiment, the second layers 119a and 119b of the dam portion DP may perform a function similar to that of the spacer 119 of FIG. 8. In one embodiment of a method of manufacturing the display panel, for example, the second layers 119a and 119b of the dam portion DP may prevent damage to at least one of the pixel circuit layer PCL and the display element layer DEL due to a mask sheet. In such an embodiment, the second layers 119a and 119b of the dam portion DP may contact the mask sheet and shapes of the second layers 119a and 119b of the dam portion DP may be deformed.

IF the shapes of the second layers 119a and 119b of the dam portion DP are deformed, the first inorganic encapsulation layer 310 may be formed along the deformed shapes of the second layers 119a and 119b of the dam portion DP, thereby degrading barrier characteristics.

In an embodiment, the first auxiliary dam portion ADP1 and the second auxiliary dam portion ADP2 may be located between the organic light-emitting diode and the dam portion DP. In such an embodiment, a thickness of the first auxiliary dam portion ADP1 and a thickness of the second auxiliary dam portion ADP2 are each less than a thickness of the dam portion DP, such that the first auxiliary dam portion ADP1 and the second auxiliary dam portion ADP2 may not contact the mask sheet. Accordingly, the first inorganic encapsulation layer 310 may be formed on a top surface of the first auxiliary dam portion ADP1 and a top surface of the second auxiliary dam portion ADP2 which are flat without being deformed. Accordingly, a time taken for external air or moisture to reach the organic light-emitting diode may be delayed. Accordingly, the barrier characteristics of the first inorganic encapsulation layer 310 may be improved.

The optical functional layer OFL may be located on the thin-film encapsulation layer TFE. In an embodiment, the optical functional layer OFL may include a light-shielding pattern 410, a color filter 420, and an overcoat layer 430. The light-shielding pattern 410 may prevent quality degradation due to external light by at least partially absorbing external light or internal reflected light. The light-shielding pattern 410 may include a black pigment.

The color filter 420 may include a color filter corresponding to each organic light-emitting diode. In one embodiment, for example, when an emission layer of the organic light-emitting diode emits blue light, green light, or red light, the color filter 420 may include a blue color filter, a green color filter, or a red color filter according to a color of light emitted by the emission layer of each organic light-emitting diode.

In one embodiment, for example, when the emission layer of the organic light-emitting diode emits red light, the color filter 420 on the emission layer of the organic light-emitting diode may be a red color filter having a high transmittance in a red wavelength band.

The overcoat layer 430 may be located on the light-shielding pattern 410 and the color filter 420. The overcoat layer 430 may be integrally formed in the corner display area CDA and the intermediate display area MDA. In an embodiment, the overcoat layer 430 may be located in the second groove Gv2, and may fill the second groove Gv2. A top surface of the overcoat layer 430 may be substantially flat, and the overcoat layer 430 may include an organic material such as acryl, benzocyclobutene ("BOB"), or hexamethyldisiloxane ("HMDSO").

In an embodiment, an input sensing layer may be located between the optical functional layer OFL and the thin-film encapsulation layer TFE.

Figure 17:
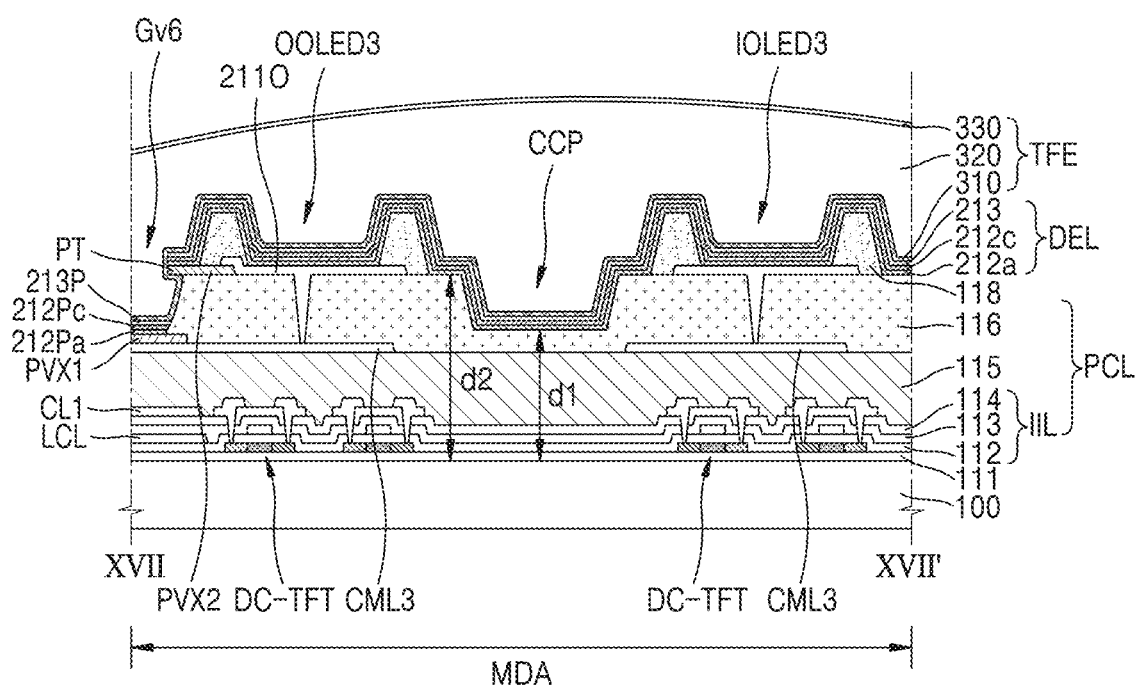
FIG. 17 is a cross-sectional view taken along line XVII-XVII' of FIG. 15.

FIG. 17 is a cross-sectional view taken along line XVII-XVII' of FIG. 15. In FIG. 17, the same elements as those in FIG. 16 are denoted by the same reference numerals, and thus any repetitive detailed description thereof will be omitted.

Referring to FIG. 17, in an embodiment, the driving circuit transistor DC-TFT may be located on the substrate 100 in the intermediate display area MDA, and the first planarization layer 115 and the second planarization layer 116 may cover the driving circuit transistor DC-TFT. An inner organic light-emitting diode IOLED3 and the outer organic light-emitting diode OOLED3 may be located on the second planarization layer 116. In such an embodiment, the outer organic light-emitting diode OOLED3 may be located between the sixth groove Gv6 and the inner organic light-emitting diode IOLED3. The thin-film encapsulation layer TFE may be located on the outer organic light-emitting diode OOLED3 and the inner organic light-emitting diode IOLED3.

In an embodiment, the second planarization layer 116 may include a concave portion (or recessed portion) CCP between the inner organic light-emitting diode IOLED3 and the outer organic light-emitting diode OOLED3. In such an embodiment, the concave portion CCP may be defined by a top surface of the second planarization layer 116 and side surfaces of the second planarization layer 116 which face each other between the inner organic light-emitting diode IOLED3 and the outer organic light-emitting diode OOLED3.

In an embodiment, a first distance d1 from a top surface of the substrate 100 to a top surface of the second planarization layer 116 may be defined between the inner organic light-emitting diode IOLED3 and the outer organic light-emitting diode OOLED3, and a second distance d2 from the top surface of the substrate 100 to a top surface of the second planarization layer 116 facing the pixel-defining film 118 may be defined between the inner organic light-emitting diode IOLED3 and the outer organic light-emitting diode OOLED3. In such an embodiment, the first distance d1 may be less than the second distance d2.

The concave portion CCP may be formed by using a halftone mask when the second planarization layer 116 is formed.

In an embodiment, the second planarization layer 116 may include the concave portion CCP between the inner organic light-emitting diode IOLED3 and the outer organic light-emitting diode OOLED3. Accordingly, when the organic encapsulation layer 320 of the thin-film encapsulation layer TFE is formed, a reflow of an organic material for forming the organic encapsulation layer 320 may be controlled. In such an embodiment, because the concave portion CCP is provided between the inner organic light-emitting diode IOLED3 and the outer organic light-emitting diode OOLED3, a top surface of the organic encapsulation layer 320 may be flat. In such an embodiment, the concave portion CCP may prevent or reduce the organic material for forming the organic encapsulation layer 320 from overflowing beyond the second dam portion DP2 of FIG. 16A.

The inorganic pattern layer PVX2 may be located on the second planarization layer 116. The inorganic pattern layer PVX2 may be located on opposing sides of the sixth groove Gv6. In such an embodiment, the inorganic pattern layer PVX2 may be located between the sixth groove Gv6 and the outer organic light-emitting diode OOLED3 in the intermediate display area MDA.

In an embodiment, at least a part of the inorganic pattern layer PVX2 may overlap an outer pixel electrode 2110 of the outer organic light-emitting diode OOLED3. In such an embodiment, the outer pixel electrode 2110 may include a stepped portion.

Figure 18:
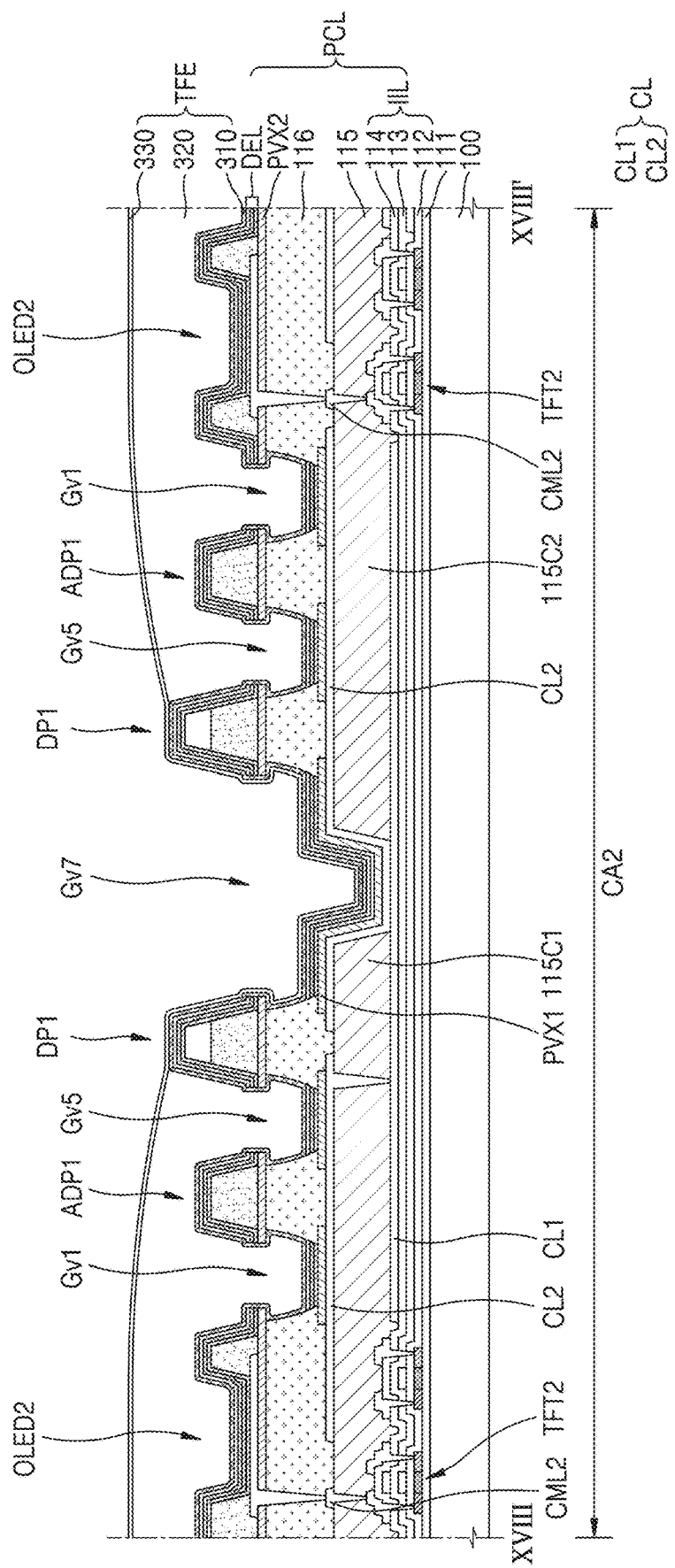
FIG. 18 is a cross-sectional view taken along line XVIII-XVIII' of FIG. 15.
Figure 19:
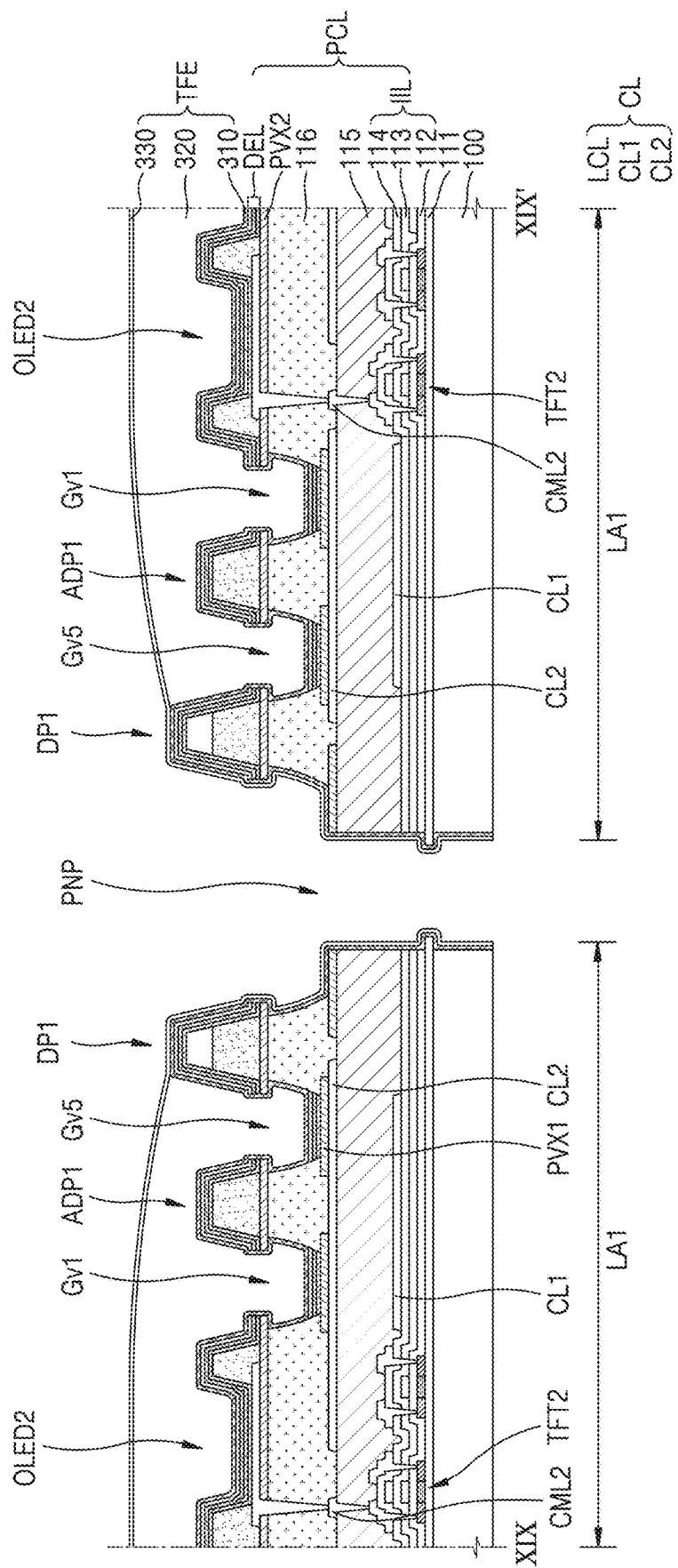
FIG. 19 is a cross-sectional view taken along line XIX-XIX' of FIG. 15.

FIG. 18 is a cross-sectional view taken along line XVIII-XVIII' of FIG. 15. FIG. 19 is a cross-sectional view taken along line XIX-XIX' of FIG. 15. In FIGS. 18 and 19, the same elements as those in FIGS. 15 and 16 are denoted by the same reference numerals, and thus any repetitive detailed description thereof will be omitted.

Referring to FIGS. 18 and 19, in an embodiment, a corner display area may include a plurality of extension areas extending from an intermediate display area, and the through-portion PNP may be provided between adjacent extension areas. The second organic light-emitting diodes OLED2 may be located in the extension area. Each of the plurality of extension areas include the first extension area LA1 and the second extension area LA2, and the second extension areas LA2 may be integrally formed with one another by being connected to each other. Accordingly, the through-portion PNP may be defined by edges of adjacent first extension areas LA1.

Referring to FIG. 18, the pixel circuit layer PCL, the display element layer DEL, and the thin-film encapsulation layer TFE may be located in the second extension area LA2. The pixel circuit layer PCL may include the second thin-film transistor TFT2, the first connection wiring CL1, the second connection wiring CL2, the inorganic insulating layer IIL, the first planarization layer 115, and the second planarization layer 116. The display element layer DEL may include the second organic light-emitting diode OLED2.

The first groove Gv1, the fifth groove Gv5, and the seventh groove Gv7 may be located in the second extension area LA2. In such an embodiment, the first auxiliary dam portion ADP1 may be located between the first groove Gv1 and the fifth groove Gv5, and the first dam portion DP1 may be located between the fifth groove Gv5 and the seventh groove Gv7.

In an embodiment, the substrate 100 and the inorganic insulating layer IIL may be continuously located. In an embodiment, the first planarization layer 115 may be separated by the seventh groove Gv7. In one embodiment, for example, the first planarization layer 115 may be separated by the seventh groove Gv7 into a first corner planarization layer 115C1 and a second corner planarization layer 115C2. In an embodiment, the inorganic insulating layer IIL may also be separated by the seventh groove Gv7.

The second connection wiring CL2 and the second connection electrode CML2 may be located on the first planarization layer 115. In an embodiment, the second connection electrode CML2 may be defined by a part of the second connection wiring CL2.

In an embodiment, the second connection wiring CL2 may cover the first corner planarization layer 115C1 and the second corner planarization layer 115C2. In one embodiment, for example, the second connection wiring CL2 may cover a side surface of the first corner planarization layer 115C1 and a side surface of the second corner planarization layer 115C2 which face each other. The second connection wiring CL2 may be connected to the first connection wiring CL1 exposed between the first corner planarization layer 115C1 and the second corner planarization layer 115C2. Accordingly, the first connection wiring CL1 and the second connection wiring CL2 may prevent external moisture from penetrating into the second organic light-emitting diode OLED2.

The lower inorganic pattern layer PVX1 may be located on the second connection wiring CL2. A plurality of lower inorganic pattern layer PVX1 may be located on the second connection wiring CL2, and the plurality of lower inorganic pattern layers PVX1 may be spaced apart from one another on the second connection wiring CL2. In an embodiment, one of the plurality of lower inorganic pattern layers PVX1 may cover a side surface of the first corner planarization layer 115C1 and a side surface of the second corner planarization layer 115C2 which face each other.

In an embodiment, the organic encapsulation layer 320 may be separated by the first dam portion DP1 and the seventh groove Gv7.

Referring to FIG. 19, the pixel circuit layer PCL, the display element layer DEL, and the thin-film encapsulation layer TFE may be located in the first extension area LA1. The pixel circuit layer PCL may include the second thin-film transistor TFT2, the first connection wiring CL1, the second connection wiring CL2, the inorganic insulating layer IIL, the first planarization layer 115, and the second planarization layer 116. The display element layer DEL may include the second organic light-emitting diode OLED2.

Each of the first groove Gv1 and the fifth groove Gv5 may be located in the first extension areas LA1. IN such an embodiment, the first auxiliary dam portion ADP1 may be located between the first groove Gv1 and the fifth groove Gv5, and the first dam portion DP1 may be located between the fifth groove Gv5 and the through-portion PNP.

In an embodiment, the substrate 100, the inorganic insulating layer IIL, the first planarization layer 115, the second planarization layer 116, and the thin-film encapsulation layer TFE may be separated by the through-portion PNP.

Figure 20A:
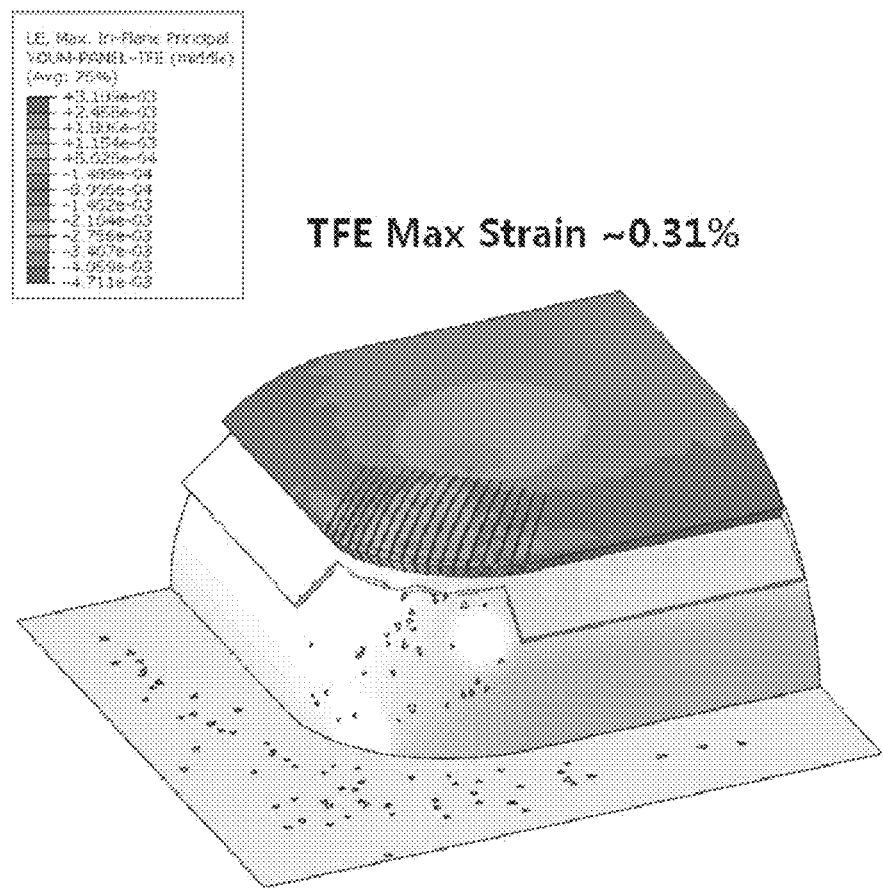
FIG. 20A illustrates a simulation result regarding the deformation of a thin-film encapsulation layer when a corner display area includes a plurality of extension areas.
Figure 20B:
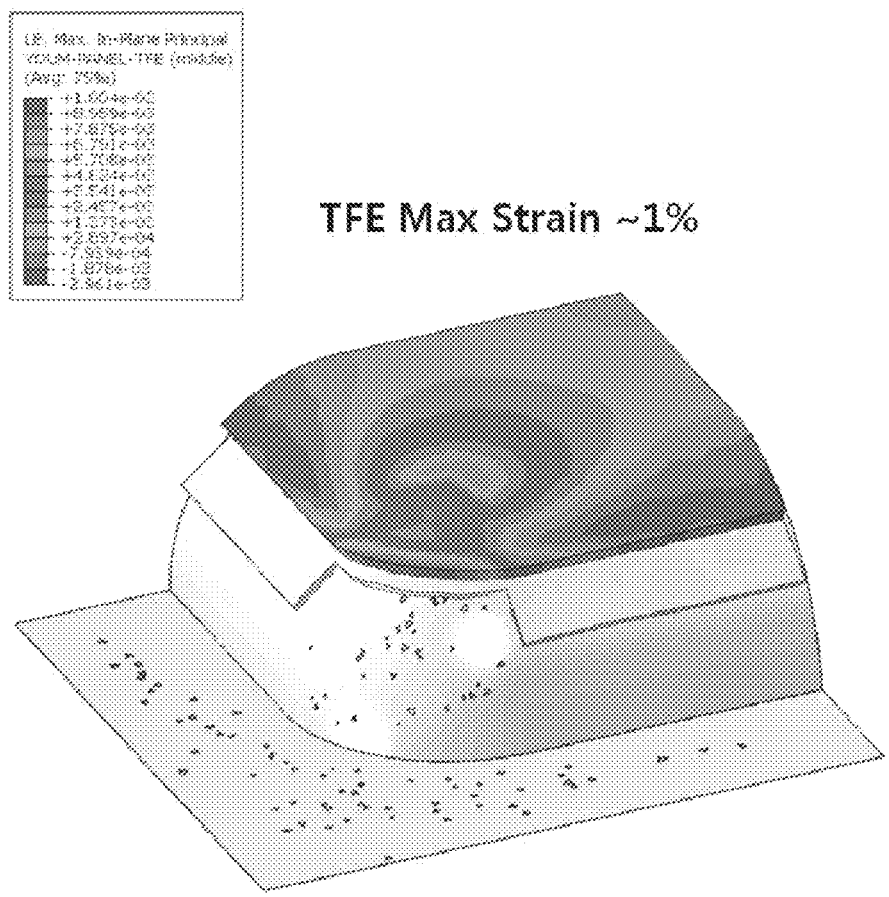
FIG. 20B illustrates a simulation result regarding the deformation of a thin-film encapsulation layer when a corner display area is integrally formed.

FIG. 20A illustrates a simulation result regarding the deformation of a thin-film encapsulation layer when a corner display area includes a plurality of extension areas. FIG. 20B illustrates a simulation result regarding the deformation of a thin-film encapsulation layer when a corner display area is integrally formed.

When a maximum strain of a thin-film encapsulation layer in a state where a corner display area is bent is equal to or less than 0.7%, the stability of a display element may be ensured.

Referring to FIG. 20A, it is found that, when a corner display area includes a plurality of extension areas, a maximum strain of a thin-film encapsulation layer when the corner display area is bent is 0.31%.

Referring to FIG. 20B, it is found that, when a corner display area is integrally formed, a maximum strain of a thin-film encapsulation layer when the corner display area is bent is 1%.

Accordingly, in an embodiment of the invention where a corner display area includes a plurality of extension areas, the stability of a display element located in the plurality of extension areas may be ensured.

Figure 21B:
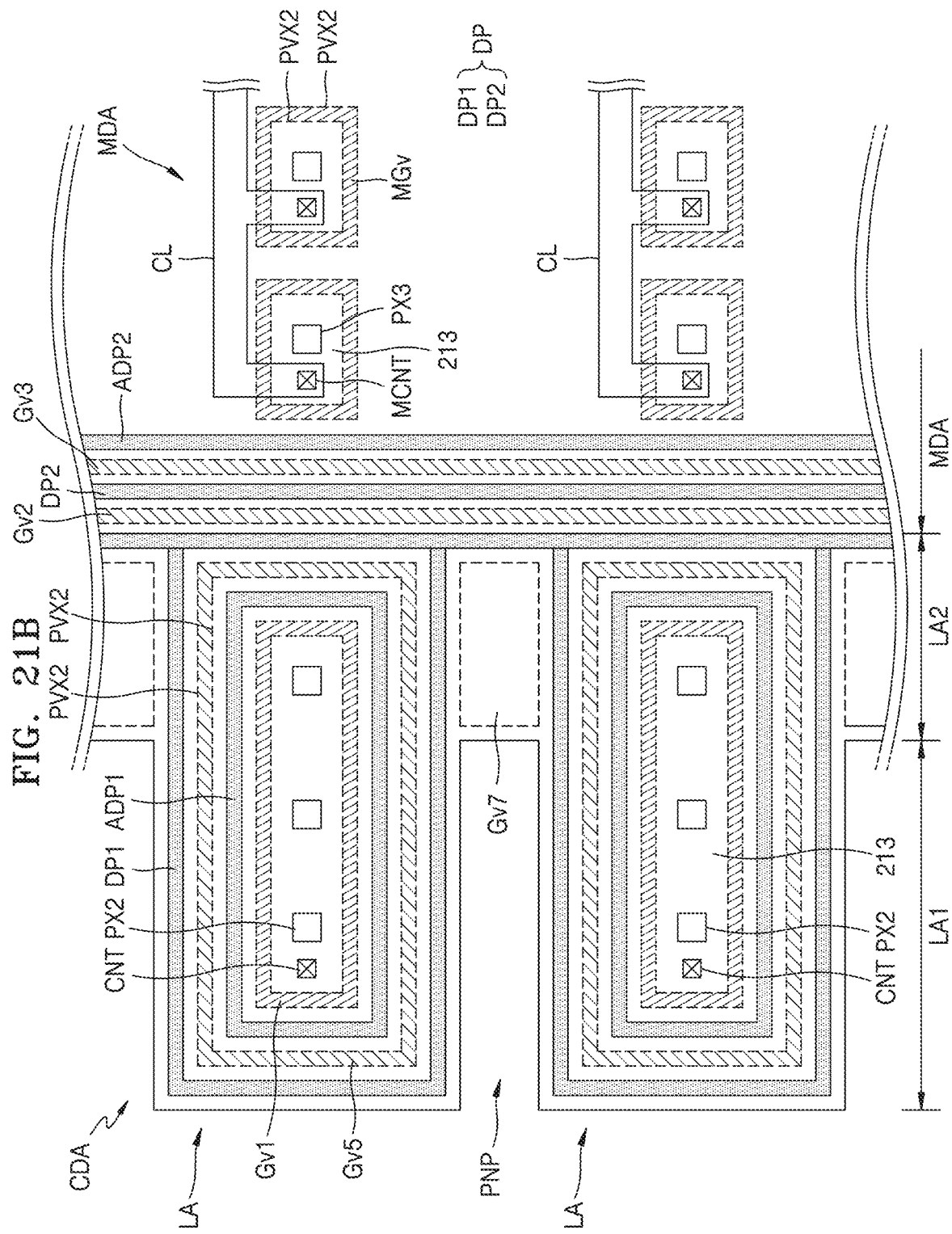

FIGS. 21A and 21B are plan views each illustrating the corner display area CDA and the intermediate display area MDA according to an alternative embodiment. In FIGS. 21A and 21B, the same elements as those in FIG. 15 are denoted by the same reference numerals, and thus any repetitive detailed description thereof will be omitted. An embodiment of FIGS. 21A and 21B is substantially the same as an embodiment of FIG. 15 except that an intermediate groove MGv is provided in the intermediate display area.

Referring to FIG. 21A, in an embodiment, the corner display area CDA may include the plurality of extension areas LA extending from the intermediate display area MDA, and the through-portion PNP may be provided between adjacent extension areas LA. In such an embodiment, the second pixel PX2 including a second display element may be located in the extension area LA, and the third pixel PX3 including a third display element may be located in the intermediate display area MDA.

In an embodiment, the intermediate display area MDA may include a first intermediate display area MDA1 and a second intermediate display area MDA2. In such an embodiment, the second intermediate display area MDA2 may be located between the first intermediate display area MDA1 and the corner display area CDA.

The intermediate groove MGv may be located between the first intermediate display area MDA1 and the second intermediate display area MDA2. The intermediate display area MDA may be separated by the intermediate groove MGv into the first intermediate display area MDA1 and the second intermediate display area MDA2. The intermediate groove MGv may be the same as or similar to the groove Gv of FIG. 9.

The intermediate groove MGv may extend in a direction in which the plurality of extension areas LA are spaced apart from one another. In one embodiment, for example, the intermediate groove MGv may extend in one direction. Alternatively, the intermediate groove MGv may extend along an edge of the intermediate display area MDA.

In an embodiment, the inorganic pattern layer PVX2 may be located on opposing sides of the intermediate groove MGv, and may include a pair of protruding tips protruding toward the center of the intermediate groove MGv. Accordingly, the counter electrode 213 formed in the intermediate display area MDA may be separated by the intermediate groove MGv and the inorganic pattern layer PVX2. In one embodiment, for example, a first counter electrode 213A may be located in the first intermediate display area MDA1, and a second counter electrode 213B may be located in the second intermediate display area MDA2.

In an embodiment, a first contact hole CNT1 and a second contact hole CNT2 may be defined through at least one of multiple layers stacked in the intermediate display area MDA to respectively correspond to the first intermediate display area MDA1 and the second intermediate display area MDA2.

The third pixels PX3 located in the first intermediate display area MDA1 may be connected to the connection wiring CL through the first contact hole CNT1 to receive a second power supply voltage. In an embodiment, the first counter electrode 213A located in the first intermediate display area MDA1 may be connected through the first contact hole CNT1 to the connection wiring CL. In an embodiment, the third pixels PX3 located in the second intermediate display area MDA2 may be connected to the connection wiring CL through the second contact hole CNT2 to receive a second power supply voltage. In such an embodiment, the second counter electrode 213B located in the second intermediate display area MDA2 may be connected through the second contact hole CNT2 to the connection wiring CL.

Referring to FIG. 21B, in an alternative embodiment, the corner display area CDA may include the plurality of extension areas LA extending from the intermediate display area MDA, and the through-portion PNP may be provided between adjacent extension areas LA. In such an embodiment, the second pixel PX2 including a second display element may be located in the extension area LA, and the third pixel PX3 including a third display element may be located in the intermediate display area MDA.

In an embodiment, a plurality of third pixels PX3 may be provided in the intermediate display area MDA. In such an embodiment, the intermediate groove MGv may surround each of the plurality of third pixels PX3. In such an embodiment, the inorganic pattern layer PVX2 may be located on opposing sides of the intermediate groove MGv, and may include a pair of protruding tips protruding toward the center of the intermediate groove MGv. Accordingly, the counter electrodes 213 formed in the intermediate display area MDA may be spaced apart from one another to respectively correspond to the plurality of third pixels PX3.

In an embodiment, an intermediate contact hole MCNT may be defined through at least one of multiple layers stacked in the intermediate display area MDA to correspond to each of the plurality of third pixels PX3. In such an embodiment, each of the plurality of third pixels PX3 located in the intermediate display area MDA may be connected to a connection wiring through the intermediate contact hole MCNT to receive a second power supply voltage. In such an embodiment, each of the counter electrodes 213 located in the intermediate display area MDA may be connected to the connection wiring through the intermediate contact hole MCNT.

Figure 22:
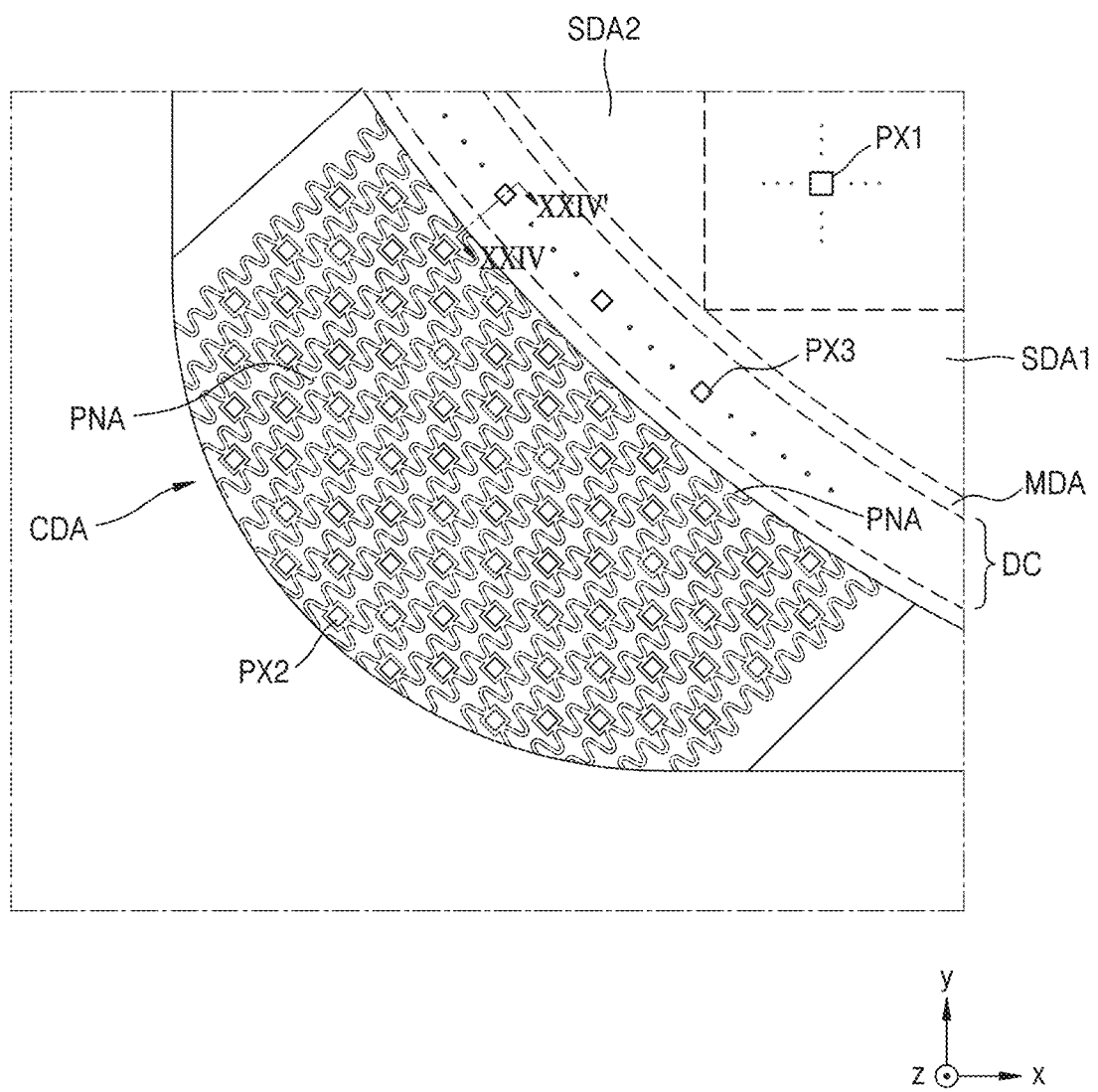
FIG. 22 is an enlarged view illustrating a part of a display panel according to an alternative embodiment.
Figure 23:
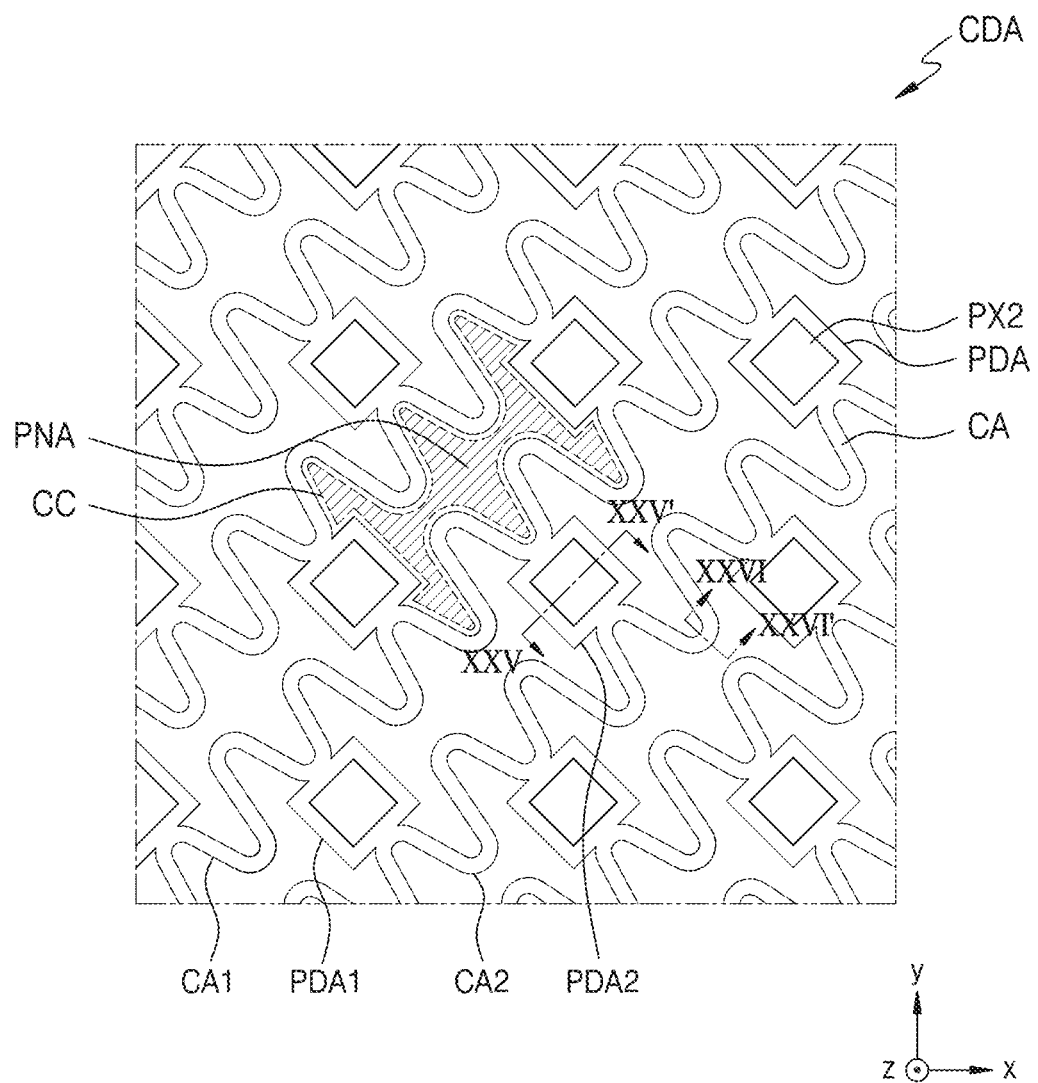
FIG. 23 is a plan view illustrating a corner display area according to an alternative embodiment.

FIG. 22 is an enlarged view illustrating a part of a display panel according to an alternative embodiment. FIG. 23 is a plan view illustrating the corner display area CDA according to another embodiment. In FIG. 22, the same elements as those in FIG. 5A are denoted by the same reference numerals, and thus any repetitive detailed description thereof will be omitted.

Referring to FIGS. 22 and 23, an embodiment of a display panel may include a display area and a peripheral area, and the display area may include the front display area FDA, the first and second side display areas SDA1 and SDA2, the corner display area CDA, and the intermediate display area MDA.

The first pixel PX1 may be located in the front display area FDA, the second pixel PX2 may be located in the corner display area CDA, and the third pixel PX3 may be located in the intermediate display area MDA.

The corner display area CDA may include a pixel arrangement area PDA and a connection area CA. The second pixel PX2 may be located in the pixel arrangement area PDA. A plurality of pixel arrangement areas PDA may be provided in the corner display area CDA, and the plurality of pixel arrangement areas PDA may be spaced apart from one another.

The connection area CA may be used to connect the intermediate display area MDA to the pixel arrangement area PDA. In an embodiment, the connection area CA may extend in a serpentine shape from the intermediate display area MDA. In one embodiment, for example, the connection area CA may include direction changing areas whose extension direction changes at least two times. Alternatively, the connection area CA may extend in a sine curve shape.

A plurality of connection areas CA may be provided in the corner display area CDA, and the plurality of connection areas CA may be spaced apart from one another. A connection wiring may be located in the connection area CA. In one embodiment, for example, the connection wiring may be a power wiring for supplying a voltage and/or a signal line for transmitting an electrical signal to the second pixel PX2.

In an embodiment, adjacent connection areas CA may be symmetrically arranged in a direction in which the pixel arrangement areas PDA are spaced apart from one another. In one embodiment, for example, a first connection area CA1 and a second connection area CA2 may extend in a serpentine shape from the intermediate display area MDA, and each of a first pixel arrangement area PDA1 and a second pixel arrangement area PDA2 may be connected to the first connection area CA1 and the second connection area CA2. In such an embodiment, adjacent first connection area CA1 and second connection area CA2 may be symmetrically arranged in a direction in which the first pixel arrangement area PDA1 and the second pixel arrangement area PDA2 that are adjacent to each other are spaced apart from each other.

Adjacent pixel arrangement areas PDA and adjacent connection areas CA may define a through-area PNA. In an embodiment, a closed curve CC may be defined between adjacent pixel arrangement areas PDA and adjacent connection areas CA, and an empty space inside the closed curve CC may be defined as the through-area PNA. In such an embodiment, the pixel arrangement area PDA, the intermediate display area MDA, and adjacent connection areas CA may define the through-area PNA.

In such an embodiment, because the corner display area CDA includes the pixel arrangement areas PDA that are spaced apart from one another and the connection area CA for connecting the pixel arrangement area PDA to the intermediate display area MDA, a part of the corner display area CDA may be stretched and, at the same time, another part of the corner display area CDA may be contracted.

Figure 24:
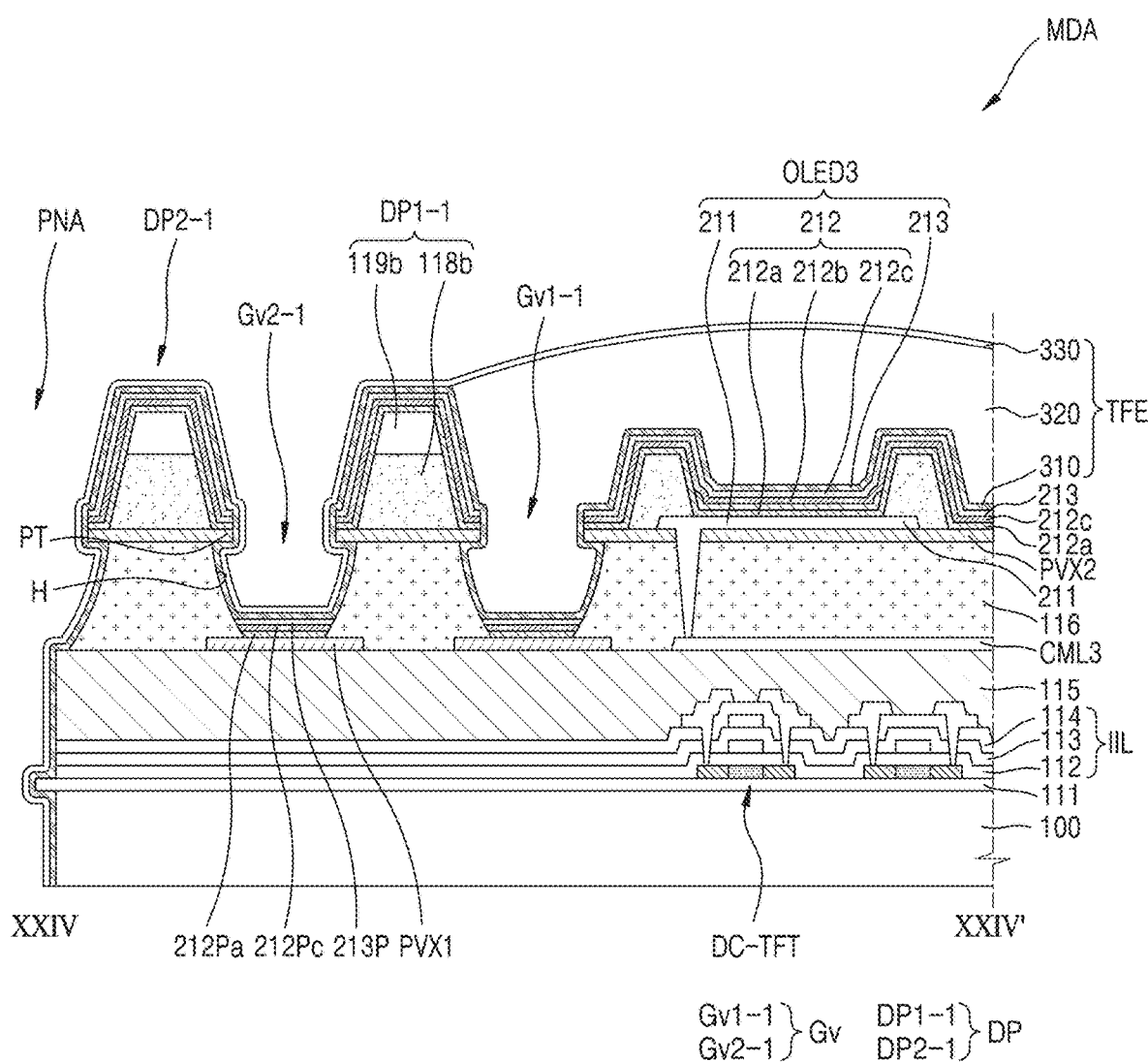
FIG. 24 is a cross-sectional view taken along line XXIV-XXIV of FIG. 22.
Figure 25:
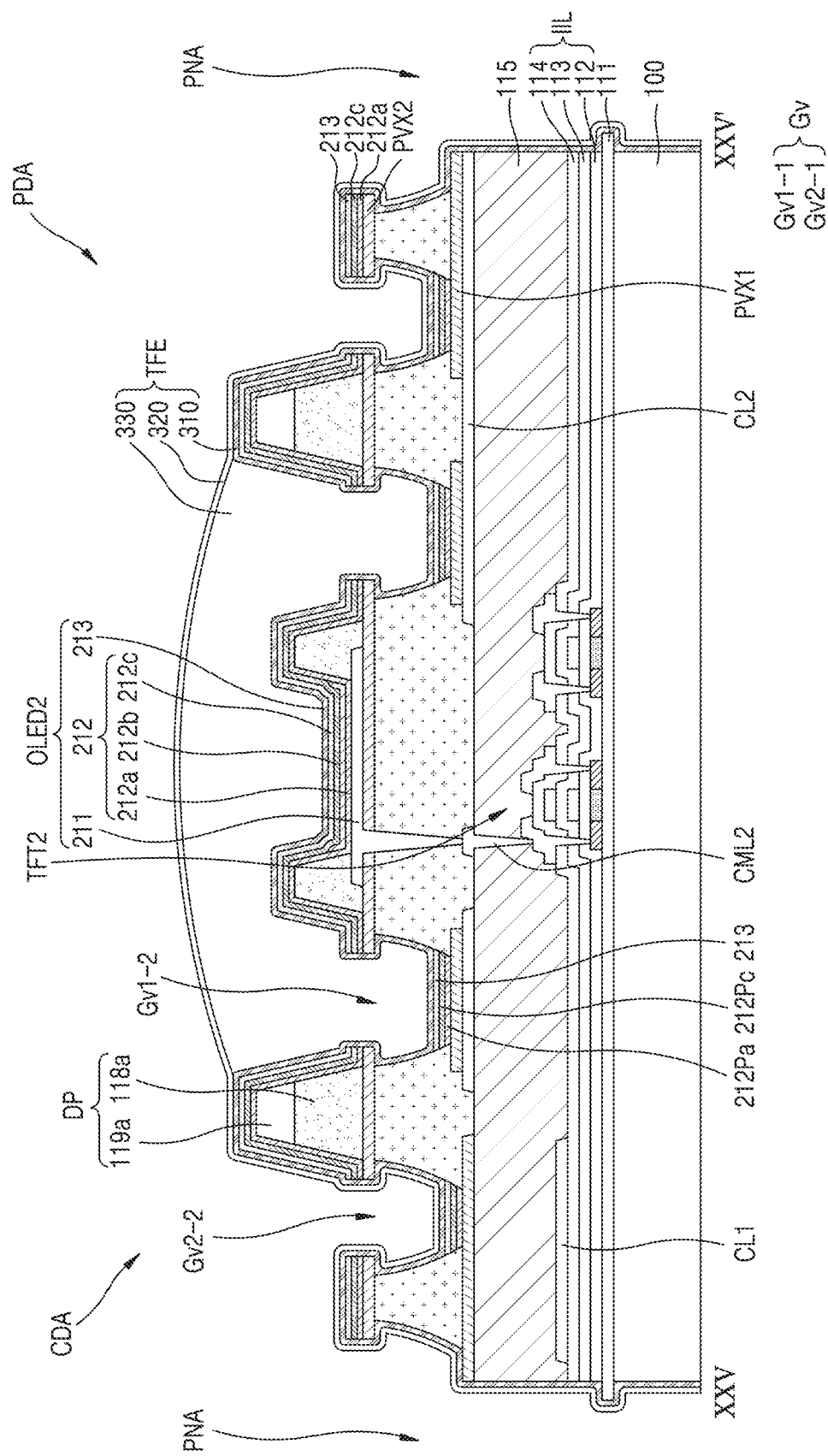
FIG. 25 is a cross-sectional view taken along line XXV-XXV' of FIG. 22.

FIG. 24 is a cross-sectional view taken along line XXIV-XXIV' of FIG. 22. FIG. 25 is a cross-sectional view taken along line XXV-XXV' of FIG. 22. In FIGS. 24 and 25, the same elements as those in FIGS. 10A and 10B are denoted by the same reference numerals, and thus any repetitive detailed description will be omitted. An embodiment of FIGS. 24 and 25 is substantially the same as an embodiment of FIGS. 10A and 10B except that the through-area PNA is provided around the intermediate display area MDA and the corner display area CDA.

Referring to FIGS. 24 and 25, an embodiment of a display panel may include the corner display area CDA and the intermediate display area MDA. The corner display area CDA may include the second thin-film transistor TFT2 and the second organic light-emitting diode OLED2 that is a second display element, and the intermediate display area MDA may include the third organic light-emitting diode OLED3 that is a third display element.

The corner display area CDA include the pixel arrangement area PDA and a connection area, and the connection area may be used to connect the intermediate display area MDA to the pixel arrangement area PDA. In such an embodiment, adjacent pixel arrangement areas PDA and adjacent connection areas may define the through-area PNA, and the pixel arrangement area PDA, the intermediate display area MDA, and adjacent connection areas may define the through-area PNA.

In such an embodiment, the display panel may include the groove Gv on the substrate 100, and the groove Gv may be concave in a thickness direction of the substrate 100. In an embodiment, the groove Gv in the pixel arrangement area PDA may be located between the second organic light-emitting diode OLED2 and the through-area PNA. In such an embodiment, the groove Gv in the intermediate display area MDA may be located between the third organic light-emitting diode OLED3 and the through-area PNA.

In an embodiment, the groove Gv may be located between the second organic light-emitting diode OLED2 and the third organic light-emitting diode OLED3. In one embodiment, for example, one of the pixel arrangement areas PDA and the intermediate display area MDA may be located with the through-area PNA therebetween. In such an embodiment, the groove Gv may be located between the second organic light-emitting diode OLED2 of one of the pixel arrangement areas PDA and the intermediate area PNA. In such an embodiment, the groove Gv may be located between the third organic light-emitting diode OLED3 of the intermediate display area MDA and the through-area PNA. Accordingly, the groove Gv may be located between the second organic light-emitting diode OLED2 and the third organic light-emitting diode OLED3.

The inorganic pattern layer PVX2 may be located on the second planarization layer 116. In such an embodiment, the inorganic pattern layer PVX2 may be located on opposing sides of the groove Gv, and may include a pair of protruding tips PT protruding toward the center of the groove Gv.

In such an embodiment, the first functional layer 212a, the second functional layer 212c, and the counter electrode 213 located on the inorganic pattern layer PVX2 may be separated by the groove Gv and the protruding tips PT. In such an embodiment, the first functional layer pattern 212Pa, the second functional layer pattern 212Pc, and the counter electrode pattern 213P may be located in the groove Gv.

Referring to FIG. 24, the dam portion DP may be located between the third organic light-emitting diode OLED3 of the intermediate display area MDA and the through-area PNA. In such an embodiment, the dam portion DP may be located over the inorganic pattern layer PVX2 and may protrude in the thickness direction of the substrate 100.

In an embodiment, a plurality of dam portions DP and/or a plurality of grooves Gv may be provided. In one embodiment, for example, the dam portion DP may include a first dam portion DP1-1 and a second dam portion DP2-1, and the groove Gv may include a first groove Gv1-1 and a second groove Gv2-1. In this case, the first groove Gv1-1, the first dam portion DP1-1, the second groove Gv2-1, and the second dam portion DP2-1 may be sequentially arranged in a direction from the intermediate display area MDA to the through-area PNA.

The thin-film encapsulation layer TFE may cover the third organic light-emitting diode OLED3. In such an embodiment, the thin-film encapsulation layer TFE may extend from the third organic light-emitting diode OLED3 to the dam portion DP.

The first inorganic encapsulation layer 310 may entirely and continuously cover the intermediate display area MDA. In an embodiment, the first inorganic encapsulation layer 310 may be entirely and continuously located in the groove Gv and on the dam portion DP. In such an embodiment, the first inorganic encapsulation layer 310 may cover the first functional layer pattern 212Pa, the second functional layer pattern 212Pc, and the counter electrode pattern 213P located inside the groove Gv. The first inorganic encapsulation layer 310 may contact the inorganic pattern layer PVX2. In an embodiment, the first inorganic encapsulation layer 310 may contact the protruding tips PT of the inorganic pattern layer PVX2.

In an embodiment, the first inorganic encapsulation layer 310 may cover side surfaces of the substrate 100, the buffer layer 111, the inorganic insulating layer IIL, and the first planarization layer 115 which face the through-area PNA.

The organic encapsulation layer 320 may extend from the third organic light-emitting diode OLED3 to the dam portion DP, and may fill the groove Gv. In one embodiment, for example, the organic encapsulation layer 320 may extend from the third organic light-emitting diode OLED3 to the first dam portion DP1-1, and may fill the first groove Gv1-1. In such an embodiment, the organic encapsulation layer 320 may be controlled by the first dam portion DP1-1 and the second dam portion DP2-1. In this case, the organic encapsulation layer 320 may not fill the second groove Gv2-1.

The second inorganic encapsulation layer 330 may entirely and continuously cover the intermediate display area MDA, like the first inorganic encapsulation layer 310. In an embodiment, the second inorganic encapsulation layer 330 may contact the first inorganic encapsulation layer 310 on the first dam portion DP1-1 and the second dam portion DP2-1. In such an embodiment, the second inorganic encapsulation layer 330 may contact the first inorganic encapsulation layer 310 in the second groove Gv2-1. The second inorganic encapsulation layer 330 may cover side surfaces of the substrate 100, the buffer layer 111, the inorganic insulating layer IIL, and the first planarization layer 115 which face the through-area PNA.

Referring to FIG. 25, the second organic light-emitting diode OLED2 of the pixel arrangement area PDA may be surrounded by the dam portion DP and the groove Gv. In one embodiment, for example, the dam portion DP and the groove Gv may be located between the second organic light-emitting diode OLED2 and the through-area PNA.

In some embodiments, a plurality of dam portions DP and/or a plurality of grooves Gv may be provided. In one embodiment, for example, the groove Gv may include a first groove Gv1-2 and a second groove Gv2-2. In such an embodiment, the first groove Gv1-2, the dam portion DP, and the second groove Gv2-2 may be sequentially arranged in a direction from the second organic light-emitting diode OLED2 to the through-area PNA.

The thin-film encapsulation layer TFE may cover the second organic light-emitting diode OLED2. In such an embodiment, the thin-film encapsulation layer TFE may extend from the second organic light-emitting diode OLED2 to the dam portion DP.

The first inorganic encapsulation layer 310 may entirely and continuously cover the pixel arrangement area PDA. In an embodiment, the first inorganic encapsulation layer 310 may be entirely and continuously located in the groove Gv and on the dam portion DP. In such an embodiment, the first inorganic encapsulation layer 310 may cover the first functional layer pattern 212Pa, the second functional layer pattern 212Pc, and the counter electrode pattern 213P located inside the groove Gv. The first inorganic encapsulation layer 310 may contact the inorganic pattern layer PVX2. In an embodiment, the first inorganic encapsulation layer 310 may contact the protruding tips PT of the inorganic pattern layer PVX2.

In an embodiment, the first inorganic encapsulation layer 310 may cover the substrate 100, the buffer layer 111, the inorganic insulating layer IIL, and the first planarization layer 115 which face the through-area PNA.

The organic encapsulation layer 320 may extend from the second organic light-emitting diode OLED2 to the dam portion DP, and may fill the groove Gv. In one embodiment, for example, the organic encapsulation layer 320 may extend from the second organic light-emitting diode OLED2 to the dam portion DP, and may fill the first groove Gv1-2. In such an embodiment, the organic encapsulation layer 320 may be controlled by the dam portion DP. In such an embodiment, the organic encapsulation layer 320 may not fill the second groove Gv2-2. Accordingly, the organic encapsulation layer 320 may be located in each pixel arrangement area PDA, and the organic encapsulation layer 320 of the intermediate display area MDA and the organic encapsulation layer 320 of the pixel arrangement area PDA may be separated from each other.

The second inorganic encapsulation layer 330 may entirely and continuously cover the pixel arrangement area PDA, like the first inorganic encapsulation layer 310. In an embodiment, the second inorganic encapsulation layer 330 may contact the first inorganic encapsulation layer 310 on the dam portion DP. In such an embodiment, the second inorganic encapsulation layer 330 may contact the first inorganic encapsulation layer 310 in the second groove Gv2-2. The second inorganic encapsulation layer 330 may cover the substrate 100, the buffer layer 111, the inorganic insulating layer IIL, and the first planarization layer 115 which face the through-area PNA.

Figure 26:
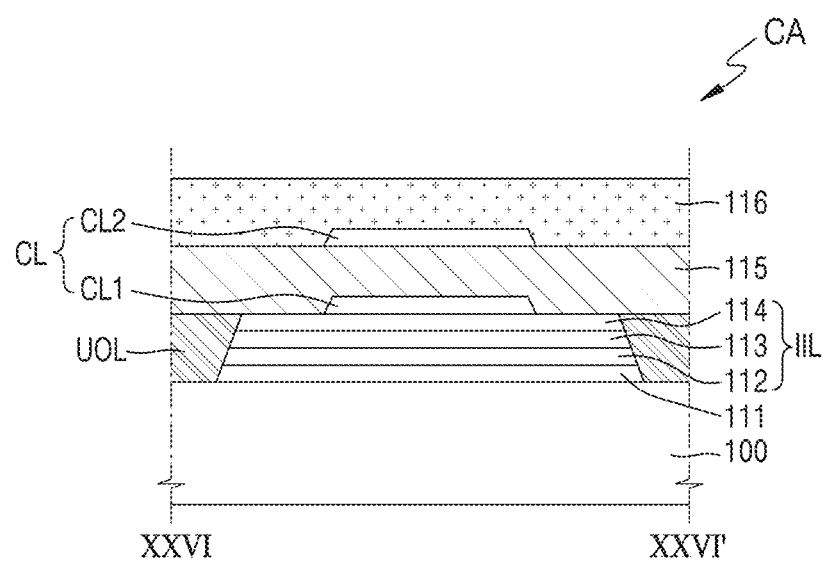
FIG. 26 is a cross-sectional view taken along line XXVI-XXVI' of FIG. 23.

FIG. 26 is a cross-sectional view taken along line XXVI-XXVI' of FIG. 23.

Referring to FIG. 26, the substrate 100, the buffer layer 111, the inorganic insulating layer IIL, the first planarization layer 115, the second planarization layer 116, a lower organic insulating layer UOL, and the connection wiring CL may be located in the connection area CA. In an embodiment, the connection wiring CL may include the first connection wiring CL1 and the second connection wiring CL2. Each of the first connection wiring CL1 and the second connection wiring CL2 may be a power wiring for applying an electrical signal or a voltage to a pixel arrangement area. The first connection wiring CL1 and the second connection wiring CL2 of the connection area CA may be respectively connected to the first connection wiring CL1 and the second connection wiring CL2 located in the pixel arrangement area PDA of FIG. 25.

In an embodiment, the buffer layer 111 and the inorganic insulating layer IIL may be located on a part of the substrate 100, and the lower organic insulating layer UOL may be located on another part of the substrate 100. The lower organic insulating layer UOL may include an organic insulating material such as polyimide, like the first planarization layer 115 or the second planarization layer 116. The lower organic insulating layer UOL may reduce stress on an edge portion of the substrate 100. In an alternative embodiment, the buffer layer 111 and the inorganic insulating layer IIL may be omitted, and the lower organic insulating layer UOL may be entirely located on the substrate 100.

The first connection wiring CL1 may be located on the substrate 100, and the first planarization layer 115 may cover the first connection wiring CL1. The second connection wiring CL2 may be located on the first planarization layer 115, and the second planarization layer 116 may cover the second connection wiring CL2.

In an embodiment, the corner display area CDA may include the plurality of extension areas LA extending from the intermediate display area MDA. In such an embodiment, the corner display area CDA may be contracted. In an embodiment, the corner display area CDA may include the pixel arrangement areas PDA and the connection area CA connected to the pixel arrangement areas PDA. Accordingly, a part of the corner display area CDA may be stretched, and, at the same time, another part of the corner display area CDA may be contracted.

According to embodiments of the invention as set forth herein, a stretchable and/or contractible corner display area is included in a display panel, such that the display panel and a display apparatus including the display panel may have improved reliability.

In such embodiments, a corner display area capable of displaying an image is included, such that a non-display area may be reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:
 a substrate comprising:
  a front display area, wherein a first display element is in the front display area;
  a first side display area connected in a first direction to the front display area;
  a second side display area connected in a second direction intersecting the first direction to the front display area;
  a corner display area between the first side display area and the second side display area, wherein the corner display area at least partially surrounds the front display area, and a second display element is in the corner display area, and
  an intermediate display area between the front display area and the corner display area, wherein a third display element is in the intermediate display area, wherein a groove is defined on the substrate and recessed in a thickness direction of the substrate; and
 an inorganic pattern layer on opposing sides of the groove on the substrate,
 wherein the inorganic pattern layer comprises a pair of protruding tips protruding toward a center of the groove,
 wherein the groove is between the second display element and the third display element, and
 wherein at least a portion of the groove extends along a boundary between the corner display area and the intermediate display area.

2. The display panel of claim 1, wherein
 the corner display area comprises a plurality of extension areas extending from the intermediate display area,
 wherein a through-portion is defined between adjacent extension areas, and
 wherein the second display element is in the plurality of extension areas.

3. The display panel of claim 2, wherein the groove surrounds the second display element.

4. The display panel of claim 2, further comprising:
 a dam portion over the inorganic pattern layer and protruding in the thickness direction of the substrate,
 wherein the dam portion comprises a first dam portion and a second dam portion,
 wherein the first dam portion surrounds the second display element, and
 the second dam portion extends along the corner display area.

5. The display panel of claim 4, wherein
 each of the plurality of extension areas comprises a first extension area, and a second extension area between the first extension area and the intermediate display area,
 wherein the second extension areas of the plurality of extension areas are connected to one another as a single body, and
 the groove is located between the first dam portions of adjacent extension areas.

6. The display panel of claim 4, further comprising:
 a first auxiliary dam portion over the inorganic pattern layer between the second display element and the first dam portion, and protruding in the thickness direction of the substrate,
 wherein a thickness of the first dam portion is greater than a thickness of the first auxiliary dam portion.

7. The display panel of claim 2, further comprising:
 a planarization layer located on the substrate,
 wherein the planarization layer is separated by the groove into a corner planarization layer and an intermediate planarization layer,
 wherein the second display element is on the corner planarization layer, and
 the third display element is on the intermediate planarization layer.

8. The display panel of claim 2, wherein
 the third display element comprises an inner display element and an outer display element adjacent to the groove,
 wherein the outer display element comprises a pixel electrode and a counter electrode, and
 wherein the pixel electrode covers at least a part of the inorganic pattern layer.

9. The display panel of claim 2, further comprising:
 a planarization layer between the substrate and the third display element,
 wherein the third display element comprises an inner display element and an outer display element adjacent to the groove, and
 wherein the planarization layer comprises a recessed portion between the inner display element and the outer display element.

10. The display panel of claim 2, further comprising:
 a connection wiring on the substrate and extending from the intermediate display area to the plurality of extension areas,
 wherein the second display element comprises a pixel electrode, an intermediate layer, and a counter electrode, and
 wherein the connection wiring and the counter electrode are connected to each other at end portions of the plurality of extension areas.

11. The display panel of claim 10, further comprising:
 a planarization layer located between the connection wiring and the second display element,
 wherein a contact hole is defined through the planarization layer to expose the connection wiring, and
 wherein the connection wiring and the counter electrode are connected to each other through a pixel electrode pattern in the contact hole.

12. The display panel of claim 2, further comprising:
a connection wiring on the substrate and extending from the intermediate display area to the plurality of extension areas,
wherein a plurality of second display elements is in one of the plurality of extension areas,
wherein the plurality of second display elements respectively comprise counter electrodes which are spaced apart from one another, and
wherein each of the counter electrodes is connected to the connection wiring.

13. The display panel of claim 2, wherein
the third display element comprises a pixel electrode and a counter electrode,
wherein the intermediate display area comprises a first intermediate display area and a second intermediate display area located between the first intermediate display area and the corner display area,
the display panel further comprises:
  a connection wiring located in the intermediate display area; and
  an intermediate groove defined between the first intermediate display area and the second intermediate display area,
wherein each of the counter electrode of the third display element in the first intermediate display area and the counter electrode of the third display element in the second intermediate display area is connected to the connection wiring through a contact hole.

14. The display panel of claim 2, wherein
the third display element comprises a pixel electrode and a counter electrode, and the third display element is provided in plural in the intermediate display area,
the display panel further comprises:
  a connection wiring in the intermediate display area; and
  an intermediate groove defined in the intermediate display area to surround each of the plurality of third display elements,
wherein counter electrodes of a plurality of third display elements in the intermediate display area are spaced apart from one another by the intermediate groove and are each connected to the connection wiring.

15. The display panel of claim 1, wherein
the corner display area comprises: pixel arrangement areas, in each of which the second display element is located; and connection areas which connect the pixel arrangement areas to the intermediate display area,
wherein adjacent pixel arrangement areas and adjacent connection areas define a through-area,
wherein the display panel further comprises a connection wiring extending from the intermediate display area to the pixel arrangement area.

16. The display panel of claim 15, wherein
the connection areas extend in a serpentine shape from the intermediate display area, and
adjacent connection areas are symmetrically arranged in a direction in which the pixel arrangement areas are spaced apart from one another.

17. The display panel of claim 1, wherein
the second display element comprises a pixel electrode, an intermediate layer comprising an emission layer and a counter electrode,
the intermediate layer comprises:
  a first functional layer between the pixel electrode and the emission layer; and
  a second functional layer between the counter electrode and the emission layer,
wherein the counter electrode and at least one selected from the first functional layer and the second functional layer are separated by the pair of protruding tips and the groove.

18. The display panel of claim 1, further comprising:
a dam portion over the inorganic pattern layer and protruding in the thickness direction of the substrate; and
a thin-film encapsulation layer covering the second display element and the third display element, wherein the thin-film encapsulation layer comprises an inorganic encapsulation layer and an organic encapsulation layer,
wherein the thin-film encapsulation layer extends from the second display element and the third display element to the dam portion, and
the organic encapsulation layer is separated by the dam portion.

19. The display panel of claim 1, further comprising:
an inorganic insulating layer on the substrate;
a connection wiring on the inorganic insulating layer and extending from the intermediate display area to the corner display area;
a lower inorganic pattern layer on the connection wiring; and
a lower layer covering an edge of the lower inorganic pattern layer, wherein a hole is defined through the lower layer to correspond to the lower inorganic pattern layer,
wherein the groove is defined by the hole and a central portion of the lower inorganic pattern layer.

20. The display panel of claim 1, further comprising:
an inorganic insulating layer on the substrate;
a connection wiring on the inorganic insulating layer and extending from the intermediate display area to the corner display area;
a lower inorganic layer on the connection wiring; and
a lower layer comprising a first planarization layer and a second planarization layer, wherein a hole is defined through the lower layer to expose a part of the lower inorganic layer is exposed,
wherein the groove is defined by the lower inorganic layer and the hole.

21. The display panel of claim 1, further comprising:
an inorganic insulating layer on the substrate;
a connection wiring on the inorganic insulating layer and extending from the intermediate display area to the corner display area;
a metal pattern layer on the connection wiring; and
a lower layer covering an edge of the metal pattern layer, wherein a hole is defined through the lower layer to correspond to the metal pattern layer,
wherein the groove is defined by the hole and a central portion of the metal pattern layer.

22. A display apparatus comprising:
a display panel comprising a front display area, a corner display area at a corner of the front display area to be bent, and an intermediate display area between the front display area and the corner display area, wherein a first display element is in the front display area, a second display element is in the corner display area, and a third display element is in the intermediate display area; and
a cover window covering the display panel,
wherein the corner display area comprises a plurality of extension areas extending from the intermediate display area, wherein the second display element is in the plurality of extension areas, and wherein the display panel comprises:
- a substrate, wherein a groove recessed in a thickness direction of the substrate is defined on the substrate; and
- an inorganic pattern layer on opposing sides of the groove and comprising a pair of protruding tips protruding toward a center of the groove,
- wherein the groove is between the second display element and the third display element, and
- at least a portion of the groove extends along a boundary between the corner display area and the intermediate display area.

23. The display apparatus of claim 22, wherein
the second display element comprises a pixel electrode, an intermediate layer comprising an emission layer, and a counter electrode,
wherein the intermediate layer comprises a first functional layer between the pixel electrode and the emission layer, and a second functional layer between the counter electrode and the emission layer, and
wherein at least one of the first functional layer and the second functional layer and the counter electrode are separated by the pair of protruding tips and the groove.

24. The display apparatus of claim 22, wherein the groove surrounds the second display element.

25. The display apparatus of claim 22, wherein
the display panel further comprises a dam portion over the inorganic pattern layer and protruding in the thickness direction of the substrate,
wherein the dam portion comprises a first dam portion and a second dam portion,
wherein the first dam portion surrounds the second display element, and
the second dam portion extends along the corner display area.

26. The display apparatus of claim 25, wherein
the display panel further comprises a first auxiliary dam portion over the inorganic pattern layer between the second display element and the first dam portion, and protruding in the thickness direction of the substrate,
wherein a thickness of the first dam portion is greater than a thickness of the first auxiliary dam portion.

27. The display apparatus of claim 22, wherein the display panel further comprises
- a dam portion over the inorganic pattern layer and protruding in the thickness direction of the substrate, and
- a thin-film encapsulation layer covering the second display element and the third display element, wherein the thin-film encapsulation layer comprises an inorganic encapsulation layer and an organic encapsulation layer,
wherein the thin-film encapsulation layer extends from the second display element and the third display element to the dam portion,
wherein the organic encapsulation layer is separated by the dam portion.

28. The display apparatus of claim 22, wherein
the display panel further comprises a connection wiring on the substrate and extending from the intermediate display area to the plurality of extension areas,
wherein the second display element comprises a pixel electrode, an intermediate layer, and a counter electrode,
wherein the connection wiring and the counter electrode are connected to each other at end portions of the plurality of extension areas.

29. The display apparatus of claim 22, wherein the display panel further comprises a connection wiring on the substrate and extending from the intermediate display area to the plurality of extension areas, Reply to Office Action of Jan. 18, 2023 wherein a plurality of second display elements is in one of the plurality of extension areas, wherein the plurality of second display elements respectively comprise counter electrodes which are spaced apart from one another, wherein each of the counter electrodes is connected to the connection wiring.

30. The display apparatus of claim 22, wherein the display panel comprises:
- a first side display area connected in a first direction to the front display area and bent with a first radius of curvature, and
- a second side display area connected in a second direction intersecting the first direction to the front display area and bent with a second radius of curvature different from the first radius of curvature,
wherein the corner display area is between the first side display area and the second side display area.

* * * * *